US012488758B2

(12) United States Patent
Zhu

(10) Patent No.: US 12,488,758 B2
(45) Date of Patent: Dec. 2, 2025

(54) DISPLAY PANEL AND DISPLAY DEVICE

(71) Applicant: Xiamen Tianma Microelectronics Co., Ltd., Xiamen (CN)

(72) Inventor: Renliang Zhu, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/422,234

(22) Filed: Jan. 25, 2024

(65) Prior Publication Data

US 2024/0161703 A1 May 16, 2024

(30) Foreign Application Priority Data

Oct. 12, 2023 (CN) ......................... 202311322114.3

(51) Int. Cl.

*G09G 3/3266* (2016.01)
*G09G 3/32* (2016.01)
*G09G 3/36* (2006.01)
*G11C 19/28* (2006.01)

(52) U.S. Cl.

CPC ............. *G09G 3/3266* (2013.01); *G09G 3/32* (2013.01); *G09G 3/3677* (2013.01); *G09G 2300/0426* (2013.01); *G09G 2310/0267* (2013.01); *G09G 2310/0286* (2013.01); *G09G 2310/08* (2013.01); *G11C 19/28* (2013.01)

(58) Field of Classification Search

CPC ...... G09G 3/3266; G09G 3/32; G09G 3/3677; G09G 3/3225; G09G 3/36; G09G 3/20; G09G 2300/0426; G09G 2310/0267; G09G 2310/0286; G09G 2310/08; G09G 2310/0264; G09G 2320/02; G11C 19/28

See application file for complete search history.

(56) References Cited

U.S. PATENT DOCUMENTS

2010/0315403 A1* 12/2010 Kaneyoshi ........... G09G 3/3648 345/211
2018/0047360 A1* 2/2018 Cai ........................ G11C 19/28

FOREIGN PATENT DOCUMENTS

CN 104464600 A 3/2015
CN 108682395 A 10/2018

* cited by examiner

*Primary Examiner* — Christopher E Leiby
(74) *Attorney, Agent, or Firm* — KDW FIRM PLLC

(57) ABSTRACT

A display panel includes a driver circuit, multiple scan lines and multiple pixels arranged in an array. Gates of switch transistors in at least part of the same row of pixels are electrically connected to the same one scan line. In the driver circuit, the i-th shift register unit is cascaded with the (i+n)-th shift register unit; shift register units supply gate drive signals to the multiple scan lines respectively. The valid pulses of the gate drive signals each have a width denoted as T0; T0>(Th+k*Th), 0<k≤(n−1), and Th=1/(F*L), where F denotes the refresh rate of the display panel, and L denotes the number of rows of the multiple pixels; and valid pulses of gate drive signals output by any two adjacent shift register units have a shift amount greater than or equal to Th.

20 Claims, 27 Drawing Sheets

DISPLAY PANEL AND DISPLAY DEVICE

CROSS-REFERENCE TO RELATED APPLICATION

This application claims priority to Chinese Patent Application No. CN 202311322114.3, filed on Oct. 12, 2023, the disclosure of which is incorporated herein by reference in its entirety.

TECHNICAL FIELD

The present application relates to the field of display technology and, in particular, to a display panel and a display device.

BACKGROUND

With the development of display technology, electronic products having a display function are widely applied in various fields, such as televisions, mobile phones, computers and personal digital assistants which are all electronic products having a display function, and have become an indispensable part of people's life and work. A display panel is a core structure for implementing a display function in an electronic product.

Generally, a pixel array and a driver circuit for driving the pixel array are disposed in the display panel. The driver circuit can scan the pixel array row by row to enable the pixel array to display a picture. However, limited by the function and structure of the driver circuit in the related art, the driver circuit in the related art cannot drive a row of pixels accurately, resulting in inaccurate display brightness of the pixels and affecting the overall display effect of the display panel.

SUMMARY

The present application provides a display panel and a display device so that a driver circuit can accurately drive pixels in the display panel, thereby improving the display effect of the display panel.

According to an aspect of the present application, a display panel is included. The display panel includes a driver circuit, a plurality of scan lines, and a plurality of pixels arranged in an array.

Each pixel of the plurality of pixels includes at least one switch transistor, and gates of switch transistors in at least part of a same row of pixels of the plurality of pixels are electrically connected to a same one scan line of the plurality of scan lines.

The driver circuit includes multiple shift register units, and in the multiple shift register units, an i-th shift register unit is cascaded with an (i+n)-th shift register unit, n is a positive integer greater than or equal to 2, and i is a positive integer.

Shift register units are electrically connected to the plurality of scan lines respectively and supply gate drive signals to the plurality of scan lines respectively, and valid pulses of the gate drive signals received by the plurality of scan lines are shifted successively.

The valid pulses of the gate drive signals each have a width denoted as T0; $T0>(Th+k*Th)$, $0<k\leq(n-1)$, and $Th=1/(F*L)$, where F denotes a refresh rate of the display panel, and L denotes the number of rows of the plurality of pixels; and in the multiple shift register units, valid pulses of gate drive signals output by any two adjacent shift register units have a shift amount greater than or equal to Th.

According to another aspect of the present application, a display device is provided and includes the preceding display panel.

BRIEF DESCRIPTION OF DRAWINGS

To illustrate the technical solutions of embodiments of the present application more clearly, the drawings used in the description of the embodiments are briefly described below. Apparently, the drawings described below merely illustrate part of the embodiments of the present application, and those of ordinary skill in the art may obtain other drawings based on the drawings described below on the premise that no creative work is done.

DETAILED DESCRIPTION

To make the solutions of the present application better understood by those skilled in the art, the technical solutions of the embodiments of the present application are described below clearly and completely in conjunction with the drawings in the embodiments of the present application. Apparently, the embodiments described below are part, not all, of the embodiments of the present application. Based on the embodiments of the present application, all other embodiments obtained by those of ordinary skill in the art are within the scope of the present application on the premise that no creative work is done.

It is to be noted that terms such as "first" and "second" in the description, claims and drawings of the present application are used for distinguishing between similar objects and are not necessarily used for describing a particular order or sequence. It is to be understood that the data used in this manner is interchangeable in appropriate cases so that the embodiments of the present application described herein can be implemented in an order not illustrated or described herein. Additionally, the terms "including", "having" and variations thereof are intended to encompass a non-exclusive inclusion. For example, a process, method, system, product, or device that includes a series of steps or units not only includes the expressly listed steps or units but may also include other steps or units that are not expressly listed or are inherent to such process, method, product, or device.

Figure 1:
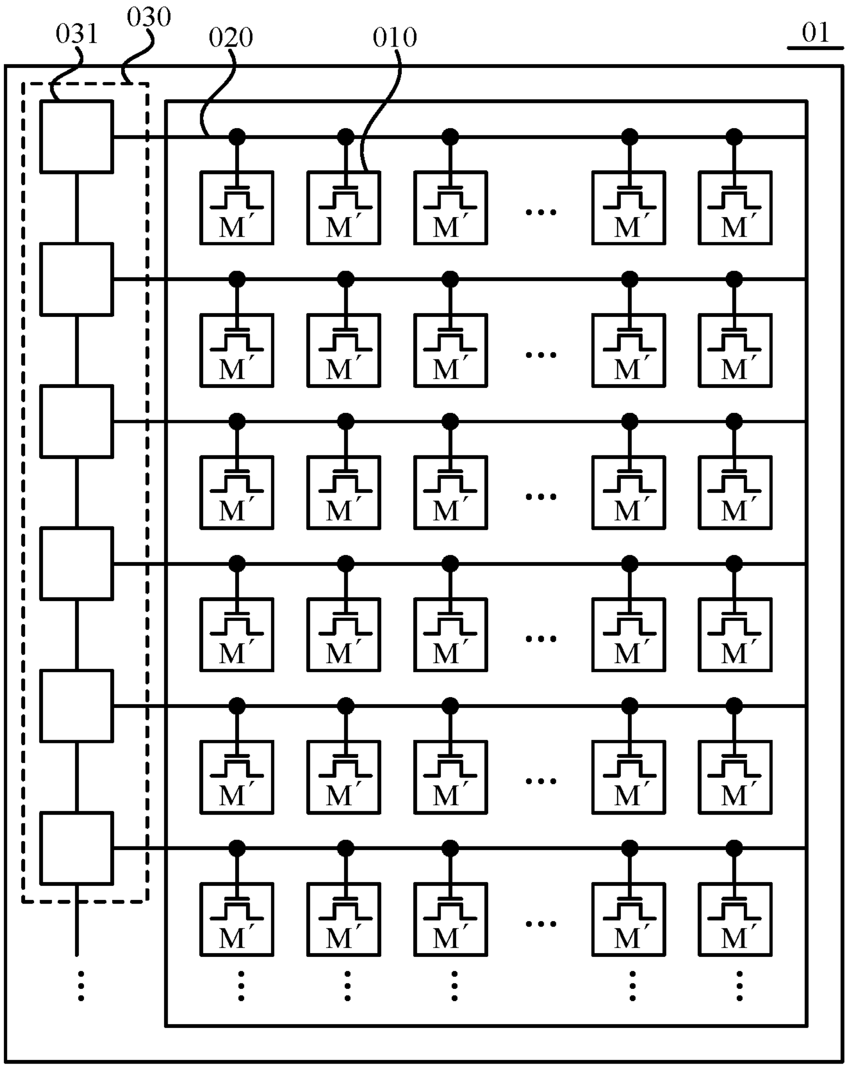
FIG. 1 is a diagram illustrating the structure of a display panel in the related art.
Figure 2:
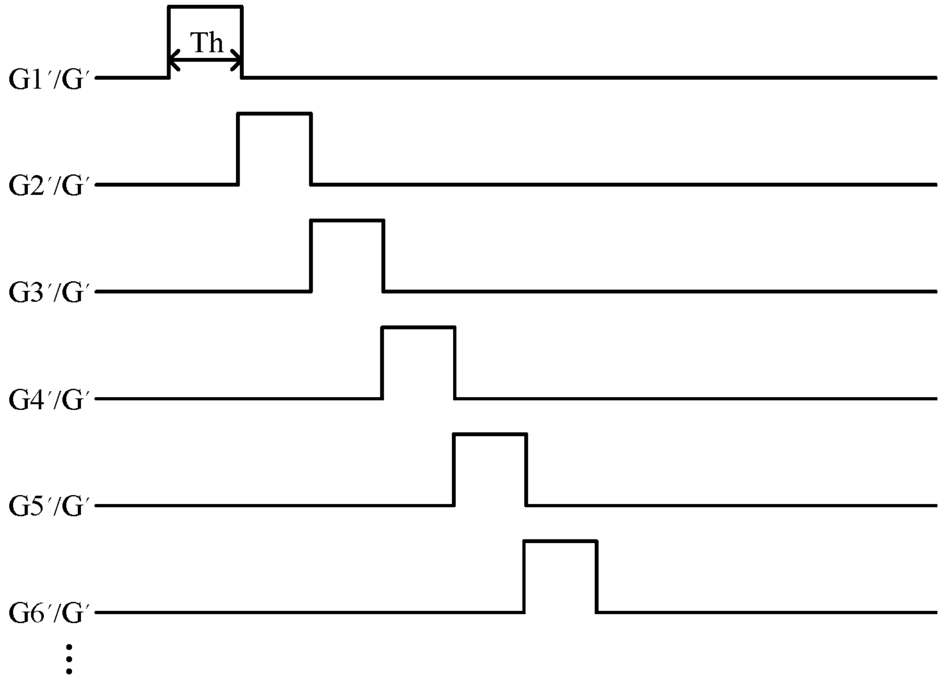
FIG. 2 is a drive timing diagram of a display panel in the related art.

As described in the background, FIG. 1 is a diagram illustrating the structure of a display panel in the related art, and FIG. 2 is a drive timing diagram of a display panel in the related art. In conjunction with FIGS. 1 and 2, pixels 010 arranged in an array and a driver circuit 030 are disposed in the display panel 01. The driver circuit 030 includes multiple shift register units 031 cascaded, that is, the next shift register unit 031 is electrically connected to the previous shift register unit 031, and the multiple shift register units 031 output valid pulses of gate drive signals G' (G1', G2', G3', G4', G5', G6, . . . ) successively. Each shift register unit 031 is also electrically connected to gates of switch transistors M' in the same row of pixels 010 through one scan line 020 so that the gate drive signals G' output by the multiple shift register units 031 can control switch transistors M' in rows of pixels 010 to turn on row by row. Moreover, when the gate drive signals G' control the switch transistors M' to turn on, the switch transistors M' can transmit respective signals (such as data signals for controlling the display brightness of the pixels) to nodes electrically connected to the switch transistors M' to refresh signals at the nodes so that the pixels 010 can be driven. In this way, the multiple shift register units 031 output the valid pulses of the gate drive signals successively so that the pixels 010 can be driven row by row.

When the display panel 01 includes L rows of pixels 010, and the refresh rate of the display panel is F, the driving time period Th of each row of pixels 010 is denoted as 1/(F*L) so that the signal refresh time period of the each row of pixels 010 should be less than or equal to Th to ensure that the driving of the L rows of pixels 010 can be completed within one-frame time period 1/F of the display panel. To satisfy the driving requirement of the each row of pixels 010, in the related art, the valid pulses of the gate drive signals G' output by the multiple shift register units 031 in the driver circuit 030 each have a width denoted as Th. When a respective shift register unit 031 starts to output the valid pulse of a gate drive signal G' and transmit the valid pulse of the gate drive signal G' to the gates of the switch transistors M' in the same row of pixels 010 through a scan line 020, the valid pulse of the gate drive signal G' first charges the gates of the switch transistors M' in the same row of pixels 010. Moreover, when the voltage differences Vgs between the gates and the sources of the switch transistors M' each satisfy |Vgs|>|Vth| (Vth denotes the threshold voltage of each switch transistor M'), the switch transistors M' can be turned on. When the display panel 01 has a relatively large size, the number of a row of pixels 010 in the display panel 01 is relatively large, and the number of pixels 010 electrically connected to each scan line 020 is relatively large so that the load at a signal output terminal of a respective shift register unit 031 is relatively large, and thereby all switch transistors in the same row of pixels 010 can be in a normal on state after being charged for a relatively long time period. Consequently, within the time period of the valid pulse of the gate drive signal G' output by the respective shift register unit 031, the charging duration requirement of the same row of pixels 010 cannot be satisfied, resulting in a relatively short or even impossible conduction duration of the switch transistors M' in the same row of pixels 010. As a result, signals cannot be insufficiently written into the nodes electrically connected to the switch transistors M' so that the display brightness of the same row of pixels 010 can be affected, thereby affecting the overall display effect of the display panel 01.

To solve the preceding technical solutions, an embodiment of the present application provides a display panel. The display panel includes a driver circuit, multiple scan lines, and multiple pixels arranged in an array; each pixel includes at least one switch transistor; gates of switch transistors in at least part of the same row of pixels are electrically connected to the same one scan line; the driver circuit includes multiple shift register units; the i-th shift register unit is cascaded with the (i+n)-th shift register unit; n is a positive integer greater than or equal to 2, and i is a positive integer; the multiple shift register units are electrically connected to the multiple scan lines respectively and supply gate drive signals to the multiple scan lines respectively, and valid pulses of the gate drive signals received by the multiple scan lines are shifted successively, where the valid pulses of the gate drive signals each have a width denoted as T0; T0>(Th+k*Th), 0<k≤(n−1), and Th=1/(F*L), where F denotes the refresh rate of the display panel, and L denotes the number of rows of the multiple pixels; and valid pulses of gate drive signals output by any two adjacent shift register units have a shift amount greater than or equal to Th.

By adopting the above technical solution, the i-th shift register unit is cascaded with the (i+n)-th shift register unit so that the valid pulses of the gate drive signals output by the shift register units can each have a width denoted as Th+k*Th while the gate drive signals output by the shift register units are ensured to be shifted successively. The valid pulses of the gate drive signals output by the shift register units each have a width greater than the driving time period Th of one row of pixels so that when the gate drive signals output by the shift register units are each used for controlling switch transistors in a respective same row of pixels to turn on or off, the time period of a valid pulse of a gate drive signal received by switch transistors in each row of pixels can be greater than the driving time period Th of one row of pixels, that is, the time period for charging the gates of the switch transistors in the each row of pixels is greater than the driving time period Th of one row of pixels. Compared with the related art, the time period for charging the gates of the switch transistors in the each row of pixels is increased so that the switch transistors in the each row of pixels can have a sufficiently long conduction time period, especially for display panels having a large size and high resolution; even if the number of pixels connected to the each scan line is relatively large, and the load carried by the each shift register unit is relatively large, a relatively long charging time period can also enable all the gates of the switch transistors in the each row of pixels to be charged until the conduction condition is satisfied so that when the signals at the nodes electrically connected to the switch transistors are refreshed, respective signals can be ensured to be written into the nodes accurately, facilitating the improvement of the display light emission accuracy of the each row of pixels and the improvement of the display light emission effect of the display panel. Additionally, since valid pulses of gate drive signals of two adjacent shift register units have a shift amount greater than or equal to the driving time period Th of one row of pixels, gates of switch transistors in the row of pixels can be pre-charged within the first k*Th time period of the valid pulses of the gate drive signals output by the shift register units so that the switch transistors in the row of pixels can tend to be in a normal on state from an off state. Moreover, within the last Th time period of the valid pulses of the gate drive signals output by the shift register units, the switch transistors in the row of the pixels can be in a normal on state quickly so that within the driving time period Th of at least one row of pixels, the switch transistors in the row of the pixels can be in a normal on state, and so that the time period for supplying the respective signals to the nodes electrically connected to the switch transistors can be the driving time period Th of the at least one row of pixels. Consequently, the respective signals can be written into the rows of pixels accurately so that the rows of pixels can perform light emission for display accurately, thereby improving the display effect of the display panel.

The preceding is a core idea of the present application. Based on the embodiments of the present application, all other embodiments obtained by those of ordinary skill in the art are within the scope of the present application on the premise that no creative work is done. Technical solutions of the embodiments of the present application are described clearly and completely hereinafter in conjunction with the drawings in the embodiments of the present application.

Figure 3:
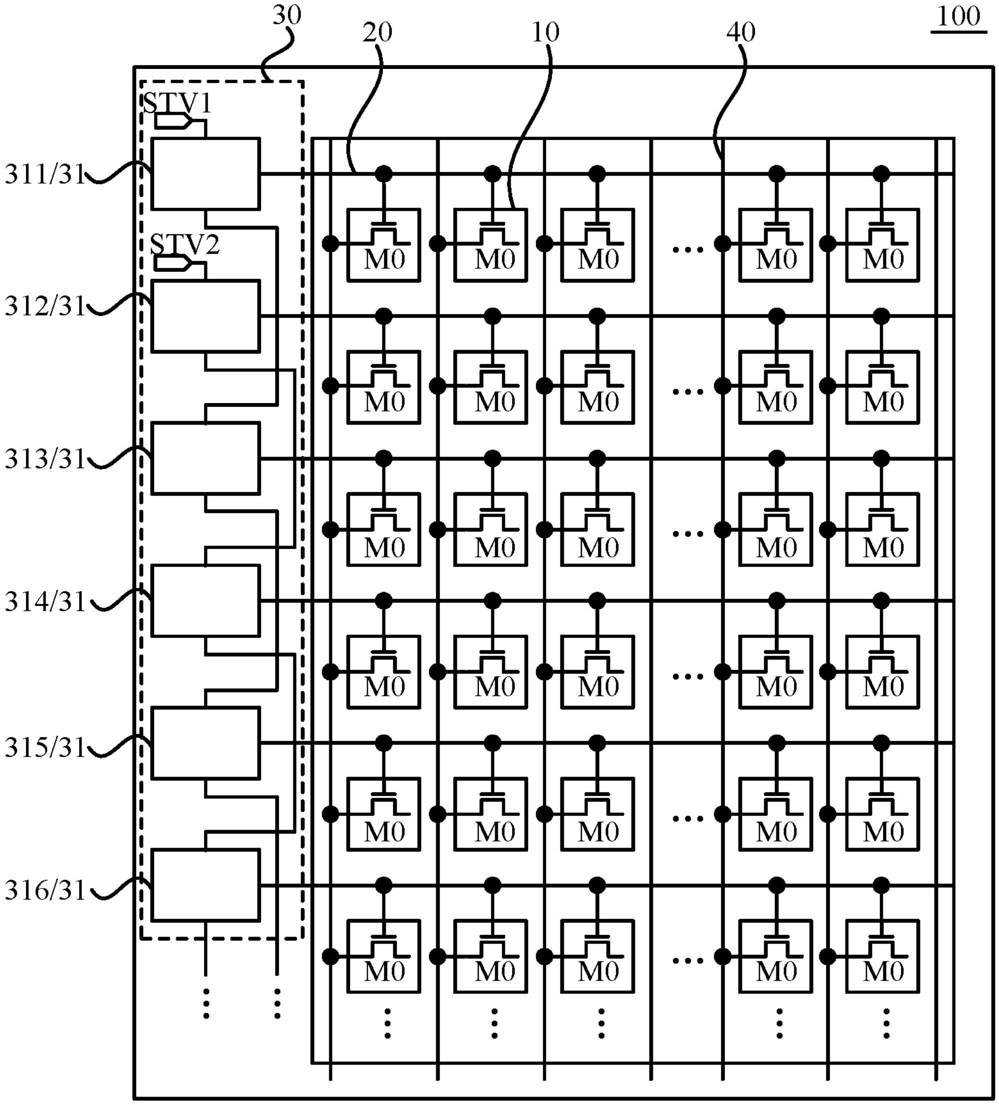
FIG. 3 is a diagram illustrating the structure of a display panel according to an embodiment of the present application.
Figure 4:
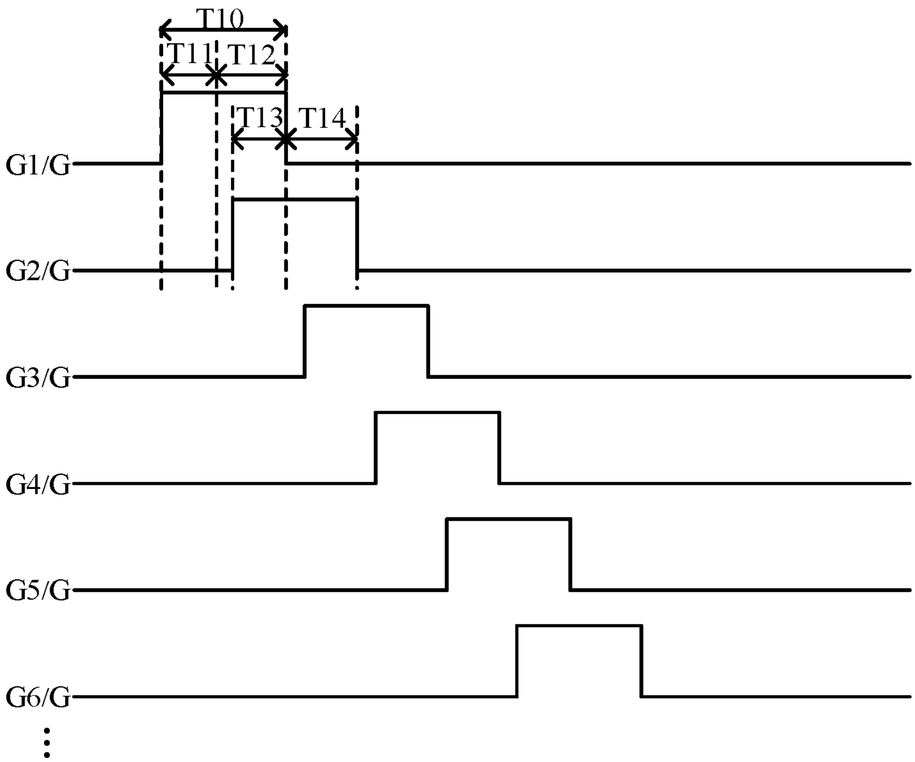
FIG. 4 is a drive timing diagram of a display panel according to an embodiment of the present application.

FIG. 3 is a diagram illustrating the structure of a display panel according to an embodiment of the present application. FIG. 4 is a drive timing diagram of a display panel according to an embodiment of the present application. In conjunction with FIGS. 3 and 4, the display panel 100 includes a driver circuit 30, multiple scan lines 20, and multiple pixels 10 arranged in an array. Each pixel 10 includes at least one switch transistor M0, that is, one or more switch transistors M0 may be included in the each pixel 10. This may be designed according to actual requirements and is not specifically limited in the embodiments of the present application. Gates of switch transistors M0 in at least part of the same row of pixels 10 are electrically connected to the same one scan line 20, that is, gates of switch transistors in the same row of pixels 10 are electrically connected to the same one scan line 20, or gates of switch transistors in part of the same row of pixels 10 are electrically connected to the same one scan line 20. For ease of description, unless special limitations are made, the embodiments of the present application are illustrated using an example in which the same row of pixels 10 are all electrically connected to the same one scan line 20.

The display panel 100 may be a self-luminous display panel or a non-self-luminous display panel. When being a non-self-luminous display panel, the display panel 100 may include, but is not limited to, a liquid crystal display panel. In this case, the each pixel 10 may further include a pixel electrode and a common electrode. When the at least one switch transistor M0 is turned on, a data signal can be transmitted to the pixel electrode to enable an electric field to be generated between the pixel electrode and the common electrode so that the light-transmissive brightness of the each pixel 10 can be controlled under the action of the electric field, thereby controlling the display brightness of the each pixel 10. When being a self-luminous display panel, the display panel 100 includes, but is not limited to, an organic light-emitting display panel or a micro/mini light-emitting diode (LED) display panel. In this case, the each pixel may include a pixel circuit and a light-emitting element. The pixel circuit may include a drive transistor and at least one switch transistor M0. Each switch transistor M0 can control a data signal to supply to a gate of the drive transistor so that the drive transistor can supply a drive current to the light-emitting element according to the data signal of the gate of the drive transistor, controlling the display brightness of the light-emitting element, that is, controlling the display brightness of the each pixel 10.

It is to be noted that the preceding merely exemplifies that the each switch transistor M0 is a transistor that controls the data signal to write into a respective pixel 10, and in the embodiments of the present application, the each switch transistor M0 may also be a transistor that controls the writing of another signal. This is not specifically limited in the embodiments of the present application. For ease of description, the technical solutions of the embodiments of the present application are illustrated using an example in which the each switch transistor M0 can control the writing of the data signal in the embodiments of the present application.

In an optional embodiment, as shown in FIG. 3, the display panel 100 may further include multiple data lines 40.

First electrodes of switch transistors M0 in at least part of the same column of pixels 10 are electrically connected to the same one data line 40, that is, first electrodes of switch transistors M0 in the same column of pixels 10 are all electrically connected to the same one data line 40, or first electrodes of switch transistors M0 in part of the same column of pixels 10 are electrically connected to the same one data line 40. For ease of description, the technical solutions of the embodiments of the present application are illustrated using an example in which the first electrodes of the switch transistors M0 in the same column of pixels 10 are all electrically connected to the same one data line 40 in the embodiments of the present application. Each data line 40 can transmit a data signal of a respective same column of pixels 10 in a time-sharing manner to write the data signal into the respective same column of pixels 10 when switch transistors M0 are in an on state, so as to perform data refreshing on the respective same column of pixels 10.

With continued reference to FIGS. 3 and 4, the driver circuit 30 includes multiple shift register units 31; the i-th shift register unit 31*i* is cascaded with the (i+n)-th shift register unit 31(*i*+n); n is a positive integer greater than or equal to 2, and i is a positive integer; shift register units 31 are electrically connected to the multiple scan lines 20 respectively and supply gate drive signals G to the multiple scan lines 20 respectively, and valid pulses of the gate drive signals G received by the multiple scan lines 20 are shifted successively. The valid pulses of the gate drive signals G each have a width denoted as T0; T0>(Th+k*Th), 0<k≤(n−1), Th=1/(F*L), where F denotes the refresh rate of the display panel 100, and L denotes the number of rows of the multiple pixels 10; and valid pulses of gate drive signals output by any two adjacent shift register units 31 have a shift amount greater than or equal to Th.

Exemplarily, using n=2 as an example, the first shift register unit 311 is cascaded with the third shift register unit 313, the second shift register unit 312 is cascaded with the fourth shift register unit 314, the third shift register unit 313 is cascaded with the fifth shift register unit 315, and the fourth shift register unit 314 is cascaded with the sixth shift register unit 316. In this way, the any two adjacent shift register units 31 in the driver circuit 30 are not interconnected so that a gate drive signal Gi output by the previous shift register unit 31*i* cannot affect a gate drive signal G(i+1) output by the next shift register unit 31(*i*+1). In this case, during the time period of the valid pulse of the gate drive signal Gi output by the previous shift register unit 31*i*, the gate drive signal G(i+1) output by the next shift register unit 31(*i*+1) may also be a valid pulse, that is, the time period of the valid pulse of the gate drive signal Gi output by the previous shift register unit 31*i* may overlap the time period of the valid pulse of the gate drive signal G(i+1) output by the next shift register unit 31(*i*+1), so that the valid pulses of the gate drive signals G output by the shift register units 31 can each have a width greater than the driving time period Th of a row of pixels, that is, the valid pulses of the gate drive signals G transmitted by the multiple scan lines 20 can each have a width greater than the driving time period Th of a row of pixels.

The gates of the switch transistors M0 in the same row of pixels 10 are electrically connected to the same one scan line 20 so that a gate drive signal G transmitted by the same one scan line 20 can control the switch transistors M0 in the same row of pixels 10 to turn on or off. When being at a valid level, the gate drive signal G can control the switch transistors M0 to be in an on state, and when being at an invalid level, the gate drive signal G can control the switch transistors M0 to be in an off state.

It is to be understood that the width of the valid pulse of the gate drive signal G is the length of time period for which the gate drive signal G remains at the valid level. The switch transistors M0 may be n-type transistors or p-type transistors. When the switch transistors M0 are n-type transistors, the valid level of the gate drive signal G is a high level, and the invalid level of the gate drive signal is a low level; and when the switch transistors M0 are p-type transistors, the valid level of the gate drive signal G is a low level, and the invalid level of the gate drive signal G is a high level. For ease of description, unless special limitations are made, the technical solutions of the embodiments of the present application are illustrated using an example in which the switch transistors M0 are n-type transistors in the embodiments of the present application.

When the same one scan line 20 is used for transmitting the gate drive signal G, as the transmission distance of the gate drive signal G increases, the voltage drop of the gate drive signal G is more noticeable so that voltages of the gate drive signals received by the same row of pixels 10 at different positions can be different. Consequently, when the valid pulse of the gate drive signal G is used for charging the gates of the switch transistors M0 in the same row of pixels 10, charging durations required for the switch transistors M0 in the same row of pixels 10 at different positions are different. When the time period of the valid pulse of the gate drive signal G transmitted by the same one scan line 20 is sufficiently long, all the switch transistors M0 in the same row of pixels 10 can be ensured to be in a normal on state.

In an embodiment, the valid pulses of the gate drive signals output by the shift register units 31 each have a width denoted as Th+k*Th, that is, the time period for which the gate drive signals G output by the shift register units 31 are remained at the valid pulses is Th+k*Th, and since 0<k≤(n−1), the valid pulses of the gate drive signals G output by the shift register units 31 can each have a width greater than the driving time period Th of a row of pixels 10. When the gate drive signals G output by the shift register units 31 are each used for controlling the switch transistors M0 in the respective same row of pixels 10 to turn on or off, the time period of the valid pulse of the gate drive signal G received by the switch transistors M0 in the each row of pixels 10 is greater than the driving time period Th of a row of pixels 10, that is, the time period for charging the gates of the switch transistors M0 in the each row of pixels 10 is greater than the driving time period Th of a row of pixels 10, so that the gates of the switch transistors M0 in the same row of pixels 10 can have a sufficiently long charging time period, and so that all the switch transistors 10 in the same row of pixels 10 can be in a normal on state. Consequently, through the turned-on switch transistors M0, a data signal can be accurately written into pixels 10 to which the switch transistors M0 belong so that when the pixels 10 perform light emission for display according to the written data signal, the accuracy of the display brightness of the pixels 10 can be improved, thereby improving the overall display effect of the display panel 100.

Exemplarily, an example in which a gate drive signal G1 output by the first shift register unit 311 is transmitted to gates of switch transistors M0 in the first row of pixels 10 through a respective scan line 20, and a gate drive signal G2 output by the second shift register unit 312 is transmitted to gates of switch transistors M0 in the second row of pixels 10 through a respective scan line 20 is used as an example. Since the gate drive signals G output by the shift register units 31 are shifted successively, and the valid pulses of the gate drive signals G output by the two adjacent shift register units 31 have a shift amount T14 greater than or equal to Th, the start time period of the valid pulse of the gate drive signal G1 output by the first shift register unit 311 is located before the start time period of the valid pulse of the gate drive signal G2 output by the second shift register unit 312, the valid pulse of the gate drive signal G1 output by the first shift register unit 311 and the valid pulse of the gate drive signal G2 output by the second shift register unit 312 may have an overlapping time period T13 less than or equal to k*Th, and compared with the valid pulse of the gate drive signal G1 output by the first shift register unit 311, the valid pulse of the gate drive signal G2 output by the second shift register unit 312 has a shift amount T14 greater than or equal to Th.

In the time period T11, the valid level of the gate drive signal G1 output by the first shift register unit 311 is transmitted to the gates of the switch transistors M0 in the first row of pixels 10 through the respective scan line 20 to charge the gates of the switch transistors M0 in the first row of pixels 10 so that the voltage of the gates of the switch transistors M0 in the first row of pixels 10 can tend to be at the valid level of the gate drive signal G1 from the invalid level of the gate drive signal G1, and the switch transistors M0 in the first row of pixels 10 can tend to be in an on state from an off state. Within the time period T12, the gate drive signal G1 output by the first shift register unit 311 continues remaining at the valid level so that the gates of the switch transistors M0 in the first row of pixels 10 can continue being charged based on the voltage charged to the gates of the switch transistors M0 in the first row of pixels 10 in the time period T11, and so that the voltage of the gates of the switch transistors M0 in the first row of pixels 10 can be charged quickly until the conduction condition of the switch transistors M0 is satisfied, that is, in the time period T12, the switch transistors M0 in the first row of pixels 10 can be turned on quickly. At this time period, a data signal of the first row of pixels 10 transmitted by a respective data line 40 is written into the first row of pixels 10 through the turned-on switch transistors M0 so that the time period for writing the data signal can tend to be the total time period of the time period T12. Consequently, the data signal of the first row of pixels 10 can have a sufficiently long writing time period to ensure the accuracy of the data signal written into the first row of pixels 10 so that the first row of pixels 10 can perform light emission for display accurately.

Within the time period T13 in the time period T12, the second shift register unit 312 also outputs the valid level of the gate drive signal G2, and the valid level of the gate drive signal G2 can be transmitted to the gates of the switch transistors M0 in the second row of pixels 10 through the respective scan line 20 to charge the gates of the switch transistors M0 in the second row of pixels 10 so that the voltage of the gates of the switch transistors M0 in the second row of pixels 10 can tend to be at the valid level of the gate drive signal G2 from the invalid level of the gate drive signal G2, and the switch transistors M0 in the second row of pixels 10 can tend to be in a normal on state. Within the time period T14, the first shift register unit 311 outputs the invalid level of the gate drive signal G1, the switch transistors M0 in the first row of pixels 10 tend to be in an off state, and the gate drive signal G2 output by the second shift register unit G2 continues remaining at the valid level so that the gates of the switch transistors M0 in the second row of pixels 10 can continue being charged based on the voltage charged to the gates of the switch transistors M0 in the second row of pixels 10 in the time period T13, and so that the voltage of the gates of the switch transistors M0 in the second row of pixels 10 can be charged quickly until the conduction condition of the switch transistors M0 is satisfied, that is, in the time period T14, the switch transistors M0 in the second row of pixels 10 can be turned on quickly. At this time, a respective data line 40 transmits a data signal of the second row of pixels 10 so that the time for writing the data signal of the second row of pixels 10 can also tend to be the total time of the time period T14, that is, the time period for writing the data signal of the second row of pixels 10 can be greater than or equal to the driving time period Th of a row of pixels. Consequently, the data signal of the second row of pixels 10 can also have a sufficiently long writing time period to ensure the accuracy of the data signal written into the second row of pixels 10 so that the second row of pixels 10 can perform light emission for display accurately.

If the switch transistors M0 in the second row of pixels 10 have been in an on state within the time period T13, the data signal of the first row of pixels 10 transmitted by the respective data line 40 is also written into the second row of pixels 10. In this case, the data signal of the first row of pixels 10 may be used for pre-charging the nodes electrically connected to the switch transistors M0 in the second row of pixels 10 so that the data signal of the second row of pixels 10 can continue being written into the nodes electrically connected to the switch transistors M0 in the second row of pixels based on the signal written into the nodes electrically connected to the switch transistors M0 in the time period T13 when entering the time period T14, and so that the signal at the nodes electrically connected to the switch transistors M0 in the second row of pixels 10 can still remain consistent with the data signal of the second row of pixels 10.

In this way, the any two adjacent shift register units are not interconnected so that the valid pulses of the gate drive signals output by the any two adjacent shift register units can each have a width greater than Th. Consequently, when the shift register units output the valid levels of the gate drive signals, the valid levels of the gate drive signals can charge the gates of the switch transistors in the rows of pixels for a sufficiently long time period, especially for the display panels having a large size and high resolution. Even if the number of pixels electrically connected to the each scan line is relatively large, and the load carried by the each shift register unit is relatively large, all gates of switch transistors in a row of pixels can be charged until the conduction condition is satisfied in the period in which the shift register units output the valid levels of the gate drive signals, ensuring that the switch transistors in the row of pixels can be in a normal on state, and so that the respective signals can be written into the rows of pixels accurately, ensuring that the rows of pixels can perform light emission for display accurately, thereby facilitating the improvement of the display effect of the display panel.

Additionally, since the valid pulses of the gate drive signals of the two adjacent shift register units have a shift amount greater than or equal to the driving time period Th of a row of pixels, the gates of the switch transistors in the row of pixels can be pre-charged within the first k*Th time period of the valid pulses of the gate drive signals output by the shift register units so that the switch transistors in the row of pixels can tend to be in a normal on state from an off state. Moreover, within the last Th time period of the valid pulses of the gate drive signals output by the shift register units, the switch transistors in the row of pixels can be in a normal on state quickly so that within the driving time period Th of the at least one row of pixels, the switch transistors in the row of the pixels can be in a normal on state, and the time period for supplying the respective signals to the nodes electrically connected to the switch transistors can be the driving time period Th of the at least one row of pixels. Consequently, the respective signals can be written into the rows of pixels accurately so that the rows of pixels can perform light emission for display accurately, thereby improving the display effect of the display panel.

It is to be understood that the valid pulses of the gate drive signals output by the shift register units each have a width T10 denoted as Th+k*Th, where k is a positive integer greater than 0 and less than or equal to n−1, so that the valid pulse of the gate drive signal output by the each shift register unit can have a width greater than Th and less than or equal to n*Th. For example, when n is equal to 2, the valid pulse of the gate drive signal may have a width T10 denoted as (4/3)*Th, (3/2)*Th, or 2Th. This may be designed according to actual requirements and is not specifically limited in the embodiments of the present application.

Optionally, with continued reference to FIGS. 3 and 4, since the i-th shift register unit 31*i* is cascaded with the (i+n)-th shift register unit 31(*i*+n), the gate drive signal Gi output by the i-th shift register unit 31*i* can control the gate drive signal G(i+n) output by the (i+n)-th shift register unit 31(*i*+n). In this case, the time period of the valid pulse of the gate drive signal Gi output by the i-th shift register unit 31*i* does not overlap the time period of the valid pulse of the gate drive signal G(i+n) output by the (i+n)-th shift register unit 31(*i*+n), that is, compared with the valid pulse of the gate drive signal Gi output by the i-th shift register unit 31*i*, the valid pulse of the gate drive signal G(i+n) output by the (i+n)-th shift register unit 31(*i*+n) is ensured to have a shift amount greater than or equal to T10, that is, the time period in which the valid pulse of the gate drive signal G(i+n) output by the (i+n)-th shift register unit 31(*i*+n) does not overlap the valid pulse of the gate drive signal Gi output by the i-th shift register unit 31*i* is greater than or equal to T10. Within the time period, a respective data line 40 may transmit a data signal of pixels 10 corresponding to the (i+n)-th shift register unit 31(*i*+n) so that the pixels 10 corresponding to the (i+n)-th shift register unit 31(*i*+n) can be ensured to have a sufficiently long time period for writing the data signal, thereby improving the display light emission accuracy of the pixels 10 corresponding to the (i+n)-th shift register unit 31(*i*+n).

Figure 5:
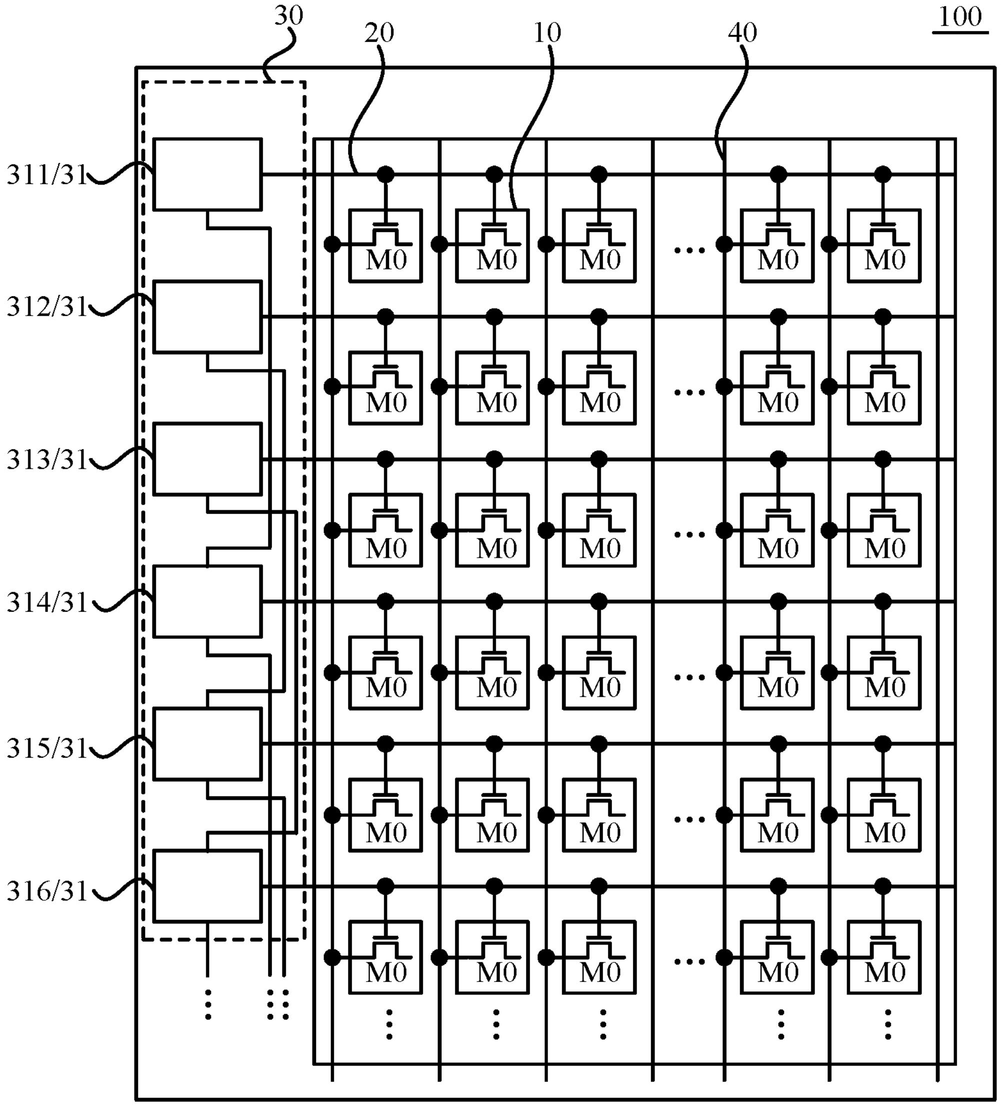
FIG. 5 is a diagram illustrating the structure of another display panel according to an embodiment of the present application.

It is to be noted that the technical solutions of the embodiments of the present application are merely illustrated using the preceding example in which n=2, and in the embodiments of the present application, n may be any positive integer greater than or equal to 2, for example, as shown in FIG. 5, n may also be equal to 3. The value of n is not specifically limited in the embodiments of the present application on the premise that the core application points of the embodiments of the present application can be achieved.

Figure 6:
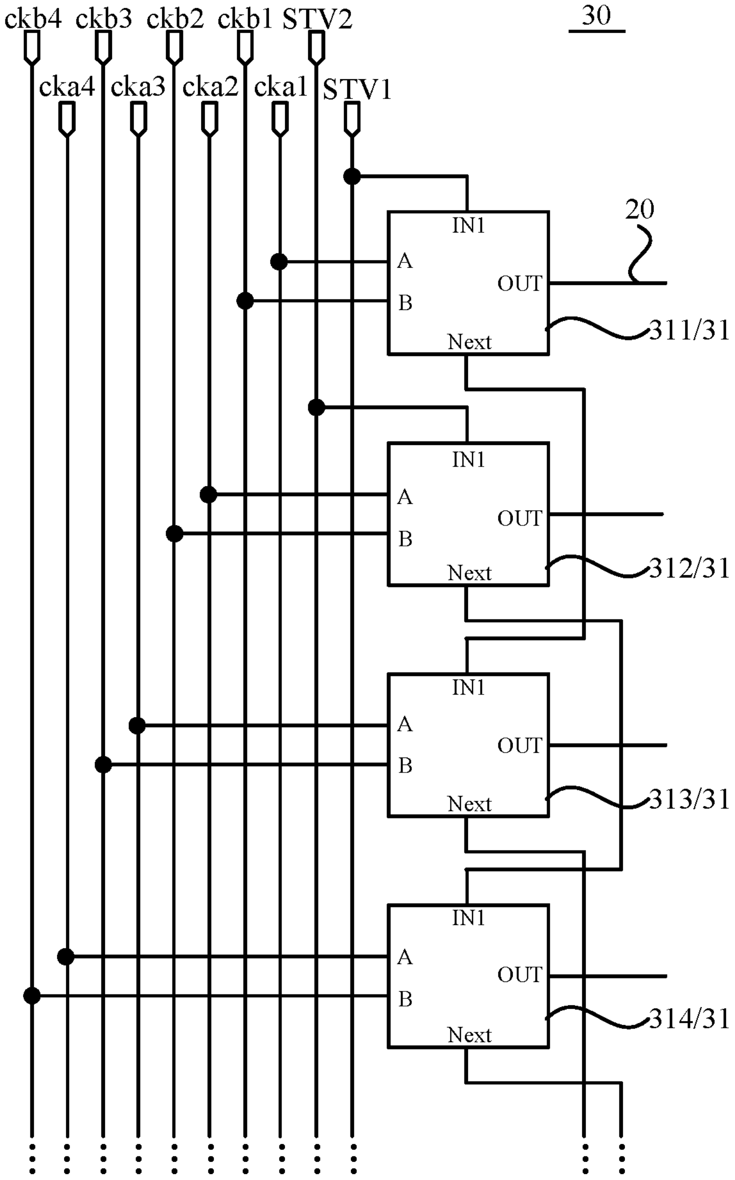
FIG. 6 is a diagram illustrating the structure of a driver circuit according to an embodiment of the present application.

In an optional embodiment, FIG. 6 is a diagram illustrating the structure of a driver circuit according to an embodiment of the present application. As shown in FIG. 6, each shift register unit 31 at least includes a first input terminal IN1, a clock signal terminal A, a shift output terminal Next, at least one drive output terminal OUT and at least one output control terminal B corresponding to the at least one drive output terminal OUT respectively. The each shift register unit 31 is configured to control a shift signal Vnext output by the shift output terminal Next and a gate drive signal G output by each drive output terminal OUT in response to a clock signal CKA received by the clock signal terminal A, a first input signal Vin1 received by the first input terminal IN1 and an output control signal CKB received by each output control terminal B.

A shift output terminal Next of the i-th shift register unit 31*i* is electrically connected to a first input terminal IN1 of the (i+n)-th shift register unit 31(*i*+n). Drive output terminals OUT of the shift register units 31 are electrically connected to the multiple scan lines 20 respectively. For example, when n is equal to 2, the shift output terminal Next of the first shift register unit 311 is electrically connected to the first input terminal IN1 of the third shift register unit 313, and the shift output terminal Next of the second shift register unit 312 is electrically connected to the first input terminal of the fourth shift register unit 314.

It is to be understood that the clock signal CKA received by the clock signal terminal A and the output control signal CKB received by the each output control terminal B may be pulse signals each composed of a high level and a low level, and the clock signal CKA and the output control signal CKB may have the same clock cycle or different clock cycles, and this is not specifically limited in this embodiment. Effective levels of the clock signal CKA and the output control signal CKB may be high levels or low levels, and this may be disposed according to actual requirements and is not specifically limited in the embodiments of the present application. For ease of description, the technical solutions of the embodiments of the present application are illustrated using an example in which the valid levels of the clock signal CKA and the output control signal CKB are high levels in the embodiments of the present application.

In an embodiment, since the shift output terminal Next of the i-th shift register unit 31*i* is electrically connected to the first input terminal IN1 of the (i+n)-th shift register unit 31(*i*+n), a shift signal Vnexti output by the shift output terminal of the i-th shift register unit 31*i* can also serve as a first input signal Vin1(*i*+n) received by the first input terminal IN1 of the (i+n)-th shift register unit 31(*i*+n) so that the (i+n)-th shift register unit 31(*i*+n) can control a shift signal Vnext(i+n) output by a shift output terminal Next of the (i+n)-th shift register unit 31(*i*+n) and a gate drive signal G(i+n) output by a drive output terminal OUT of the (i+n)-th shift register unit 31(*i*+n) according to the shift signal Vnexti output by the shift output terminal Next of the i-th shift register unit 31*i*. In this case, first input terminals IN1 of the shift register units from the first shift register unit 311 to the n-th shift register unit 31*n* may receive start signals STV1, . . . , STVn respectively, and valid pulses of the start signals STV1, . . . , STVn should be shifted successively to successively start the shift register units from the first shift register unit 311 to the n-th shift register unit 31*n* so that shift signals Vnext output by shift output terminals Next of the shift register units from the first shift register unit 311 to the n-th shift register unit 31*n* can be shifted successively, and gate drive signals G output by drive output terminals OUT of the shift register units can be shifted successively, thereby avoiding signal crosstalk and improving the accuracy of the shift signals Vnext and the gate drive signals G that are output by the shift register units 31.

It is to be understood that on the basis that the each shift register unit includes the first input terminal, the clock signal terminal A, the shift output terminal, the at least one drive output terminal and the at least one output control terminal, the each shift register unit may further include other signal terminals and modules so that signals of signal terminals can mutually cooperate with modules to output respective shift signals and gate drive signals.

Figure 7:
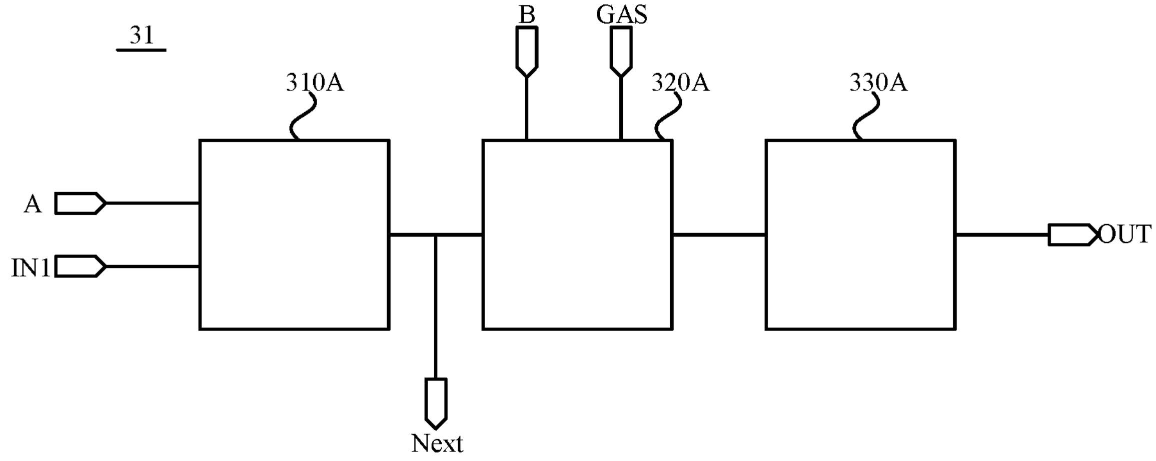
FIG. 7 is a diagram illustrating the structure of a shift register unit according to an embodiment of the present application.

In an optional embodiment, FIG. 7 is a diagram illustrating the structure of a shift register unit according to an embodiment of the present application. As shown in FIG. 7, the each shift register unit 31 further includes a latch module 310A, at least one level conversion module 320A corresponding to the at least one drive output terminal OUT respectively and at least one output module 330A corresponding to the at least one level conversion module 320A respectively. In the same one shift register unit 31, a latch module 310A is electrically connected to a clock signal terminal A, a first input terminal IN1 and a shift output terminal Next and is configured to latch a first input signal Vin1 of the first input terminal IN1 and control a shift signal Vnext output by the shift output terminal Next in response to a clock signal CKA of the clock signal terminal A; each level conversion module 320A is electrically connected to a respective output control terminal B, the shift output terminal Next and a respective output module 330A and is configured to control the voltage of a gate drive signal G supplied to the respective output module 330A in response to an output control signal CKB of the respective output control terminal B and the shift signal Vnext; and each output module 330A is further electrically connected to a respective drive output terminal OUT and is configured to control the polarity of a gate drive signal G output by the respective drive output terminal OUT.

The each latch module 310A may include a latch and others. The each latch module 310A may latch the first input signal Vin1 of the first input terminal IN1 and control the shift output terminal Next to output the valid level of the shift signal Vnext when the clock signal CKA is at a valid level, and the each latch module 310A stops latching the first input signal Vin1 of the first input terminal IN1 when the clock signal CKA is at an invalid level. After stopping latching the first input signal Vin1 of the first input terminal IN1, the each latch module 310A may continue controlling the shift output terminal Next to output the valid level of the shift signal Vnext, and the shift output terminal Next starts to output the invalid level of the shift signal Vnext when the clock signal CKA hops to be at the valid level again. In this way, the each latch module 310A may output the valid level or invalid level of the shift signal Vnext under the control of the clock signal CKA and the first input signal Vin1.

Figure 8:
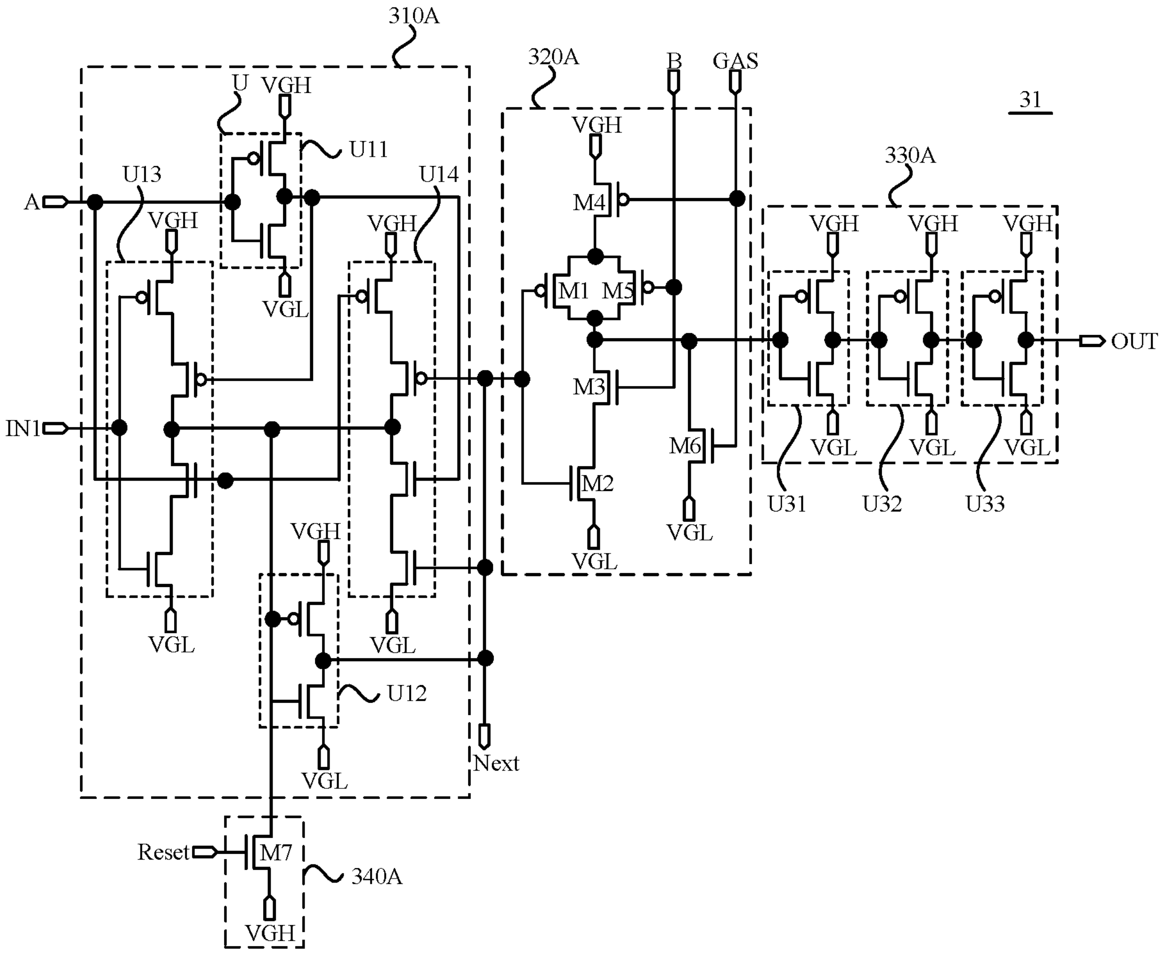
FIG. 8 is a diagram illustrating the circuit structure of a shift register unit according to an embodiment of the present application.

In an exemplary embodiment, as shown in FIG. 8, the each latch module 310A may include a first inverter U11, a second inverter U12, a first tri-state gate U13 and a second tri-state gate U14. An input terminal of the first inverter U11 is electrically connected to the clock signal terminal A and is further electrically connected to a negative signal control terminal of the first tri-state gate U13 and a positive signal control terminal of the second tri-state gate U14, and an output terminal of the first inverter U11 is electrically connected to a positive signal control terminal of the first tri-state gate U13 and a negative signal control terminal of the second tri-state gate U14. An input terminal of the first tri-state gate U13 is electrically connected to the first input terminal IN1, an input terminal of the second tri-state gate U14 is electrically connected to the shift output terminal Next, and an output terminal of the first tri-state gate U13 and an output terminal of the second tri-state gate U14 are electrically connected to an input terminal of the second inverter U12. An output terminal of the second inverter U12 is electrically connected to the input terminal of the second tri-state gate U14, and the output terminal of the second tri-state gate U14 is electrically connected to the input terminal of the second inverter U12.

The first inverter U11 and the second inverter U12 may each be composed of one n-type transistor and one p-type transistor. Consequently, when the input terminal of the first inverter U11 receives a high level of the clock signal CKA, the n-type transistor can be controlled to turn on so that the n-type transistor can transmit a low-level signal VGL to the output terminal of the first inverter U11, and the first inverter U11 can output a low-level signal. When the input terminal of the first inverter U11 receives a low level of the clock signal CKA, the p-type transistor can be controlled to turn on so that the p-type transistor can transmit a high-level signal VGH to the output terminal of the first inverter U11, and the first inverter U11 can output a high-level signal. Similarly, when the input terminal of the second inverter U12 is at a high level, the n-type transistor of the second inverter U12 can be controlled to turn on, and when the input terminal of the second inverter U12 is at a low level, the p-type transistor of the second inverter U12 can be controlled to turn on so that a signal of the input terminal of the second inverter U12 and a signal of the output terminal of the second inverter U12 can have opposite polarities.

The first tri-state gate U13 and the second tri-state gate U14 may each be composed of two p-type transistors and two n-type transistors that are successively connected in series. Consequently, when the input terminal of the first tri-state gate U13 receives a high level of the first input signal Vin1, the negative signal control terminal of the first tri-state gate U13 receives the high level of the clock signal CKA, and the positive signal control terminal of the first tri-state gate U13 receives the low-level signal output by the first inverter U11, the two n-type transistors of the first tri-state gate U13 can transmit the low-level signal VGL to the output terminal of the first tri-state gate U13 so that the first tri-state gate U13 can output a low-level signal. When the input terminal of the first tri-state gate U13 receives a low level of the first input signal Vin1, the negative signal control terminal of the first tri-state gate U13 receives the high level of the clock signal CKA, and the positive signal control terminal of the first tri-state gate U13 receives the low-level signal output by the first inverter U11, the two p-type transistors of the first tri-state gate U13 can transmit the high-level signal VGH to the output terminal of the first tri-state gate U13 so that the first tri-state gate U13 can output a high-level signal. Accordingly, the second tri-state gate U14 and the first tri-state gate U13 have similar operation principles, so details are not repeated, and similarities may be referred to the description of the operation process of the first tri-state gate U13.

With continued reference to FIG. 7, under the control of the output control signal CKB of the respective output control terminal B, the each level conversion module 320A may perform level-to-pulse-width conversion on the received shift signal Vnext and output a respective gate drive signal G so that the amplitude of the valid level of the gate drive signal G can be an amplitude capable of controlling the each switch transistor M0 to turn on, and the amplitude of the invalid level of the gate drive signal G can be an amplitude capable of controlling the each switch transistor M0 to turn off. That is, the amplitudes of the valid level and the invalid level of the gate drive signal G are related to the threshold voltage of the each switch transistor M0. The specific structure of the each level conversion module 320A is not limited in the embodiments of the present application on the premise that the gate drive signal G can control the each switch transistor M0 to turn on or off.

In an optional embodiment, with continued reference to FIG. 7, the each shift register unit 31 may further include a set signal terminal GAS. The set signal terminal GAS may be electrically connected to the each level conversion module 320A so that before the shift register units 31 in the driver circuit start to output the valid pulses of the gate drive signals G, the each level conversion module 320A can, in response to a set signal Vgas of the set signal terminal GAS, enable the shift register units 31 to output invalid levels of the gate drive signals G to control all the switch transistors M0 of the multiple pixels to be in an off state.

In an exemplary embodiment, as shown in FIG. 8, the each level conversion module 320A may be composed of multiple n-type transistors (M2, M3 and M6) and multiple p-type transistors (M1, M4 and M5). A gate of the transistor M1 and a gate of the transistor M2 are electrically connected to the shift output terminal Next. A gate of the transistor M5 and a gate of the transistor M3 are electrically connected to the respective output control terminal B. A gate of the transistor M4 and a gate of the transistor M6 are electrically connected to the set signal terminal GAS. A first electrode of the transistor M4 receives the high-level signal VGH, and a second electrode of the transistor M4 is electrically connected to a first electrode of the transistor M1 and a first electrode of the transistor M5. A second electrode of the transistor M1 and a second electrode of the transistor M5 are electrically connected to a second electrode of the transistor M3. A first electrode of the transistor M3 is electrically connected to a first electrode of the transistor M2, and the first electrode of the transistor M2 receives the low-level signal VGL. A first electrode of the transistor M6 receives the low-level signal VGL, and a second electrode of the transistor M6 is electrically connected to the second electrode of the transistor M3 and serves as an output terminal of the each level conversion module 320A to be electrically connected to an input terminal of the respective output module 330A.

Since the transistor M1 and the transistor M2 have different types, the transistor M1 and the transistor M2 may be turned on in a time-sharing manner, that is, when the shift output terminal Next is at a high level, the transistor M2 may be in an on state, and when the shift output terminal Next is at a low level, the transistor M1 may be in an on state. Accordingly, the transistor M5 and the transistor M3 are turned on in a time-sharing manner, and the transistor M4 and the transistor M6 are turned on in a time-sharing manner. In this way, when the set signal Vgas of the set signal terminal GAS is at a high level, the transistor M6 may be controlled to turn on, and the transistor M4 may be controlled to turn off so that the low-level signal VGL can be transmitted to the output terminal of the each level conversion module 320A through the transistor M6, and the each level conversion module 320A can output the low level of the respective gate drive signal G. When the set signal Vgas is at a low level, the transistor M6 may be controlled to turn off, and the transistor M4 may be controlled to turn on. At this time, the high-level signal VGH may be transmitted to the first electrode of the transistor M1 and the first electrode of the transistor M5 through the transistor M4. If at least one of the shift signal Vnext of the shift output terminal Next or the output control signal CKB of the respective output control terminal B is at a low level at this time, at least one of the transistor M1 and the transistor M5 may be controlled to turn on correspondingly, and the high-level signal VGH may be transmitted to the output terminal of the each level conversion module 320A through the at least one of the transistor M1 and the transistor M5 so that the each level conversion module 320A can output the high level of the respective gate drive signal G. When the output control signal B and the shift signal Vnext are each at a high level, the transistor M2 and the transistor M3 are turned on so that the low-level signal can be transmitted to the output terminal of the each level conversion module 320A through the transistor M2 and the transistor M3 successively, and so that the each level conversion module 320A can output the low level of the respective gate drive signal. In this way, the each level conversion module 320A may supply the high level or low level of the respective gate drive signal G to the respective output module 330A under the control of the shift signal Vnext, the output control signal CKB and the set signal Vgas.

With continued reference to FIG. 8, the respective output module 330A may convert the polarity of the respective gate drive signal G output by the each level conversion module 320A according to the polarity of the each switch transistor. For example, when the each switch transistor is an n-type transistor, if the valid level of the respective gate drive signal G output by the each level conversion module 320A is a low level, the respective output module 330A may convert the respective gate drive signal G output by the each level conversion module 320A from the low level to the high level so that when the respective gate drive signal G is at a valid level, the each switch transistor can be controlled to be in an on state. Conversely, the respective output module 330A may also convert the invalid level of the respective gate drive signal G output by the each level conversion module 320A from a high level to a low level so that the respective gate drive signal G at the low level can control the each switch transistor to be in an off state. Additionally, when the each switch transistor is a p-type transistor, and the valid level of the respective gate drive signal G output by the each level conversion module 320A is a low level, the respective output module 330A does not need to convert the polarity of the respective gate drive signal G output by the each level conversion module 320A. At this time, the respective output module 330A may buffer the respective gate drive signal G output by the each level conversion module 320A so that the respective gate drive signal G transmitted to a respective drive output terminal OUT can have a relatively high driving capability to control the each switch transistor to turn on or off quickly and accurately.

In an exemplary embodiment, the each output module 330A may include at least one buffer. Each buffer may be composed of one or more inverters. The number of inverters in the each output module 330A may be odd or even. When the number of inverters in the respective output module 330A is odd, the respective output module 330A can not only convert the polarity of the respective gate drive signal G output by the each level conversion module 320A but also improve the driving capability of the respective gate drive signal G. When the number of inverters in the respective output module 330A is even, the respective output module 330A only needs to improve the driving capability of the respective gate drive signal G, without converting the polarity of the respective gate drive signal G output by the each level conversion module 320A.

Exemplarily, as shown in FIG. 8, the respective output module 330A includes three inverters U31, U32 and U33 that are successively connected in series. Similarly, the inverters U31, U32 and U33 are each composed of an n-type transistor and a p-type transistor so that when the each level conversion module 320A outputs the high level of the respective gate drive signal G, the n-type transistor in the inverter U31 can be turned on. The n-type transistor can transmit the low-level signal VGL to an input terminal of the inverter U32, the p-type transistor in the inverter U32 is turned on, and the p-type transistor can transmit the high-level signal VGH to an input terminal of the inverter U33 so that the n-type transistor in the inverter U33 can be turned on. The n-type transistor can transmit the low-level signal to the respective drive output terminal OUT so that the respective drive output terminal OUT can output the low level of the respective gate drive signal G. Conversely, when the each level conversion module 320A outputs the low level of the respective gate drive signal G, the p-type transistor in the inverter U31 can transmit the high-level signal to the input terminal of the inverter U32 so that the n-type transistor in the inverter U32 can transmit the low-level signal VGL to the input terminal of the inverter U33. The p-type transistor in the inverter U33 transmits the high-level signal VGH to the respective drive output terminal OUT so that the respective drive output terminal OUT can output the high level of the respective gate drive signal G. In this way, the three inverters U31, U32 and U33 that are connected in series are disposed in the respective output module 330A so that the driving capability of the respective gate drive signal G output by the respective drive output terminal OUT can be also improved while the polarity of the respective gate drive signal G output by the each level conversion module 320A can be converted.

Figure 9:
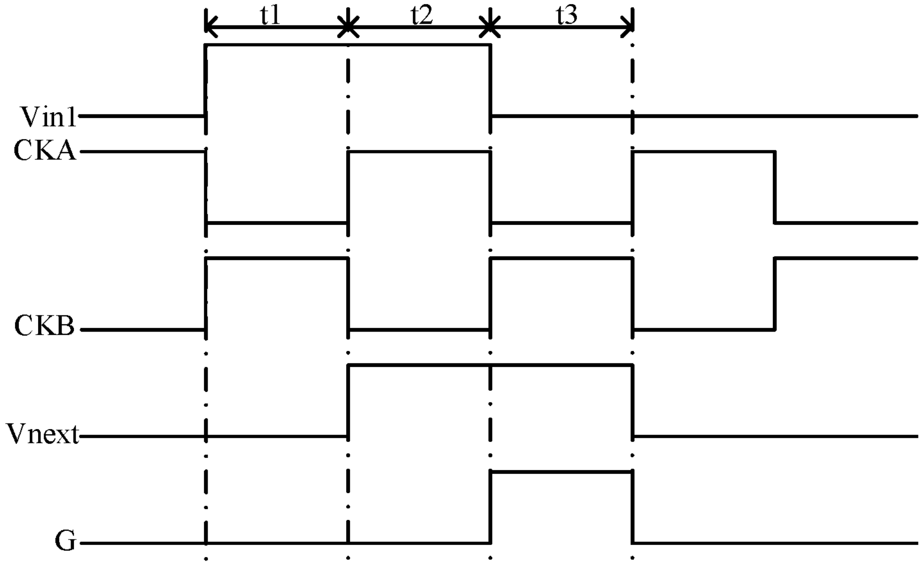
FIG. 9 is a drive timing diagram of a shift register unit according to an embodiment of the present application.

Exemplarily, FIG. 9 is a drive timing diagram of a shift register unit according to an embodiment of the present application, and an example in which levels of valid pulses of the clock signal CKA, the output control signal CKB, the first input signal Vin1, the shift signal Vnext and a gate drive signal G are high levels is used as an example. In conjunction with FIGS. 7, 8 and 9, before the stage t1, the first input signal Vin1 received by the first input terminal IN1 of the each shift register unit 31 is at a low level so that a signal latched by the latch module 310A of the each shift register unit 31 can also be the low-level first input signal Vin1, and the shift output terminal Next electrically connected to the latch module 310A can output the low-level shift signal Vnext; under the control of the low-level shift signal Vnext, the each level conversion module 320A supplies the respective gate drive signal G at the high level to the respective output module 330A, and after the respective output module 330A converts the polarity of the respective gate drive signal G at the high level, the respective drive output terminal OUT outputs the respective gate drive signal G at the low level. In the stage t1, the first input signal Vin1 received by the first input terminal IN1 hops to be at a high level, but since the clock signal CKA of the clock signal terminal A is at a low level at this time, the latch module 310A of the each shift register unit 31 can merely latch the first input signal Vin1, the shift signal Vnext output by the shift output terminal Next can continue remaining at the low level, and accordingly, the respective gate drive signal G output by the respective drive output terminal OUT can continue remaining at the low level. In the stage t2, the first input signal Vin1 received by the first input terminal IN1 continues remaining at the high level, and the clock signal CKA of the clock signal terminal A hops to be at the high level so that the latch module 310A of the each shift register unit 31 can control the shift output terminal Next to output the high-level shift signal Vnext in response to the high-level clock signal CKA. At this time, the output control signal CKB of the respective output control terminal B is at a low level so that the each level conversion module 320A can continue supplying the respective gate drive signal G at the high level to the respective output module 330A, and so that the respective drive output terminal OUT can continue outputting the respective gate drive signal G at the low level after the polarity of the respective gate drive signal G at the high level is converted by the respective output module 330A. In the stage t3, the first input signal Vin1 received by the first input terminal IN1 hops to be at the low level, the clock signal CKA of the clock signal terminal A hops to be at the low level, and the shift signal Vnext output by the shift output terminal Next remains at the same high level as the stage t2. At this time, since the output control signal CKB of the respective output control terminal B hops to be at the high level, the respective gate drive signal G supplied by the each level conversion module 320A to the respective output module 330A can hop to be at the low level so that the respective drive output terminal OUT can output the respective gate drive signal G at the high level after the polarity of the respective gate drive signal G at the low level is converted by the respective output module 330A. After the stage t3, the first input signal Vin1 of the first input terminal IN1 continues remaining at the low level so that the latch module 310A of the each shift register unit 31 can continue latching the low level of the first input signal Vin1, and the respective drive output terminal OUT can also continue outputting the respective gate drive signal G at the low level until the first input signal Vin1 hops to be at the high level again, and the process enters the stage t1 in the next driving cycle again.

In an optional embodiment, with continued reference to FIG. 8, the each shift register unit 31 may further include a reset module 340A and a reset signal terminal Reset. The reset module 340 can reset the signal latched by the latch module 310A in response to a reset signal Vreset of the reset signal terminal Reset so that the shift signal Vnext output by the latch module 310A can be reset to be at the invalid level.

In an exemplary embodiment, as shown in FIG. 8, the reset module 310A may include a reset transistor M7. A gate of the reset transistor M7 is electrically connected to the reset signal terminal Reset, a first electrode of the reset transistor M7 receives the high-level signal VGH, and a second electrode of the reset transistor M7 is electrically connected to the latch module 310A. In an embodiment, the second electrode of the reset transistor M7 is electrically connected to the input terminal of the inverter U12 in the latch module 310A. In this way, when the reset signal Vreset of the reset signal terminal Reset controls the reset transistor M7 to turn on, the reset transistor M7 can transmit the high-level signal VGH to the input terminal of the inverter U12 so that the inverter U12 can output the low-level signal VGL to the shift output terminal Next, thereby enabling the shift signal Vnext output by the shift output terminal Next to be at the low level. The reset transistor M7 may be an n-type transistor or a p-type transistor. This may be disposed according to actual requirements and is not specifically limited in the embodiments of the present application.

It is to be understood that FIG. 8 merely exemplifies the structure of the latch module 310A, the each level conversion module 320A and the each output module 330A in the each shift register unit 31. The structure of the latch module 310A, the each level conversion module 320A and the each output module 330A is not limited in the embodiments of the present application and may be designed according to actual requirements. Based on this, devices disposed in each module may also be added or omitted. The specific structure of the each shift register unit 31 is not limited in the embodiments of the present application on the premise that the core inventive points of the embodiments of the present application can be achieved.

Optionally, in conjunction with FIGS. 7 and 9, in the same one shift register unit 31, the valid pulse of the clock signal CKA and the valid pulse of the output control signal CKB are shifted successively, and the time period of the valid pulse of the clock signal CKA does not overlap the time period of the valid pulse of the output control signal CKB.

A first input signal Vin1 of a first input terminal IN1 of the current shift register unit 31 is a shift signal Vnext output by another shift register unit cascaded with the current shift register unit 31, and a clock signal CKA may control the current shift register unit 31 to latch the first input signal Vin1 received by the first input terminal IN1 of the current shift register unit 31 and control a shift signal Vnext output by the current shift register unit 31. The shift signal Vnext and an output control signal CKB that are output by the current shift register unit 31 can control a gate drive signal G output by the drive output terminal OUT of the current shift register unit 31. In this way, the clock signal CKA and the output control signal CKB of the same one shift register unit 31 are shifted successively, and the time periods of valid pulses of the clock signal CKA and the output control signal CKB do not overlap so that the time period of the valid pulse of the first input signal Vin1 latched by the current shift register unit 31 cannot overlap the time period of the valid pulse of the gate drive signal G output by the each drive output terminal OUT. Meanwhile, since the time period of the valid pulse of the gate drive signal G output by the each drive output terminal OUT overlaps the time period of the valid pulse of the shift signal output by the shift output terminal Next, when the time period of the valid pulse of the first input signal Vin 1 does not overlap the time period of the valid pulse of the gate drive signal G in the same one shift register unit 31, the time periods of valid pulses of gate drive signals output by two shift register units 31 that are cascaded with each other do not overlap so that the valid pulses of the gate drive signals G output by the shift register units 31 do not interfere with each other, and the accuracy of the gate drive signals G output by the shift register units 31 can be improved. Consequently, when the shift register units 31 are used for controlling the switch transistors in the rows of pixels to turn on or off, the states of the switch transistors in the rows of pixels can be controlled accurately so that the respective signals can be written into the rows of pixels accurately, facilitating the improvement of the accuracy of the display light emission of the multiple pixels and improving the overall display effect of the display panel.

It is to be understood that in the same one shift register unit, the clock signal CKA and the output control signal CKB are shifted successively, and the time periods of the valid pulses of the clock signal CKA and the output control signal CKB do not overlap so that when the clock signal CKA is at the valid level, the output control signal CKB can be at the invalid level, and when the output control signal CKB is at the valid level, the clock signal CKA can be at the invalid level. In this case, the clock signal CKA and the output control signal CKB may have the same clock cycle and may be two signals having opposite polarities at the same moment. In this way, a corresponding inverter may be disposed between a terminal for supplying the clock signal CKA and a terminal for supplying the output control signal CKB, without the requirement of disposing a corresponding timing circuit for supplying the clock signal CKA or the output control signal CKB, facilitating the simplification of the structure of the display panel and reducing the cost of the display panel.

Optionally, with continued reference to FIGS. 7 and 9, the valid pulse of the clock signal CKA and the valid pulse of the output control signal CKB each have a width equal to the width of the valid pulse of the gate drive signal G.

In an embodiment, when the valid pulse of the clock signal CKA and the valid pulse of the output control signal CKB each have a width equal to the width of the valid pulse of the gate drive signal, the width of the valid pulse of the gate drive signal G output by the each drive output terminal OUT of the each shift register unit 31 can be controlled by controlling the widths of the valid pulses of the clock signal CKA and the output control signal CKB that are supplied to the each shift register unit 31, that is, the value of k may be selected according to actual requirements, so that the widths of the valid pulses of the clock signal CKA and the output control signal CKB can be disposed according to the value of k, and so that the normal conduction time period of the rows of pixels can be greater than or equal to the driving time period Th of a row of pixels on the premise that the valid pulse of the gate drive signal G has a width greater than the driving time period Th of a row of pixels, thereby enabling the time period for writing signals to the rows of pixels to be greater than or equal to the driving time period Th of a row of pixels, ensuring the accuracy of the signals written into the rows of pixels, improving the accuracy of the display light emission of the multiple pixels and facilitating the improvement of the display effect of the display panel.

Optionally, the time period of the valid pulse of a clock signal received by the i-th shift register unit does not overlap the time period of the valid pulse of a clock signal received by the (i+n)-th shift register unit, and the time period of the valid pulse of an output control signal received by the i-th shift register unit does not overlap the time period of the valid pulse of an output control signal received by the (i+n)-th shift register unit.

In an embodiment, using n=2 as an example, with continued reference to FIG. 7, clock signals CKA received by the shift register units 31 can control the time periods of the valid pulses of shift signals Vnext output by the shift output terminals Next of the shift register units 31, so when the time period of the valid pulse of a clock signal cka1 received by the first shift register unit 311 does not overlap the time period of the valid pulse of a clock signal cka3 received by the third shift register unit 313, the valid pulse of a shift signal Vnext1 output by the first shift register unit 311 and the valid pulse of a shift signal Vnext3 output by the third shift register unit 313 can be shifted successively, and compared with the valid pulse of the shift signal Vnext1, the valid pulse of the shift signal Vnext3 can have a shift amount greater than or equal to the width of the valid pulse of a clock signal CKA (cka1 or cka3). Similarly, when the time period of the valid pulse of a clock signal cka2 received by the second shift register unit 312 does not overlap the time period of the valid pulse of a clock signal cka4 received by the fourth shift register unit 314, the valid pulse of a shift signal Vnext2 output by the second shift register unit 312 and the valid pulse of a shift signal Vnext4 output by the fourth shift register unit 314 can be shifted successively, and compared with the valid pulse of the shift signal Vnext2, the valid pulse of the shift signal Vnext4 can have a shift amount greater than or equal to the width of the valid pulse of a clock signal CKA (cka2 or cka4). In this way, the time periods of valid pulses of clock signals CKA received by two cascaded shift register units do not overlap so that valid pulses of shift signals Vnext output by the two cascaded shift register units can be ensured to be shifted successively and have a shift amount greater than or equal to the time period of the valid pulse of the clock signal CKA.

Accordingly, output control signals CKB received by the shift register units 31 can control the time periods of the valid pulses of the gate drive signals G output by the drive output terminals OUT of the shift register units 31, so when the time period of the valid pulse of an output control signal ckb1 received by the first shift register unit 311 does not overlap the time period of the valid pulse of an output control signal ckb2 received by the third shift register unit 313, the valid pulse of the gate drive signal G1 output by the first shift register unit 311 and the valid pulse of the gate drive signal G3 output by the third shift register unit 313 can be shifted successively, and compared with the valid pulse of the gate drive signal G1, the valid pulse of the gate drive signal G3 can have a shift amount greater than or equal to the width of the valid pulse of an output control signal CKB (ckb1 or ckb2). Similarly, when the time period of the valid pulse of an output control signal ckb2 received by the second shift register unit 312 does not overlap the time period of the valid pulse of an output control signal ckb4 received by the fourth shift register unit 314, the valid pulse of the gate drive signal G2 output by the second shift register unit 312 and the valid pulse of the gate drive signal G4 output by the fourth shift register unit 314 can be shifted successively, and compared with the valid pulse of the gate drive signal G2, the valid pulse of the gate drive signal G4 can have a shift amount greater than or equal to the width of the valid pulse of an output control signal CKB (ckb2 or ckb4). In this way, the time periods of valid pulses of output control signals CKB received by the two cascaded shift register units do not overlap so that valid pulses of gate drive signals G output by the two cascaded shift register units can be ensured to be shifted successively and have a shift amount greater than or equal to the time period of the valid pulse of the output control signal CKB. In this way, when the width of the valid pulse of the output control signal CKB is equal to the width of the valid pulse of the gate drive signal G, the valid pulses of the gate drive signals G output by the two cascaded shift register units have a shift amount greater than the width of the valid pulse of the gate drive signal G so that the valid pulses of the gate drive signals G output by the two cascaded shift register units cannot overlap, and the valid pulses of the gate drive signals G output by the two cascaded shift register units can be ensured to not affect each other, thereby facilitating the improvement of the accuracy of the gate drive signals G output by the shift register units.

Figure 10:
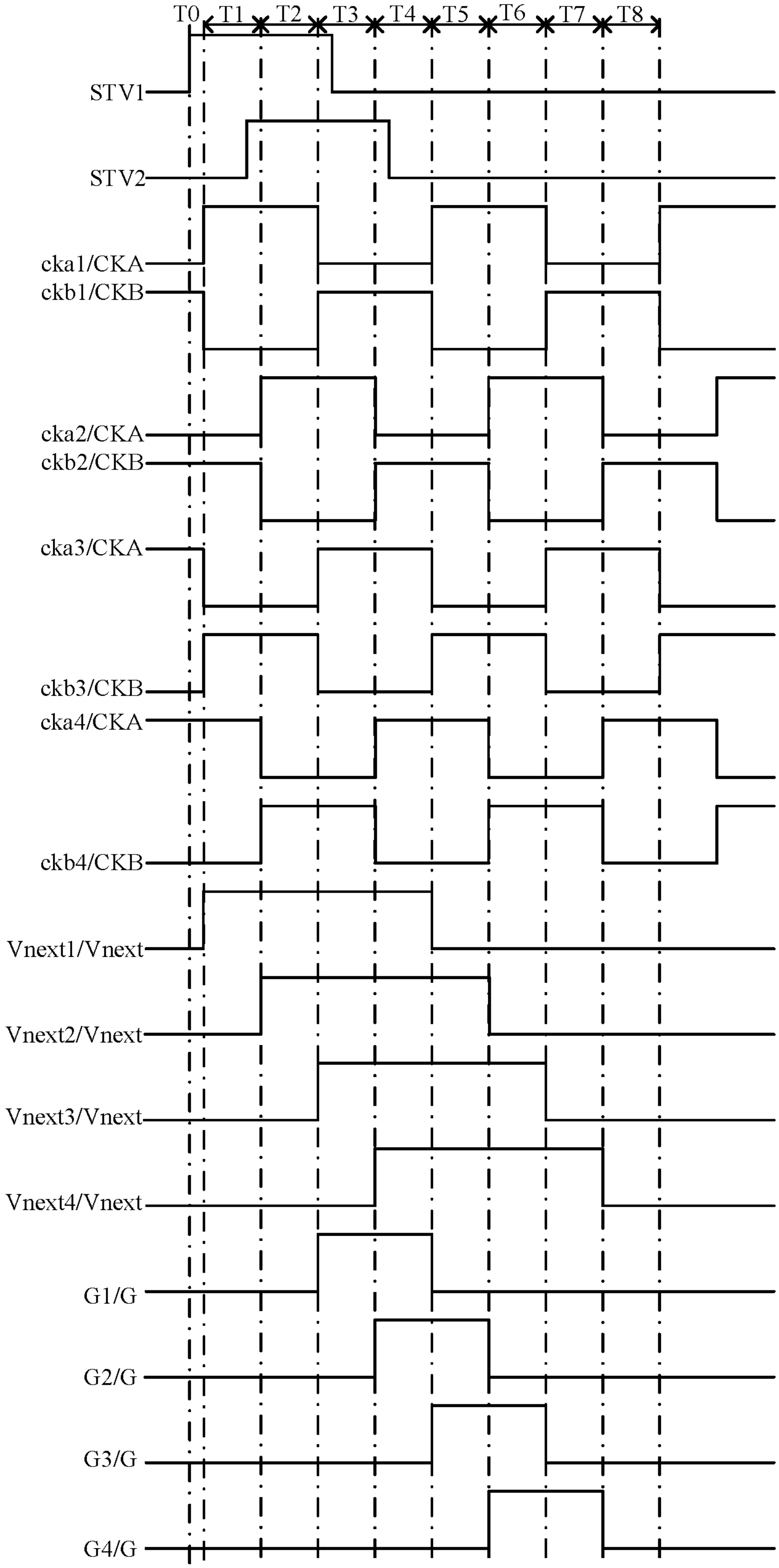
FIG. 10 is a drive timing diagram of a driver circuit according to an embodiment of the present application.

Exemplarily, using the structure of the each shift register unit as shown in FIG. 8 as an example, FIG. 10 is a drive timing diagram of a driver circuit according to an embodiment of the present application. In conjunction with FIGS. 6, 8 and 10, the driving process of the driver circuit is illustrated using an example of the operation process of the first four shift register units when n is equal to 2. The first input terminal IN1 of the first shift register unit 311 receives the start signal STV1, the first input terminal IN1 of the second shift register unit 312 receives the start signal STV2, and the valid level of the start signal STV1 and the valid pulse of the start signal STV2 are shifted successively. The shift output terminal Next of the first shift register unit 311 is electrically connected to the first input terminal IN1 of the third shift register unit 313, and the shift output terminal of the second shift register unit 312 is electrically connected to the first input terminal IN1 of the fourth shift register unit 314.

Before the time period T01, the start signal STV1 is at an invalid level so that a latch module 310A of the first shift register unit 311 can latch the invalid level of the start signal STV1; the shift output terminal Next of the first shift register unit 311 outputs the invalid level of the shift signal Vnext1, and the each drive output terminal OUT of the first shift register unit 311 outputs the invalid level of the gate drive signal G1 so that the third shift register unit 313 cascaded with the first shift register unit 311 can output the invalid level of the shift signal Vnext3 and the invalid level of the gate drive signal G3. Similarly, before the time period T01, the start signal STV2 is also at an invalid level so that a latch module 310A of the second shift register unit 312 can latch the invalid level of the start signal STV2; the shift output terminal Next of the second shift register unit 312 outputs the invalid level of the shift signal Vnext2, and the each drive output terminal OUT of the second shift register unit 312 outputs the invalid level of the gate drive signal G2 so that the fourth shift register unit 314 cascaded with the second shift register unit 312 can output the invalid level of the shift signal Vnext4 and the invalid level of the gate drive signal G4.

At the time T0, the start signal STV1 hops to be at a valid level, and the latch module 310A of the first shift register unit 311 latches the start signal STV1, but since the clock signal cka1 received by the clock signal terminal A of the first shift register unit 311 is at an invalid level at the time period, the shift signal Vnext1 output by the shift output terminal Next of the first shift register unit 311 can remain at an invalid level; and the start signal STV2 still remains at an invalid level so that the second shift register unit 312 can remain at the state before the moment T01.

In the stage T1, the start signal STV1 remains at the valid level, the clock signal cka1 received by the clock signal terminal A of the first shift register unit 311 hops to be at a valid level, the first shift register unit 311 starts to output the valid level of the shift signal Vnext1, and the valid level of the shift signal Vnext1 is supplied to each level conversion module 320A of the first shift register unit 311 and the first input terminal IN1 of the third shift register unit 313 separately; since the output control signal ckb1 received by the each output control terminal B of the first shift register unit 311 is at an invalid level at the time period, after the gate drive signal G1 output by the each level conversion module 320A of the first shift register unit 311 is supplied to a respective drive output terminal OUT after undergoing level conversion by a respective output module 330A, the respective drive output terminal OUT of the first shift register unit 311 outputs the invalid level of the gate drive signal G1 to the respective scan line 20 electrically connected to the first shift register unit 311; meanwhile, the third shift register unit 313 latches the valid level of the shift signal Vnext1 received by the first input terminal IN1 of the third shift register unit 313, but since the clock signal cka3 received by the clock signal terminal A of the third shift register unit 313 is at an invalid level, the shift signal Vnext3 output by the shift signal terminal Next of the third shift register unit 313 can remain at an infective level so that the each drive output terminal OUT of the third shift register unit 313 can output the invalid level of the gate drive signal G3; additionally, since at least one of the start signal STV2 or the clock signal cka2 that is received by the second shift register unit 312 is at an invalid level in the stage T1, the second shift register unit 312 can continue outputting the invalid level of the shift signal Vnext2 and the invalid level of the gate drive signal G2 so that the fourth shift register unit 314 cascaded with the second shift register unit 312 can also continue outputting the invalid level of the shift signal Vnext4 and the invalid level of the gate drive signal G4.

In the stage T2, the clock signal cka1 and the start signal STV1 that are received by the first shift register unit 311 continue remaining at the valid levels, and the output control signal ckb1 received by the first shift register unit 311 continues remaining at the invalid level so that the shift output terminal Next of the first shift register unit 311 can continue outputting the valid level of the shift signal Vnext1, and the each drive output terminal OUT of the first shift register unit 311 can continue outputting the invalid level of the gate drive signal G1; accordingly, the clock signal cka3 received by the clock signal terminal A of the third shift register unit 313 cascaded with the first shift register unit 311 continues remaining at the invalid level so that the third shift register unit 313 can continue outputting the invalid levels of the shift signal Vnext3 and the gate drive signal G3; meanwhile, in the stage T2, the start signal STV2 is at a valid level so that the latch module 310A of the second shift register unit 312 can start to latch the valid level of the start signal STV2, and since the clock signal cka2 received by the clock signal terminal A of the second shift register unit 312 is at a valid level at the time period, the second shift register unit 312 can start to output the valid level of the shift signal Vnext2, and the valid level of the shift signal Vnext2 is supplied to each level conversion module 320A of the second shift register unit 312 and the first input terminal IN1 of the fourth shift register unit 314 separately; however, since the output control signal ckb2 received by the each output control terminal B of the second shift register unit 312 is at an invalid level, after the gate drive signal G2 output by the each level conversion module 320A of the second shift register unit 312 is supplied to a respective drive output terminal OUT after undergoing polarity conversion by a respective output module 330A, and the respective drive output terminal OUT of the second shift register unit 312 can output the invalid level of the gate drive signal G2 to the respective scan line 20 electrically connected to the second shift register unit 312; the fourth shift register unit 314 latches the valid level of the shift signal Vnext2 received by the first input terminal IN1 of the fourth shift register unit 314, but since the clock signal cka4 received by the clock signal terminal A of the fourth shift register unit 314 is at an invalid level, the shift signal Vnext4 output by the shift signal terminal Next of the fourth shift register unit 314 can remain at an invalid level so that the each drive output terminal OUT of the fourth shift register unit 314 can output the invalid level of the gate drive signal G4.

In the stage T3, the clock signal cka1 received by the first shift register unit 311 hops to be at an invalid level, the output control signal ckb1 received by the first shift register unit 311 hops to be at a valid level, and the shift output terminal Next of the first shift register unit 311 continues outputting the valid level of the shift signal Vnext1 so that the each level conversion module 320A of the first shift register unit 311 can supply the low level of the gate drive signal G1 to the respective output module 330A of the first shift register unit 311 under the control of the valid level of the shift signal Vnext1 and the valid level of the output control signal ckb1, and the low-level gate drive signal G1 is output by the respective drive output terminal OUT after undergoing polarity conversion by the respective output module 330A so that the respective scan line 20 electrically connected to the first shift register unit 311 can transmit the valid level of the gate drive signal G1 to the gates of the switch transistors in the first row of pixels to charge the gates of the switch transistors in the first row of pixels; the start signal STV2 and the clock signal cka2 that are received by the second shift register unit 312 are at valid levels so that the second shift register unit 312 can continue outputting the valid level of the shift signal Vnext2, but since the output control signal ckb2 of the each output control terminal B of the second shift register unit 312 is still at the invalid level, the second shift register unit 312 can continue outputting the invalid level of the gate drive signal G2; accordingly, since the clock signal cka3 of the third shift register unit 313 hops to be at the valid level, the third shift register unit 313 can start to output the valid level of the shift signal Vnext3, and the output control signal ckb3 of the third shift register unit 313 is at the invalid level at this time period so that the each drive output terminal OUT of the third shift register unit 313 can continue outputting the invalid level of the gate drive signal G3; meanwhile, under the control of the invalid level of the clock signal cka4 received by the fourth shift register unit 314, the fourth shift register unit 314 continues outputting the invalid level of the shift signal Vnext4 so that the each drive output terminal OUT of the fourth shift register unit 314 can continue outputting the invalid level of the gate drive signal G4.

In the time period T4, the clock signal cka1 received by the first shift register unit 311 continues remaining at the invalid level, the output control signal ckb1 received by the first shift register unit 311 continues remaining at the valid level, and the shift output terminal Next of the first shift register unit 311 continues outputting the valid level of the shift signal Vnext1 so that the each level conversion module 320A of the first shift register unit 311 can continue supplying the valid level of the gate drive signal G1 to the respective scan line 20 electrically connected to the respective drive output terminal OUT of the first shift register unit 311, and so that the gates of the switch transistors in the first row of pixels electrically connected to the respective scan line 20 can continue being charged to enable the gates of the switch transistors in the first row of pixels to be charged until the normal conduction condition is satisfied, thereby enabling a respective signal to be accurately written into the first row of pixels through the switch transistors; the clock signal cka2 received by the second shift register unit 312 hops to be at the invalid level, and the output control signal ckb2 received by the second shift register unit 312 hops to be at the valid level so that the second shift register unit 312 can start to output the valid level of the gate drive signal G2 while continuing outputting the valid level of the shift signal Vnext2, and the valid level of the gate drive signal G2 can be transmitted to the gates of the switch transistors in the second row of pixels through the respective scan line to charge the gates of the switch transistors in the second row of pixels; the clock signal cka3 received by the clock signal terminal A of the third shift register unit 313 continues remaining at the valid level, and the output control signal ckb3 of the each output control terminal B of the third shift register unit 313 continues remaining at the invalid level so that the third shift register unit 313 can continue outputting the valid level of the shift signal Vnext3 and the invalid level of the gate drive signal G3; meanwhile, since the clock signal cka4 received by the clock signal terminal A of the fourth shift register unit 314 hops to be at the valid level, the shift signal terminal Next of the fourth shift register unit 314 can start to output the valid level of the shift signal Vnext4, but since the output control signal ckb4 of the each output control terminal B of the fourth shift register unit 314 is at the invalid level, the each drive output terminal OUT of the fourth shift register unit 314 can continue outputting the invalid level of the gate drive signal G4.

In the time period T5, the clock signal cka1 received by the first shift register unit 311 hops to be at the valid level, and the output control signal ckb1 received by the first shift register unit 311 hops to be at the invalid level so that the shift output terminal Next of the first shift register unit 311 can start to output the invalid level of the shift signal Vnext1, and meanwhile, the each drive output terminal OUT of the first shift register unit 311 starts to output the invalid level of the gate drive signal G1 to the respective scan line 20 to control the switch transistors electrically connected to the respective scan line 20 to be in an off state, and the writing of the respective signal into the first row of pixels electrically connected to the respective scan line 20 is stopped so that the signal in the first row of pixels can remain as the signal written in the previous stage; at this time period, the clock signal cka2 received by the second shift register unit 312 continues remaining at the invalid level, and the output control signal ckb2 received by the second shift register unit 312 continues remaining at the valid level so that the second shift register unit 312 can continue outputting the valid levels of the shift signal Vnext2 and the gate drive signal G2, and the valid level of the gate drive signal G2 can continue charging the gates of the switch transistors in the second row of pixels so that the gates of the switch transistors in the second row of pixels can be charged until the normal conduction condition is satisfied, and so that a respective signal can be written into the second row of pixels through the switch transistors in the second row of pixels; accordingly, the clock signal cka3 received by the clock signal terminal A of the third shift register unit 313 hops to be at the invalid level, and the output control signal ckb3 of the each output control terminal B of the third shift register unit 313 hops to be at the valid level so that the each output control terminal of the third shift register unit 313 can start to output the valid level of the gate drive signal G3 while the third shift register unit 313 continues outputting the valid level of the shift signal Vnext3, and the valid level of the gate drive signal G3 can be transmitted to the gates of the switch transistors in the third row of pixels through the respective scan line 20 to charge the gates of the switch transistors in the third row of pixels; additionally, the clock signal cka4 of the clock signal terminal A of the fourth shift register unit 314 continues remaining at the valid level, and the output control signal ckb4 of the each output control terminal B of the fourth shift register unit 314 continues remaining at the invalid level so that the fourth shift register unit 314 can continue outputting the valid level of the shift signal Vnext4 and the invalid level of the gate drive signal G4.

In the time period T6, the clock signal cka1 received by the first shift register unit 311 continues remaining at the valid level, and the output control signal ckb1 received by the first shift register unit 311 continues remaining at the invalid level so that the first shift register unit 311 can continue outputting the invalid levels of the shift signal Vnext1 and the gate drive signal G1; meanwhile, the clock signal cka2 of the second shift register unit 312 hops to be at the valid level, and the output control signal ckb2 of the second shift register unit 312 hops to be at the invalid level so that the second shift register unit 312 can start to output the invalid levels of the shift signal Vnext2 and the gate drive signal G2, and the invalid level of the gate drive signal G2 can charge the gates of the switch transistors in the second row of pixels to control the switch transistors in the second row of pixels to be in an off state, and the writing of the respective signal into the second row of pixels is stopped so that the signal in the second row of pixels can remain as the signal written in the previous stage; at this time period, the clock signal cka3 of the third shift register unit 313 continues remaining at the invalid level, and the output control signal ckb3 of the third shift register unit 313 continues remaining at the valid level so that the third shift register unit 313 can continue outputting the valid levels of the shift signal Vnext3 and the gate drive signal G3, and so that the valid level of the gate drive signal G3 can continue charging the gates of the switch transistors in the third row of pixels to enable the switch transistors in the third row of pixels to be in a normal on state and the respective signal to be accurately written into the third row of pixels through the turned-on switch transistors; additionally, the clock signal cka4 of the fourth shift register unit 314 hops to be at the invalid level, and the output control signal ckb4 of the fourth shift register unit 314 hops to be at the valid level so that the each drive output terminal OUT of the fourth shift register unit 314 can start to output the valid level of the gate drive signal G4 while the fourth shift register unit 314 continues outputting the valid level of the shift signal Vnext4, and the valid level of the gate drive signal G4 can be transmitted to the gates of the switch transistors in the fourth row of pixels through the respective scan line 20 to charge the gates of the switch transistors in the fourth row of pixels.

In the time period T7, since the start signals STV1 and STV2 continue remaining at the invalid levels, the first shift register unit 311 continues outputting the invalid levels of the shift signal Vnext1 and the gate drive signal G1, and the second shift register unit 312 also outputs the invalid levels of the shift signal Vnext2 and the gate drive signal G2; the clock signal cka3 received by the third shift register unit 313 hops to be at the valid level, and the output control signal ckb3 received by the third shift register unit 313 hops to be at the invalid level so that the third shift register unit 313 can start to output the invalid levels of the shift signal Vnext3 and the gate drive signal G3, and the invalid level of the gate drive signal G3 can be transmitted to the switch transistors in the third row of pixels through the respective scan line 20 to enable the switch transistors in the third row of pixels to be in an off state, and the writing of the respective signal into the third row of pixels is stopped so that the signal in the third row of pixels can remain as the signal written in the previous stage; at this time period, the clock signal cka4 of the fourth shift register unit 314 continues remaining at the invalid level, and the output control signal ckb4 of the fourth shift register unit 314 continues remaining at the valid level so that the fourth shift register unit 314 can continue outputting the valid levels of the shift signal Vnext4 and the gate drive signal G4, and the valid level of the gate drive signal G4 can continue charging the gates of the switch transistors in the fourth row of pixels so that the switch transistors in the fourth row of pixels can be in a normal on state to enable a respective signal to be accurately written into the fourth row of pixels through the turned-on switch transistors.

In the stage T8, the shift signal Vnext1 and the gate drive signal G1 that are output by the first shift register unit 311, the shift signal Vnext2 and the gate drive signal G2 that are output by the second shift register unit 312, and the shift signal Vnext3 and the gate drive signal G3 that are output by the third shift register unit 313 continue remaining at the invalid levels; at this time period, the clock signal cka4 of the fourth shift register unit 314 hops to be at the valid level so that the fourth shift register unit 314 can start to output the invalid level of the shift signal Vnext4, and meanwhile, the output control signal ckb4 of the fourth shift register unit 314 hops to be at the invalid level so that the fourth shift register unit 314 can start to output the invalid level of the gate drive signal G4, and the invalid level of the gate drive signal G4 is transmitted to the gates of the switch transistors in the fourth row of pixels through the respective scan line 20 to enable the switch transistors in the fourth row of pixels to be in an off state, and the writing of the respective signal into the fourth row of pixels is stopped so that the signal in the fourth row of pixels can remain as the signal written in the previous stage.

In this way, the shift signals Vnext output by the shift register units 31 are shifted successively, and the shift signals Vnext output by the two cascaded shift register units 31 have a shift amount equal to the widths of the valid pulses of the clock signals CKA received by the two cascaded shift register units 31; meanwhile, the gate drive signals G output by the shift register units 31 can also be shifted successively, and the valid pulses of the gate drive signals G output by the two cascaded shift register units 31 do not overlap. Consequently, on the premise that the switch transistors in the rows of pixels are ensured to be turned on normally, the accuracy of the signals written into the rows of pixels can also be ensured so that the accuracy of the display light emission of the rows of pixels can be improved, thereby improving the display effect of the display panel.

It is to be understood that, as shown in FIG. 10, the clock signal cka1 of the first shift register unit may be the same as the output control signal ckb3 of the third shift register unit, and the output control signal ckb1 of the first shift register unit may be the same as the clock signal cka3 of the third shift register unit so that the clock signal cka1 of the first shift register unit can also serve as the output control signal ckb3 of the third shift register unit, and the output control signal ckb1 of the first shift register unit can also serve as the clock signal cka3 of the third shift register unit; similarly, the clock signal cka2 of the second shift register unit may be the same as the output control signal ckb4 of the fourth shift register unit, and the output control signal ckb2 of the second shift register unit may be the same as the clock signal cka4 of the fourth shift register unit so that the clock signal cka2 of the second shift register unit can also serve as the output control signal ckb4 of the fourth shift register unit, and the output control signal ckb2 of the second shift register unit can also serve as the clock signal cka4 of the fourth shift register unit. In this case, as shown in FIGS. 11 and 12, every four shift register units 31 of the driver circuit 30 are controlled by four control signals CK1, CK2, CK3 and CK4 respectively so that the shift signals Vnext and the gate drive signals G can be shifted successively, thereby reducing the number of control signals supplied to the driver circuit and the number of signal lines for transmitting the control signals, simplifying the structure of the display panel and facilitating the narrow bezel of the display panel.

Figure 11:
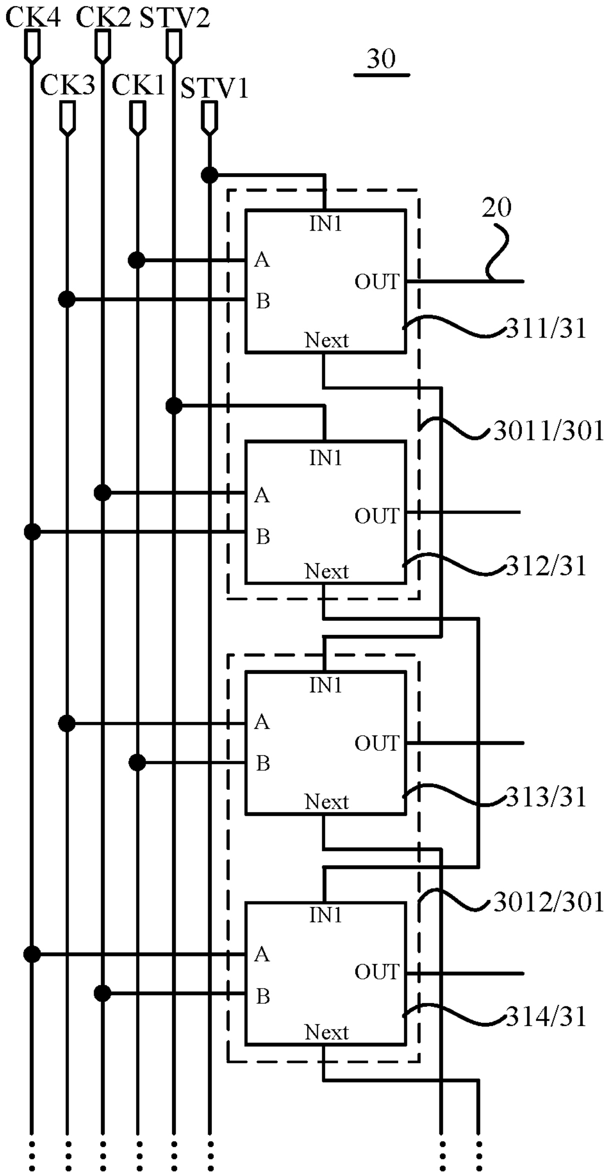
FIG. 11 is a diagram illustrating the structure of another driver circuit according to an embodiment of the present application.
Figure 12:
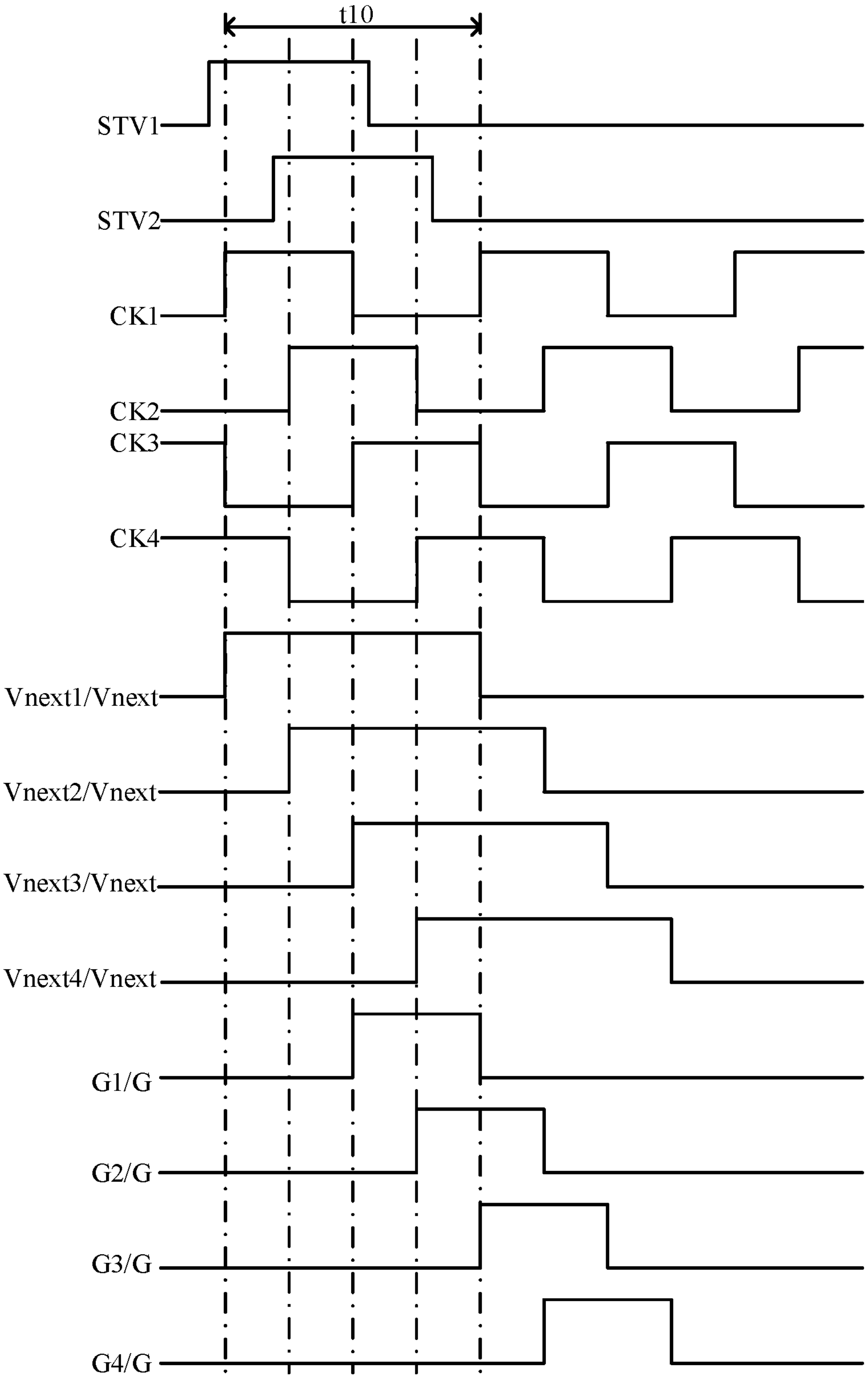
FIG. 12 is a drive timing diagram of another driver circuit according to an embodiment of the present application.

Optionally, with continued reference to FIGS. 11 and 12, the multiple shift register units constitutes multiple shift register unit groups 301; each shift register unit group 301 includes n shift register units 31 that are unconnected and adjacent; in the same one shift register unit group 301, the time periods of valid pulses of clock signals CKA received by n shift register units 31 are shifted successively; and in the same one shift register unit group 301, the time periods of valid pulses of output control signals CKB received by the n shift register units 31 are shifted successively.

In an embodiment, since the clock signals CKA of the n shift register units 31 can control the time periods of valid pulses of shift signals Vnext output by shift output terminals Next of the n shift register units 31, and the output control signals CKB of the n shift register units 31 can control the time periods of valid pulses of gate drive signals G output by drive output terminals OUT of the n shift register units 31, the clock signals CKA received by the n shift register units 31 in the same one shift register unit group 301 are shifted successively so that the shift signals Vnext output by the n shift register units 31 in the same one shift register unit group 301 can be shifted successively, and the output control signals CKB received by the n shift register units 31 in the same one shift register unit group 301 are shifted successively so that the gate drive signals G output by the n shift register units 31 in the same one shift register unit group 301 can be shifted successively. Consequently, when the gate drive signals G output by the shift register units 31 are transmitted to the gates of the switch transistors in the rows of pixels through the multiple scan lines 20 respectively, the rows of pixels can be scanned row by row so that the switch transistors in the rows of pixels can be turned on row by row, data signals transmitted by the multiple data lines can be written into the rows of pixels in a time-sharing manner, the accuracy of the data signals written into the rows of pixels can be ensured, and the display effect of the display panel can be improved.

In an optional embodiment, in two adjacent shift register unit groups 301, n shift register units 31 in the previous shift register unit group are cascaded with n shift register units 31 in the next shift register unit group respectively, for example, the first shift register unit 311 in the shift register unit group 3011 is cascaded with the third shift register unit 313 in the shift register unit group 3012, and the second shift register unit 312 in the shift register unit group 3011 is cascaded with the fourth shift register unit 314 in the shift register unit group 3012. In this case, clock signals CKA received by the shift register units 31 in the two adjacent shift register unit groups 301 are shifted successively, for example, the control signal CK1 may also serve as the clock signal CKA of the first shift register unit 311, the control signal CK2 may also serve as the cock signal CKA of the second shift register unit 312, the control signal CK3 may also serve as the clock signal CKA of the third shift register unit 313, and the control signal CK4 may also serve as the clock signal CKA of the fourth shift register unit 314, and the control signals CK1, CK2, CK3 and CK4 are shifted successively within one clock cycle t10. Similarly, output control signals CKB received by the 2*n* shift register units 31 in the two adjacent shift register unit groups 301 are also shifted successively, for example, the control signal CK3 may also serve as the output control signal CKB of the first shift register unit 311, the control signal CK4 may also serve as the output control signal CKB of the second shift register unit 312, the control signal CK1 may also serve as the output control signal CKB of the third shift register unit 313, and the control signal CK2 may also serve as the output control signal CKB of the fourth shift register unit 314.

Optionally, with continued reference to FIGS. 11 and 12, when the each shift register unit 31 includes one drive output terminal OUT, valid pulses of gate drive signals G output by the any two adjacent shift register units 31 have an overlapping time period denoted as k*Th. In this case, the valid pulses of the gate drive signals G output by the any two adjacent shift register units 31 have a shift amount denoted as Th.

In an embodiment, the gate drive signals G output by the two adjacent shift register units 31 control switch transistors in two adjacent two rows of pixels to turn on or off respectively, for example, the i-th shift register unit 31*i* can control switch transistors in the i-th row of pixels to turn on or off, and the (i+1)-th shift register unit 31(*i*+1) can control switch transistors in the (i+1)-th row of pixels to turn on or off. In this case, in the period of the valid pulse of the gate drive signal Gi output by the i-th shift register unit 31*i*, the (i+1)-th shift register unit 31(*i*+1) also outputs the valid pulse of the gate drive signal G(i+1), and the time period for the i-th shift register unit 31*i* and the (i+1)-th shift register unit 31(*i*+1) to output the gate drive signals G (Gi and G(i+1)) simultaneously is denoted as k*Th. In this time period, the gate drive signal Gi output by the i-th shift register unit 31*i* can control the switch transistors in the i-th row of pixels to be in a normal on state to write data signals and other signals of the i-th row of pixels into the i-th row of pixels in a one-to-one correspondence, and the gate drive signal G(i+1) output by the (i+1)-th shift register unit 31(*i*+1) can pre-charge the gates of the switch transistors in the (i+1)-th row of pixels so that the switch transistors in the (i+1)-th row of pixels can tend to be in an on state. Meanwhile, when the gate drive signal Gi output by the i-th shift register unit 31*i* hops to be at the invalid level, the gate drive signal G(i+1) of the (i+1)-th shift register unit 31(*i*+1) can continue remaining at the valid level, and the hold time period of the valid level is denoted as Th. Since the switch transistors in the (i+1)-th row of pixels have tended to be in an on state, the valid level of the gate drive signal G(i+1) can continue being supplied to the gates of the switch transistors in the (i+1)-th row of pixels so that the switch transistors in the (i+1)-th row of pixels can turn to be in an on state quickly. In this case, data signals and other signals can be supplied to the (i+1)-th row of pixels so that the data signal can be written into the (i+1)-th row of pixels, ensuring that the time period for writing the data signal can tend to remain consistent with the driving time period Th of a row of pixels. In this way, the valid pulses of the gate drive signals G output by the two adjacent shift register units 31 have an overlapping time period equal to k*Th so that the valid pulses of the gate drive signals G output by the two adjacent shift register units 31 can have a shift amount denoted as Th. Consequently, the time period for writing data signals and other signals into the rows of pixels can be sufficiently long so that the accuracy of the data signals and other signals that are written into the rows of pixels can be ensured, thereby improving the accuracy of the display light emission of the rows of pixels and facilitating the improvement of the display effect of the display panel.

Optionally, with continued reference to FIGS. 11 and 12, on the premise that the gate drive signals output by the n shift register units 31 in the same one shift register unit group 301 are shifted successively and that the valid pulses of the gate drive signals G output by the n shift register units 31 in the same one shift register unit group 301 each have a shift amount denoted as Th, the time periods of the valid pulses of the gate drive signals G output by the n shift register units 31 in the same one shift register unit group 301 can overlap. In this case, the time periods of the valid pulses of the gate drive signals G output by the n shift register units 31 in the same one shift register unit group 301 may be each denoted as n*Th. In this way, on the premise that the accuracy of the gate drive signals G output by the shift register units 31 is ensured, the valid pulses of the gate drive signals G output by the shift register units 31 can each have a sufficiently long time period. Consequently, when the gate drive signals G output by the shift register units 31 are used for controlling the switch transistors in the rows of pixels to turn on or off, the switch transistors in the rows of pixels can have a sufficiently long conduction time period so that the respective signals can be written into the rows of pixels accurately.

Optionally, with continued reference to FIGS. 11 and 12, in the same one shift register unit group 301, the time periods of the valid pulses of the output control signals CKB received by the n shift register units 31 overlap.

The output control signals CKB received by the n shift register units 31 are used for controlling the time periods of the valid pulses of the gate drive signals G output by the drive output terminals OUT of the n shift register units 31, and in the same one shift register unit 31, the time period of the valid pulse of the output control signal CKB generally overlaps the time period of the valid pulse of the gate drive signal G, so when the time periods of the valid pulses of the output control signals CKB of the n shift register units 31 in the same one shift register unit group 301 overlap, the time periods of the valid pulses of the gate drive signals G output by the n shift register units 31 in the same one shift register unit group 301 can overlap so that the sufficient lengths of the time periods of the valid pulses of the gate drive signals G output by the n shift register units 31 can be ensured, and so that the gates of the switch transistors in the rows of pixels can have a sufficiently long charging time period, ensuring that data signals in the rows of pixels can be written into respective nodes accurately through respective switch transistors. Consequently, when the rows of pixels display light emission according to the written data signals, the accuracy of the display light emission of the rows of pixels can be improved, thereby facilitating the improvement of the display effect of the display panel.

Optionally, the clock signal supplied to the i-th shift register unit also serves as a clock signal supplied to the (i+2*n)-th shift register unit; and the output control signal supplied to the i-th shift register unit also serves as an output control signal supplied to the (i+2*n)-th shift register unit.

Figure 13:
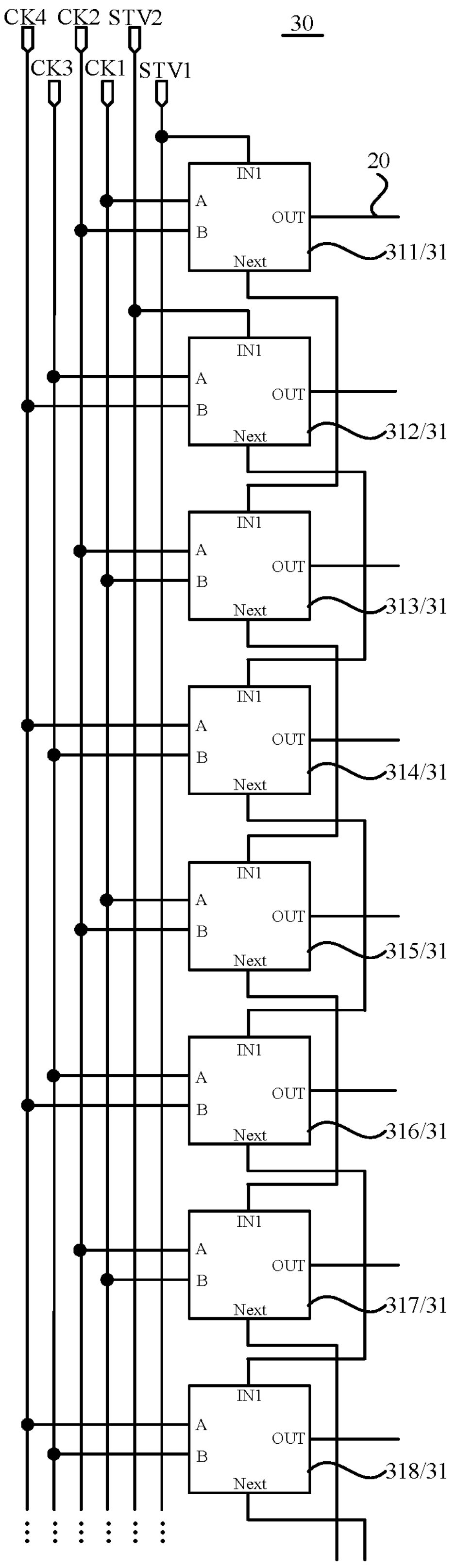
FIG. 13 is a diagram illustrating the structure of yet another driver circuit according to an embodiment of the present application.

Exemplarily, using n=2 as an example, FIG. 13 is a diagram illustrating the structure of yet another driver circuit according to an embodiment of the present application. As shown in FIG. 13, the clock signal CK1 of the first shift register unit 311 may also serve as a clock signal of the fifth shift register unit 315, the clock signal CK2 of the second shift register unit 312 may also serve as a clock signal of the sixth shift register unit 316, the clock signal CK3 of the third shift register unit 313 may also serve as a clock signal of the seventh shift register unit 317, and the clock signal CK4 of the fourth shift register unit 314 may also serve as a clock signal of the eighth shift register unit 318. In this way, on the premise that the shift signals Vnext output by the shift register units 31 are ensured to be shifted successively, the number of clock signals supplied to the driver circuit can be reduced so that the number of signal lines for transmitting the clock signals can be reduced, thereby facilitating the reduction in the size of a non-display region and the narrow bezel of the display panel.

Accordingly, the output control signal CK3 of the first shift register unit 311 may also serve as an output control signal of the fifth shift register unit 315, the output control signal CK4 of the second shift register unit 312 may also serve as an output control signal of the sixth shift register unit 316, the output control signal CK1 of the third shift register unit 313 may also serve as an output control signal of the seventh shift register unit 317, and the output control signal CK2 of the fourth shift register unit 314 may also serve as an output control signal of the eighth shift register unit 318. In this way, on the premise that the gate drive signals G output by the shift register units 31 are ensured to be shifted successively, the number of output control signals supplied to the driver circuit can be reduced so that the number of signal lines for transmitting the output control signals can be reduced, thereby facilitating the reduction in the size of the non-display region and the narrow bezel of the display panel.

It is to be noted that the embodiment of the present application is illustrated using the preceding example in which the each shift register unit includes the latch module, the at least one level conversion module, the at least one output module and the reset module, and the structure of the each shift register unit in the embodiments of the present application is not limited herein.

Figure 14:
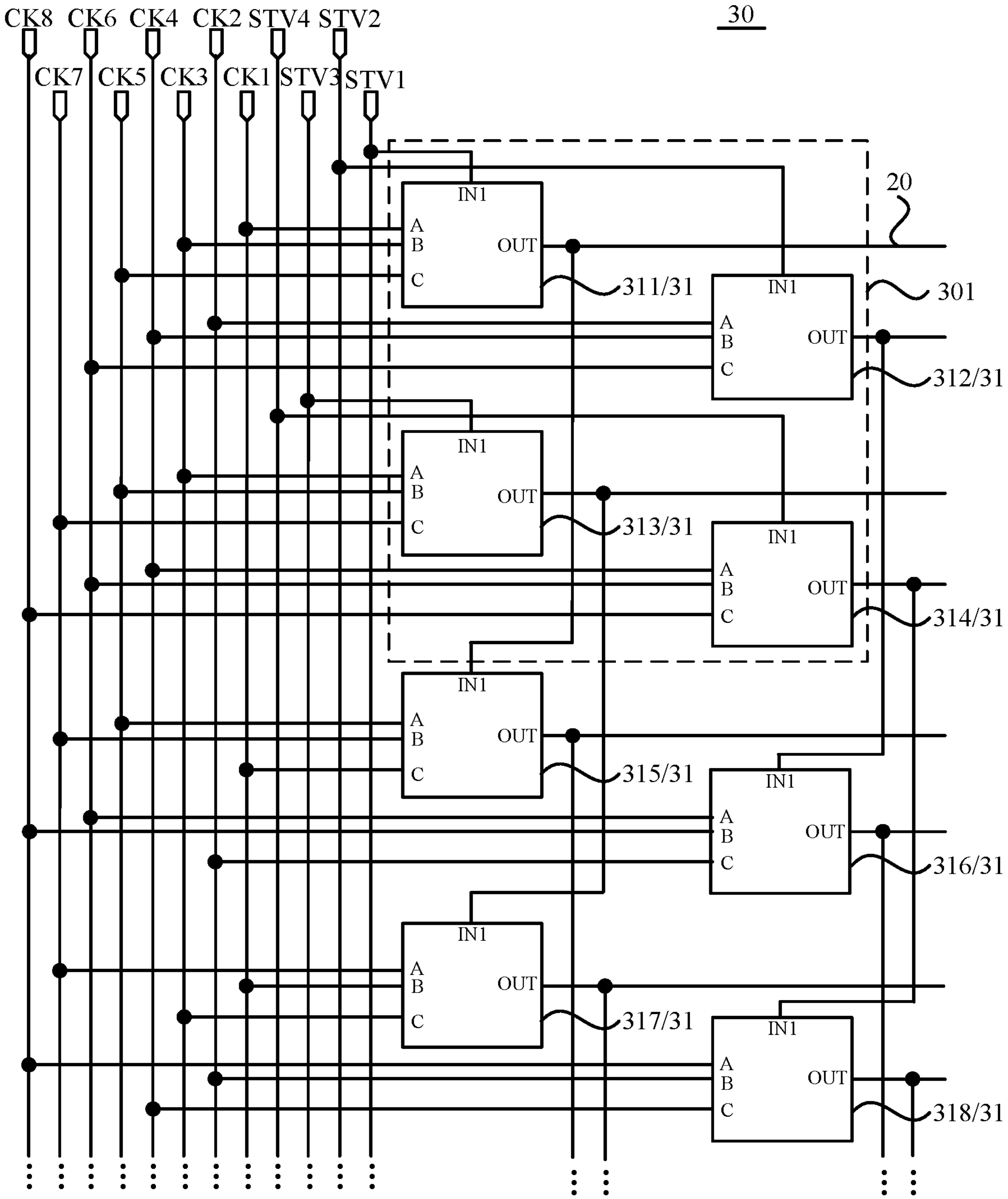
FIG. 14 is a diagram illustrating the structure of yet another driver circuit according to an embodiment of the present application.

In an optional embodiment, FIG. 14 is a diagram illustrating the structure of yet another driver circuit according to an embodiment of the present application. As shown in FIG. 14, in the same one shift register unit, each drive output terminal OUT may also serve as the shift output terminal. In this case, in the two cascaded shift register units, each drive output terminal OUT of the i-th shift register unit 31*i* may be electrically connected to a respective scan line 20 and a first input terminal IN1 of the (i+n)-th shift register unit 31(*i*+n) so that the gate drive signal Gi output by the each drive output terminal OUT of the i-th shift register unit 31*i* can also serve as the first input signal Vin1(*i*+n) of the (i+n)-th shift register unit 31(*i*+n). In this way, the each drive output terminal OUT also serves as the shift output terminal so that the number of ports disposed in the each shift register unit 31 can be reduced, thereby facilitating the simplification of the structure of the each shift register unit, reducing the size of the each shift register unit, reducing the overall size of the driver circuit and facilitating the narrow bezel of the display panel.

Exemplarily, as shown in FIG. 14, using n=4 as an example, first input terminals IN1 of the first shift register unit 311, the second shift register unit 312, the third shift register unit 313 and the fourth shift register unit 314 receive start signals STV1, STV2, STV3 and STV1 respectively, and valid pulses of the start signals STV1, STV2, STV3 and STV1 are shifted successively. While being electrically connected to the gates of the switch transistors in the first row of pixels through the respective scan line 20, the each drive output terminal OUT of the first shift register unit 311 is further electrically connected to a first input terminal IN1 of the fifth shift register unit 315. While being electrically connected to the gates of the switch transistors in the second row of pixels through the respective scan line 20, the each drive output terminal OUT of the second shift register unit 312 is further electrically connected to a first input terminal IN1 of the sixth shift register unit 316. While being electrically connected to the gates of the switch transistors in the third row of pixels through the respective scan line 20, the each drive output terminal OUT of the third shift register unit 313 is further electrically connected to a first input terminal IN1 of the seventh shift register unit 317. While being electrically connected to the gates of the switch transistors in the fourth row of pixels through the respective scan line 20, the each drive output terminal OUT of the fourth shift register unit 314 is further electrically connected to a first input terminal IN1 of the eighth shift register unit 318. In this way, the first shift register unit 311, the second shift register unit 312, the third shift register unit 313 and the fourth shift register unit 314 can successively output the valid pulses of gate drive signals under the control of the start signals STV1, STV2, STV3 and STV1 respectively. The fifth shift register unit 315, the sixth shift register unit 316, the seventh shift register unit 317 and the eighth shift register unit 318 successively output the valid pulses of gate drive signals under the control of the gate drive signal output by the first shift register unit 311, the gate drive signal output by the second shift register unit 312, the gate drive signal output by the third shift register unit 313 and the gate drive signal output by the fourth shift register unit 314 respectively.

Figure 15:
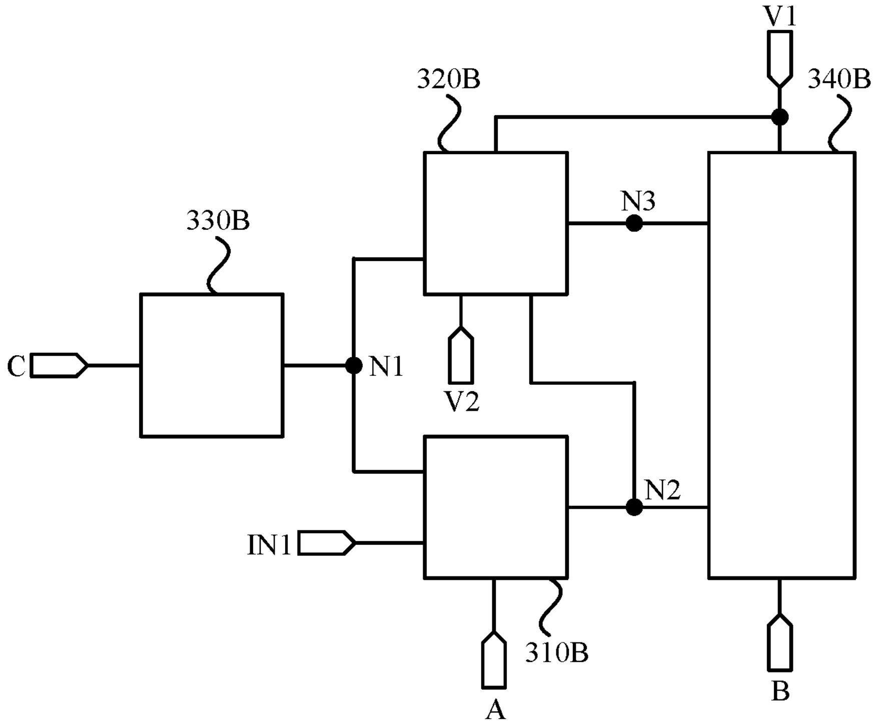
FIG. 15 is a diagram illustrating the structure of yet another shift register unit according to an embodiment of the present application.

Optionally, FIG. 15 is a diagram illustrating the structure of yet another shift register unit according to an embodiment of the present application. As shown in FIG. 15, when the each drive output terminal OUT also serves as the shift output terminal in the same one shift register unit 31, the each shift register unit 31 may further include a first reset terminal C, a first voltage terminal V1, a second voltage terminal V2, a first control module 310B, a second control module 320B, a reset module 330B and at least one output module 340B corresponding to the at least one drive output terminal OUT in a one-to-one correspondence.

The reset module 330B is electrically connected to the first reset terminal C, the first control module 310B and the second control module 320B and is electrically connected to the first control module 310B and the second control module 320B at a first node N1. The reset module 330B is configured to control a signal of the first node N1 in response to a first reset signal CKC of the first reset terminal C. The first reset signal CKC may be a pulse signal including a high level and a low level. The valid level of the first reset signal CKC may be the first reset signal CKC at the high level or the low level. In this way, when the first reset signal CKC is at a valid level, the reset module 330B may control the signal of the first node N1 to be at a valid level, and when the first reset signal CKC is at an invalid level, the reset module 330B may control the signal of the first node N1 to be at an invalid level.

Figure 16:
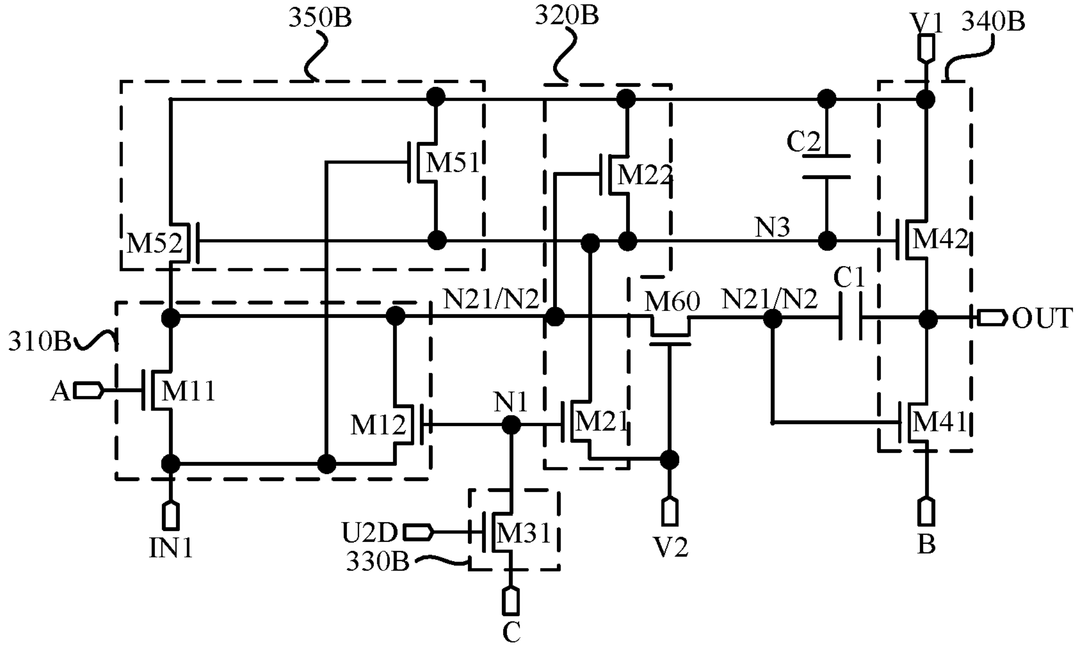
FIG. 16 is a diagram illustrating the circuit structure of another shift register unit according to an embodiment of the present application.

In an exemplary embodiment, FIG. 16 is a diagram illustrating the circuit structure of another shift register unit according to an embodiment of the present application. As shown in FIG. 16, the reset module 330B may include a first reset transistor M31. A gate of the first reset module M31 may receive a scan control signal U2D. The scan control signal U2D is at a continuous valid level when the driver circuit operates normally so that the scan control signal U2D can control the first reset transistor M31 to be in a continuous on state. A first electrode of the first reset transistor M31 is electrically connected to the first reset terminal C, and a second electrode of the first reset transistor M31 is electrically connected to the first node N1. In this way, the first reset signal CKC can be transmitted to the first node N1 through the turned-on first reset transistor M31 so that the signal of the first node N1 can remain consistent with the first reset signal CKC. The first reset transistor M31 may be an n-type transistor or a p-type transistor. This may be disposed according to actual requirements and is not specifically limited in the embodiments of the present application.

With continued reference to FIG. 15, the first control module 310B is electrically connected to the first input terminal IN1, the clock signal terminal A and the output module 340B and is electrically connected to the output module 340B at a second node N2. The first control module 310B is configured to control a signal of the second node N2 in response to the first input signal Vin1 of the first input terminal IN1, the clock signal CKA of the clock signal terminal A and the signal of the first node N1. The first input signal Vin1 of the first input terminal IN1 is a gate drive signal output by a shift register unit cascaded with the current shift register unit. The clock signal CKA and the signal of the first node N1 can control a transmission path in which the first control module 310B transmits the first input signal Vin1 to the second node N2 so that when the first input signal Vin1 is at a valid level, under the control of the clock signal CKA, the first control module 310B can transmit the first input signal Vin1 to the second node N2, and so that the second node N2 can be at the valid level that remains consistent with the first input signal Vin1. When the signal at the second node N2 needs to be reset to enable the signal at the second node N2 to hop to be at an invalid level, the signal at the first node N1 may control the first control module 310B to transmit the invalid level of the first input signal Vin1 to the second node N2 to reset the second node N2.

In an exemplary embodiment, with continued reference to FIG. 16, the first control module 310B may include a first control transistor M11 and a second control transistor M12. A gate of the first control transistor M11 may be electrically connected to the clock signal terminal A. A gate of the second control transistor M12 may be electrically connected to the first node N1. A first electrode of the first control transistor M11 and a first electrode of the second control transistor M12 are electrically connected to the first input terminal IN1. A second electrode of the first control transistor M11 and a second electrode of the second control transistor M12 are electrically connected to the second node N2. In this case, the clock signal CKA of the clock signal terminal A can control the first control transistor M11 to turn on or off so that when the clock signal CKA controls the first control transistor M11 to turn on, the first control transistor M11 can transmit the first input signal Vin1 of the first input terminal IN1 to the second node N2, and so that the signal of the second node N2 can remain consistent with the first input signal Vin1; the signal of the first node N1 can control the second control transistor M12 to turn on or off so that when the signal of the first node N1 controls the second control transistor M12 to turn on, the second control transistor M12 can transmit the first input signal Vin1 to the second node N2, and so that the signal of the second node N2 can also remain consistent with the first input signal Vin1. In this way, to enable the signal of the second node N2 to hop between being at the valid level and being at the invalid level, the first control transistor M11 and the second control transistor M12 may be turned on in a time-sharing manner, that is, when the first input signal Vin1 is at the valid level, the clock signal CKA may also be at the valid level. In the period when the first input signal Vin1 is at the invalid level, the signal of the first node N1 may be controlled to be at the valid level so that the clock signal CKA can control the valid level of the first input signal Vin1 to write into the second node N2, and the signal of the first node N1 can control the invalid level of the first input signal Vin1 to write into the second node N2. Since the signal of the first node N1 remains consistent with the first reset signal CKC, the first reset signal CKC can control the invalid level of the first input signal Vin1 to write into the second node N2. The first control transistor M11 and the second control transistor M12 may be n-type transistors or p-type transistors. This may be disposed according to actual requirements and is not specifically limited in the embodiments of the present application.

With continued reference to FIG. 15, the second control module 320B is electrically connected to the first voltage terminal V1, the second voltage terminal V2, the first node N1, the second node N2 and the each output module 340B and is electrically connected to the each output module 340B at a third node N3. The second control module 320B is configured to control a first voltage signal Vgl of the first voltage terminal V1 to supply to the third node N3 when the signal of the first node N1 is at the valid level and control a second voltage signal Vgh of the second voltage terminal V2 to supply to the third node N3 when the signal of the second node N2 is at the valid level. The first voltage signal Vgl of the first voltage terminal V1 and the second voltage signal Vgh of the second voltage terminal V2 may be at fixed levels having different level values. The second voltage signal Vgh may be a signal for controlling the third node N3 to be at the valid level, and the first voltage signal Vgl may be a signal for controlling the third node N3 to be at the invalid level. In this way, when the signal of the first node N1 is at the valid level, the second control module 320B may transmit the second voltage signal Vgh to the third node N3 so that the third node N3 can be at the valid level, and when the signal of the second node N2 is at the valid level, the second control module 320B may transmit the first voltage signal Vgl to the third node N3 so that the signal of the third node N3 can be at the invalid level. Consequently, when the signal of the second node N2 is at the valid level, the signal of the third node N3 can be at the invalid level, and when the signal of the second node N2 is at the invalid level, the signal of the third node N3 can be at the invalid level.

In an exemplary embodiment, with continued reference to FIG. 16, the second control module 320B may include a third control transistor M21 and a fourth control transistor M22. A gate of the third control transistor M21 is electrically connected to the first node N1, a first electrode of the third control transistor M21 is electrically connected to the second voltage terminal V2, and a second electrode of the third control transistor M21 is electrically connected to the third node N3. A gate of the fourth control transistor M22 is electrically connected to the second node N2, a first electrode of the fourth control transistor M22 is electrically connected to the first voltage terminal V1, and a second electrode of the fourth control transistor M22 is electrically connected to the third node N3. In this way, the signal of the first node N1 may control the third control transistor M21 to turn on or off, and when the signal of the first node N1 controls the third control transistor M21 to turn on, the third control transistor M21 can transmit the second voltage signal Vgh to the third node N3 so that the third node N3 can be at the valid level; the signal of the second node N2 may control the fourth control transistor M22 to turn on or off, and when the signal of the second node N2 controls the fourth control transistor M22 to turn on, the fourth control transistor M22 can transmit the first voltage signal Vgl to the third node N3 so that the third node N3 can be at the invalid level. The third control transistor M21 and the fourth control transistor M22 may be n-type transistors or p-type transistors. This may be disposed according to actual requirements and is not specifically limited in the embodiments of the present application.

With continued reference to FIG. 15, the each output module 340B is further electrically connected to a respective output control terminal B, the first voltage terminal V1 and a respective drive output terminal OUT. The each output module 340B is configured to control a gate drive signal G output by the respective drive output terminal OUT in response to an output control signal CKB of the respective output control terminal B, the first voltage signal Vgl of the first voltage terminal V1, the signal of the second node B2 and the signal of the third node N3. The output control signal CKB may be a pulse signal including a high level and a low level, and the valid level of the output control signal CKB may be the high level or the low level. This may be disposed according to actual requirements and is not specifically limited in the embodiments of the present application. Since the signal of the second node N2 and the signal of the third node N3 are opposite, the signal of the second node N2 may control a transmission path in which the output control signal CKB is transmitted to the respective drive output terminal OUT, and the signal of the third node N3 may control a transmission path in which the first voltage signal Vgl is transmitted to the respective drive output terminal OUT so that when the signal of the second node N2 controls the each output module 340B to transmit the output control signal CKB to the respective drive output terminal OUT, the gate drive signal G output by the respective drive output terminal OUT can remain consistent with the output control signal CKB, and when the signal of the third node N3 controls the each output module 340B to transmit the first voltage signal Vgl to the respective drive output terminal OUT, the gate drive signal G output by the respective drive output terminal OUT can remain consistent with the first voltage signal Vgl. Meanwhile, since the first voltage signal Vgl is at a continuous invalid level, and the output control signal CKB includes an invalid level and a valid level, when the output control signal CKB is at the valid level, the gate drive signal G output by the respective drive output terminal OUT may be controlled to remain consistent with the output control signal CKB, and when the respective drive output terminal OUT needs to remain at an invalid level for a long time period, the gate drive signal G output by the respective drive output terminal OUT may be controlled to remain consistent with the first voltage signal Vgl.

In an exemplary embodiment, with continued reference to FIG. 16, the each output module 340B may include a first output transistor M41 and a second output transistor M42. A gate of the first output transistor M41 is electrically connected to the second node N2, a first electrode of the first output transistor M41 is electrically connected to the respective output control terminal B, and a second electrode of the first output transistor M41 is electrically connected to the respective drive output terminal OUT. A gate of the second output transistor M42 is electrically connected to the third node N3, a first electrode of the second output transistor M42 is electrically connected to the first voltage terminal V1, and a second electrode of the second output transistor M42 is electrically connected to the respective drive output terminal OUT. In this case, the signal of the second node N2 may control the first output transistor M41 to turn on or off so that when the signal of the second node N2 is at the valid level, the first output transistor M41 can be turned on, and the output control signal CKB can be transmitted to the respective drive output terminal OUT; the signal of the third node N3 may control the second output transistor M42 to turn on or off so that when the signal of the third node N3 is at the valid level, the second output transistor M42 can be turned on, and the first voltage signal Vgl can be transmitted to the respective drive output terminal OUT. The first output transistor M41 and the second output transistor M42 may be n-type transistors or p-type transistors. This may be disposed according to actual requirements and is not specifically limited in the embodiments of the present application.

Figure 17:
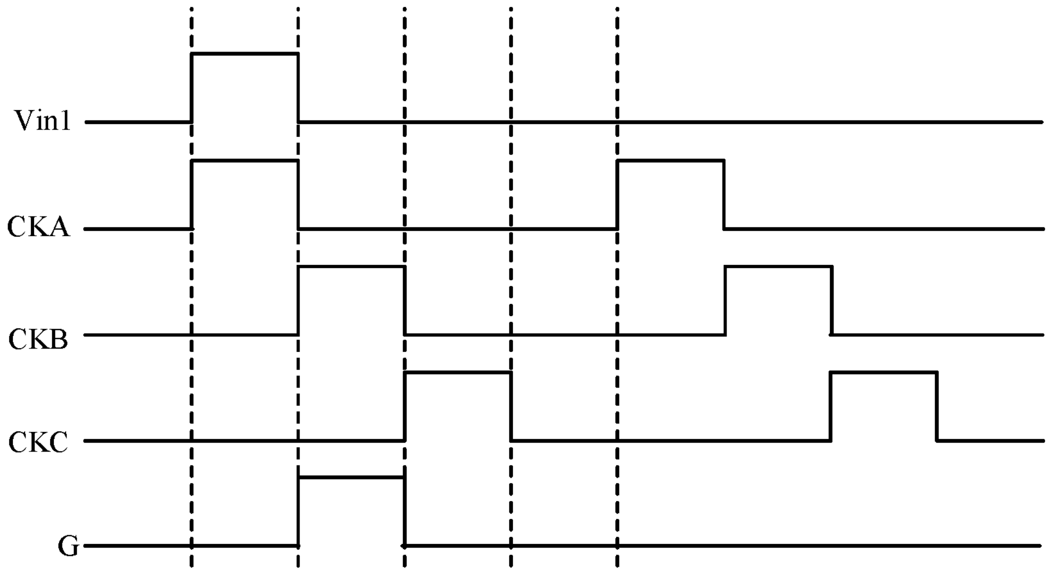
FIG. 17 is a drive timing diagram of another shift register unit according to an embodiment of the present application.

In an optional embodiment, FIG. 17 is a drive timing diagram of another shift register unit according to an embodiment of the present application. In conjunction with FIGS. 16 and 17, in the same one shift register unit 31, valid pulses of the clock signal CKA, the output control signal CKB and the first reset signal CKC are shifted successively, and the time periods of the valid pulses of the clock signal CKA, the output control signal CKB and the first reset signal CKC do not overlap.

In an embodiment, since the first input signal Vin1 is a gate drive signal output by another shift register unit cascaded with the current shift register unit 31, when the first input signal Vin1 is at the valid level, the clock signal CKA may be at the valid level so that the valid level of the first input signal Vin1 can be transmitted to the second node N2 through the first control module 310B. In this case, the signal of the second node N2 can control the each output module 340B to transmit the output control signal CKB to the respective drive output terminal OUT so that the gate drive signal output by the respective drive output terminal OUT can remain consistent with the output control signal CKB. To ensure that the valid pulses of the gate drive signals G output by the two cascaded shift register units 31 do not overlap, the output control signal CKB should be at the invalid level at this time period, that is, in the period when the clock signal CKA is at the valid level, the output control signal CKB is at the invalid level. When the first input signal Vin1 hops to be at the invalid level, the clock signal CKA may also be at the invalid level. At this time period, if a new signal is not written into the second node N2, the signal of the second node N2 remains at the valid level so that the signal of the second node N2 can continue controlling the each output module 340B to transmit the output control signal CKB to the respective drive output terminal OUT, and so that the gate drive signal G of the respective drive output terminal OUT can continue remaining consistent with the output control signal CKB. In this case, if the output control signal CKB hops to be at the valid level, the gate drive signal G of the respective drive output terminal OUT is also at the valid level. After the output control signal CKB hops to be at the invalid level, the respective drive output terminal OUT may also hop to be at the invalid level. At this time period, the first reset signal CKC of the first reset terminal C may control the reset module 330B to hop the signal of the first node N1 to be at the valid level so that the invalid level of the first input signal Vin1 can be transmitted to the second node N2, and the second voltage signal Vgh of the second voltage terminal V2 is transmitted to the third node N3 through the second control module 320B so that the third node N3 can be at the valid level, and the each output module 340B transmits the first voltage signal Vgl to the respective drive output terminal OUT under the control of the valid level of the third node N3 so that the respective drive output terminal OUT can output the invalid level of the gate drive signal. In this way, the valid pulses of the clock signal CKA, the output control signal CKB and the first reset signal CKC are shifted successively so that the cascaded shift register units 31 can output the valid pulses of the gate drive signals G successively, thereby ensuring the accuracy of the gate drive signals output by the shift register units 31.

In an optional embodiment, with continued reference to FIGS. 16 and 17, the each shift register unit 31 may further include a node mutual control module 350B. The node mutual control module 350B can control the signal of the third node N3 under the control of the first input signal Vin1 and can control the signal of the second node N2 under the control of the signal of the third node N3 so that the signal of the second node N2 and the signal of the third node N3 can be mutually clamped, ensuring the accuracy of the signal at the second node N2 and the signal at the third node N3, and so that when the each output module 340B outputs a respective gate drive signal according to the signal of the second node N2 and the signal of the third node N3, the accuracy of the respective gate drive signal output by the each output module 340B can be improved.

In an exemplary embodiment, the node mutual control module 350B may include a first mutual control transistor M51 and a second mutual control transistor M52. A gate of the first mutual control transistor M51 is electrically connected to the first input terminal IN1, a first electrode of the first mutual control transistor M51 is electrically connected to the first voltage terminal V1, and a second electrode of the first mutual control transistor M51 is electrically connected to the third node N3 so that the first input signal Vin1 of the first input terminal IN1 can control the first mutual control transistor M51 to turn on or off, and when the first mutual control transistor M51 is turned on, the first voltage signal Vgl of the first voltage terminal V1 can be transmitted to the third node N3 so that the third node N3 can be at the invalid level. A gate of the second mutual control transistor M52 is electrically connected to the third node N3, a first electrode of the second mutual control transistor M52 is electrically connected to the first voltage terminal V1, and a second electrode of the second mutual control transistor M52 is electrically connected to the second node N2 so that the signal of the third node N3 can control the second mutual control transistor M52 to turn on or off, and when the second mutual control transistor M52 is turned on, the first voltage signal Vgl of the first voltage terminal V1 can be transmitted to the second node N2 so that the second node N2 can be at the invalid level. The first mutual control transistor M51 and the second mutual control transistor M52 may be n-type transistors or p-type transistors. This may be disposed according to actual requirements and is not specifically limited in the embodiments of the present application.

Optionally, the each shift register unit 31 may further include a storage capacitance C2. The storage capacitance C2 is electrically connected between the first voltage terminal V1 and the third node N3 to store the signal of the third node N3 and maintain the voltage of the third node N3 so that the voltage of the third node N3 can control the each output module 340B to accurately output the respective gate drive signal.

Optionally, the each shift register unit 31 may further include a bootstrap capacitance C1. The bootstrap capacitance C1 is electrically connected between the each drive output terminal OUT and the second node N2 to control the second node N2 to have the same hopping amount when the each drive output terminal OUT hops so that the signal of the second node N2 can control the first output transistor M41 in the each output module 340B to accurately turn on or off.

Optionally, the second node N2 may include a first sub-node N21 and a second sub-node N22. In this case, the each shift register unit 31 may further include a voltage regulation transistor M60. A gate of the voltage regulation transistor M60 receives a fixed signal such as the second voltage signal Vgh that can control the voltage regulation transistor M60 to be in a normal on state. A first electrode of the voltage regulation transistor M60 may be electrically connected to the first control module 310B at the first sub-node N21 and may be electrically connected to the each output module 340B at the second sub-node N22. The voltage regulation transistor M60 may stabilize the voltages of the first sub-node N21 and the second sub-node N22 to prevent the accuracy of a respective gate drive signal output by the each drive output terminal OUT from being affected by the unstable voltages of the first sub-node N21 and the second sub-node N22.

Optionally, when the each shift register unit includes the clock signal terminal, the at least one output control terminal and the first reset terminal, on the premise that the clock signal, the output control signal and a first reset signal that are received by the same one shift register unit are ensured to be shifted successively, the clock signals, the output control signals and first reset signals of the shift register units may be mutually multiplexed. For example, as shown in FIG. 14, the clock signal of the first shift register unit 311 may also serve as a first reset signal of the fifth shift register unit 315 and the output control signal of the seventh shift register unit 317, the clock signal of the second shift register unit 312 may also serve as a first reset signal of the sixth shift register unit 316 and the output control signal of the eighth shift register unit 318, the clock signal of the third shift register unit 313 may also serve as a first reset signal of the seventh shift register unit 317 and the output control signal of the first shift register unit 311, the clock signal of the fourth shift register unit 314 may also serve as a first reset signal of the eighth shift register unit 318 and the output control signal of the second shift register unit 312, the clock signal of the fifth shift register unit 315 may also serve as a first reset signal of the first shift register unit 311 and the output control signal of the third shift register unit 313, the clock signal of the sixth shift register unit 316 may also serve as a first reset signal of the second shift register unit 312 and the output control signal of the fourth shift register unit 314, the clock signal of the seventh shift register unit 317 may also serve as a first reset signal of the third shift register unit 313 and the output control signal of the fifth shift register unit 315, and the clock signal of the eighth shift register unit 318 may also serve as a first reset signal of the fourth shift register unit 314 and the output control signal of the sixth shift register unit 316. In this way, every eight shift register units 31 of the driver circuit 30 are controlled by eight control signals CK1, CK2, CK3, CK4, CK5, CK6, CK7 and CK8 respectively so that the gate drive signals G can be shifted successively, thereby reducing the number of control signals supplied to the driver circuit and the number of signal lines for transmitting the control signals, simplifying the structure of the display panel and facilitating the narrow bezel of the display panel.

Figure 18:
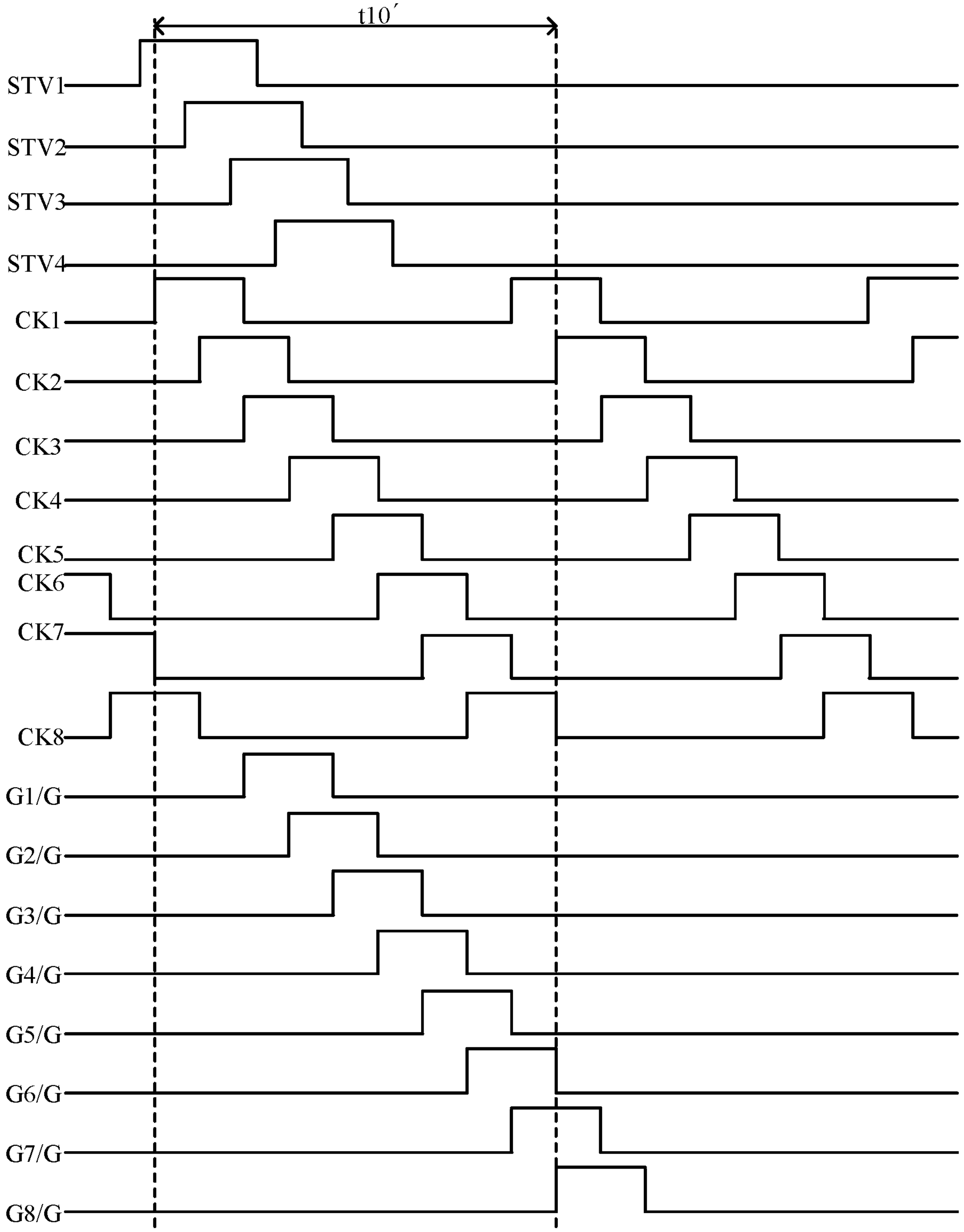
FIG. 18 is a drive timing diagram of yet another driver circuit according to an embodiment of the present application.

In an optional embodiment, FIG. 18 is a drive timing diagram of yet another driver circuit according to an embodiment of the present application. In conjunction with FIGS. 14 and 18, within one clock cycle t10', start time periods of valid pulses of the control signals CK1, CK2, CK3, CK4, CK5, CK6, CK7 and CK8 are shifted successively, and the time period interval between start time periods of valid pulses of any two adjacent control signals is less than the widths of the valid pulses of the any two adjacent control signals so that the time periods of the valid pulses of the gate drive signals G output by the any two adjacent shift register units 31 can overlap, the overlapping time period can be equal to the overlapping time period of the valid pulses of the any two adjacent control signals, and the valid pulses of the gate drive signals G output by the any two adjacent shift register units 31 can have a shift amount equal to the shift amount of the valid pulses of the any two adjacent control signals. In this way, the configuration of widths of the valid pulses of the control signals and the shift amount of the valid pulses of the any two adjacent control signals can control the widths and shift amounts of the valid pulses of the gate drive signals G (G1, G2, G3, G4, G5, G6, G7 and G8) output by the shift register units 31.

In an optional embodiment, with continued reference to FIGS. 14 and 18, in the case where the each shift register unit 31 includes the clock signal terminal A, the at least one output control terminal B and the first reset terminal C, when the adjacent and unconnected n shift register units 31 form one shift register unit group 301, in the same one shift register unit group 301, the valid pulses of the clock signals received by the n shift register units are shifted successively, the valid pulses of the output control signals received by the n shift register units are shifted successively, and valid pulses of first reset signals received by the n shift register units are shifted successively so that the gate drive signals output by the n shift register units 31 can be shifted successively.

In an optional embodiment, with continued reference to FIGS. 14 and 18, in the case where the each shift register unit 31 includes the clock signal terminal A, the at least one output control terminal B and the first reset terminal C, the clock signal of the i-th shift register unit may also serve as the clock signal of the (i+2*n)-th shift register unit, the output control signal of the i-th shift register unit may also serve as the output control signal of the (i+2*n)-th shift register unit, and a first reset signal of the i-th shift register unit may also serve as a first reset signal of the (i+2*n)-th shift register unit. In this way, 2*n control signals are supplied to the driver circuit 30 so that the shift register units 31 can be controlled, thereby reducing the number of control signals supplied to the driver circuit 30 and the number of signal lines for transmitting the control signals and further facilitating the narrow bezel of the display panel.

It is to be understood that the driving process of the driver circuit in the embodiments of the present application is merely illustrated using the preceding example of the structures of two shift register units, and the structure of the each shift register unit is not limited in the embodiments of the present application, and on the premise that the core application points of the embodiments of the present application can be achieved, the specific structure of the each shift register unit is not limited in the embodiments of the present application.

It is to be noted that the structure and driving process of the driver circuit are illustrated using the preceding example in which the each shift register unit includes one drive output terminal and one output control terminal corresponding to the drive output terminal, and in the embodiments of the present application, the each shift register unit may be provided with one or more drive output terminals, and the each shift register unit may also be provided with one or more output control terminals accordingly, and in the same one shift register unit, the number of drive output terminals may be the same as the number of output control terminals so that the output control terminals can control gate drive signals output by the drive output terminals in a one-to-one correspondence.

Optionally, when the each shift register unit includes m drive output terminals, in the same one shift register unit, valid pulses of gate drive signals output by m drive output terminals are shifted successively; m is a positive integer greater than or equal to 2; in the same one shift register unit, the j-th drive output terminal outputs a j-th valid pulse of a gate drive signal; j is a positive integer less than or equal to m; and in the same one shift register unit, the valid pulse of the gate drive signal output by the j-th drive output terminal and the valid pulse of a gate drive signal output by the (j+1)-th drive output terminal have an overlapping time period denoted as k*Th.

Figure 19:
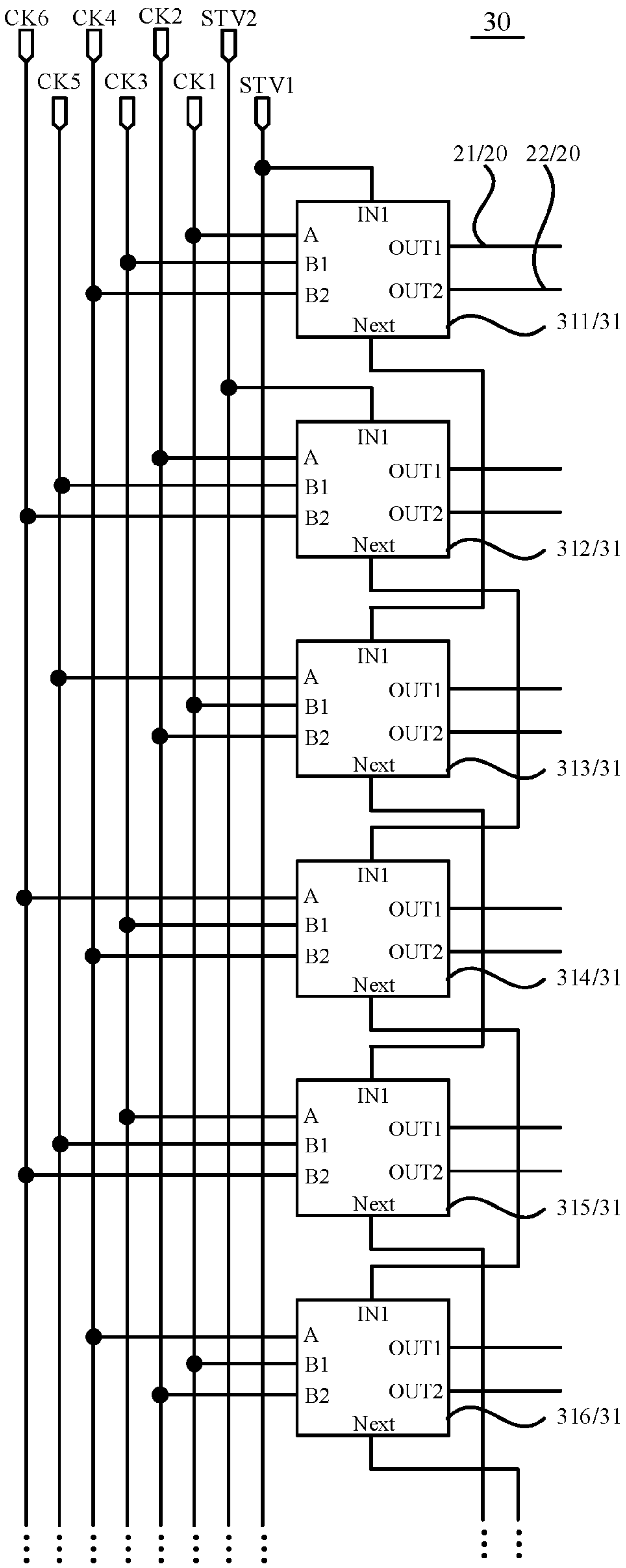
FIG. 19 is a diagram illustrating the structure of yet another driver circuit according to an embodiment of the present application.
Figure 20:
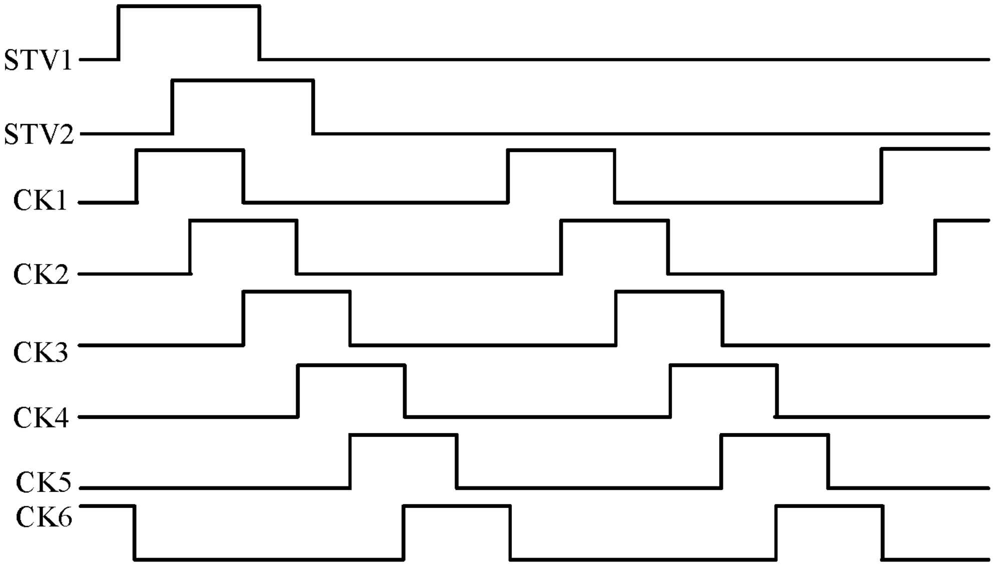
FIG. 20 is a drive timing diagram of yet another driver circuit according to an embodiment of the present application.

Exemplarily, when the m drive output terminals also serve as m shift output terminals in the same one shift register unit, FIG. 19 is a diagram illustrating the structure of yet another driver circuit according to an embodiment of the present application, and FIG. 20 is a drive timing diagram of yet another driver circuit according to an embodiment of the present application. In conjunction with FIGS. 19 and 20, the each shift register unit 31 includes two drive output terminals OUT1 and OUT2 and two output control terminals B1 and B2. In this case, an output control signal received by the output control terminal B1 can control a gate drive signal output by the drive output terminal OUT1, an output control signal received by the output control terminal B2 can control a gate drive signal output by the drive output terminal OUT2, and the gate drive signal output by the drive output terminal OUT1 and the gate drive signal output by the drive output terminal OUT2 may be supplied to different scan lines 20 to respectively control switch transistors in different rows of pixels to turn on or off. In this case, the each shift register unit 31 may control switch transistors in two rows of pixels to turn on or off. In this way, the number of shift register units disposed in the driver circuit can be reduced so that the size of the driver circuit 30 can be reduced, facilitating the narrow bezel of the display panel.

Meanwhile, when the each shift register unit 31 includes the clock signal terminal A and the two output control terminals B1 and B2, three control signals need to be supplied to the each shift register unit 31. For example, in the first shift register unit 311, the clock signal terminal A receives a clock signal CK1, an output control terminal B1 receives an output control signal CK3, and an output control terminal B2 receives an output control signal CK4. In this case, valid pulses of the clock signal CK1, the output control signal CK3 and the output control signal CK4 in the first shift register unit 311 are shifted successively, and the time period of the valid pulse of the clock signal CK1 does not overlap the time periods of the valid pulses of the output control signal CK3 and the output control signal CK4. The shift situations of valid pulses of control signals received by other shift register units 31 are similar to the shift situation of the valid pulses of the control signals received by the first shift register unit 311, and details are not repeated herein.

It is to be understood that when the each shift register unit includes the clock signal terminal and the two output control terminals, the clock signals and the output control signals that are received by the shift register units may also be multiplexed between each other to reduce the number of control signals supplied to the driver circuit. For example, referring to FIGS. 19 and 20, six control signals CK1, CK2, CK3, CK4, CK5 and CK6 are supplied to the driver circuit, and within one clock cycle, valid pulses of the control signals CK1, CK2, CK3, CK4, CK5 and CK6 are shifted successively so that on the premise that gate drive signals G output by the two drive output terminals of the same one shift register unit are ensured to be shifted successively, the gate drive signals G output by the shift register units can be shifted successively, and the rows of pixels in the display panel are scanned row by row so that the data signals and other signals can be written into the rows of pixels respectively to control the rows of pixels to accurately perform light emission for display.

Figure 21:
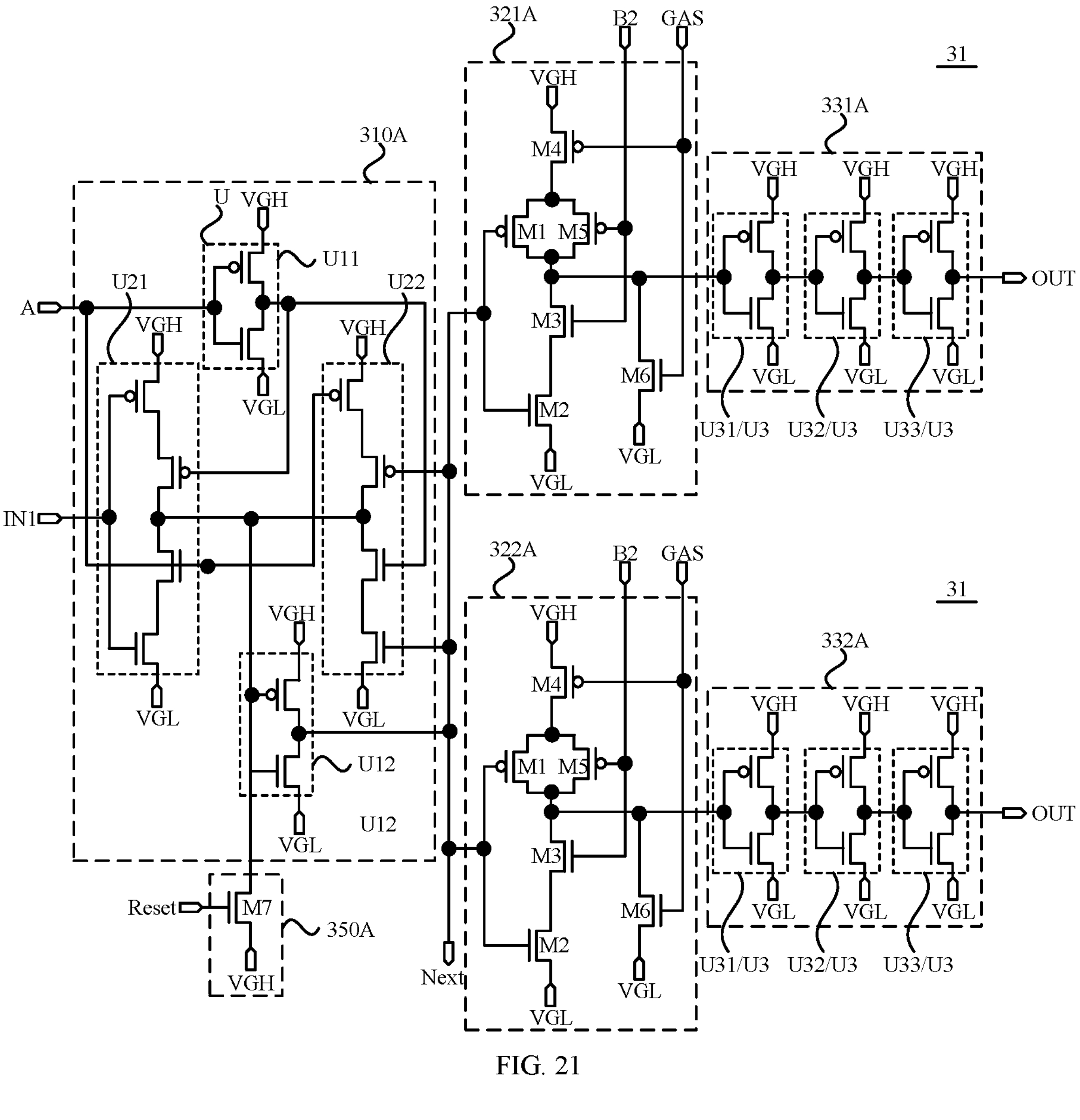
FIG. 21 is a diagram illustrating the circuit structure of yet another shift register unit according to an embodiment of the present application.

Accordingly, as shown in FIG. 21, when including the two drive output terminals OUT1 and OUT2, the each shift register unit 31 may include two level conversion modules 321A and 322A and two output modules 331A and 332A so that the level conversion module 321A can supply a respective gate drive signal to the output module 331A under the control of the output control signal of the output control terminal B1 and the shift signal of the shift output terminal Next, and the respective gate drive signal can be output by the drive output terminal OUT1 after undergoing polarity conversion by the output module 331A, and so that the level conversion module 322A can supply a respective gate drive signal to the output module 332A under the control of the output control signal of the output control terminal B2 and the shift signal of the shift output terminal Next, and the respective gate drive signal can be output by the drive output terminal OUT2 after undergoing polarity conversion by the output module 332A. In this way, the two drive output terminals OUT1 and OUT2 of the same one shift register unit can be ensured to output different gate drive signals respectively.

Optionally, when the drive output terminal also serves as the shift output terminal in the same one shift register unit, in the same one shift register unit including the m drive output terminals, the j-th drive output terminal outputs a j-th valid pulse of a gate drive signal; m is a positive integer, and j is a positive integer less than or equal to m; and in the same one shift register unit, the m-th drive output terminal also serves as the shift output terminal.

Figure 22:
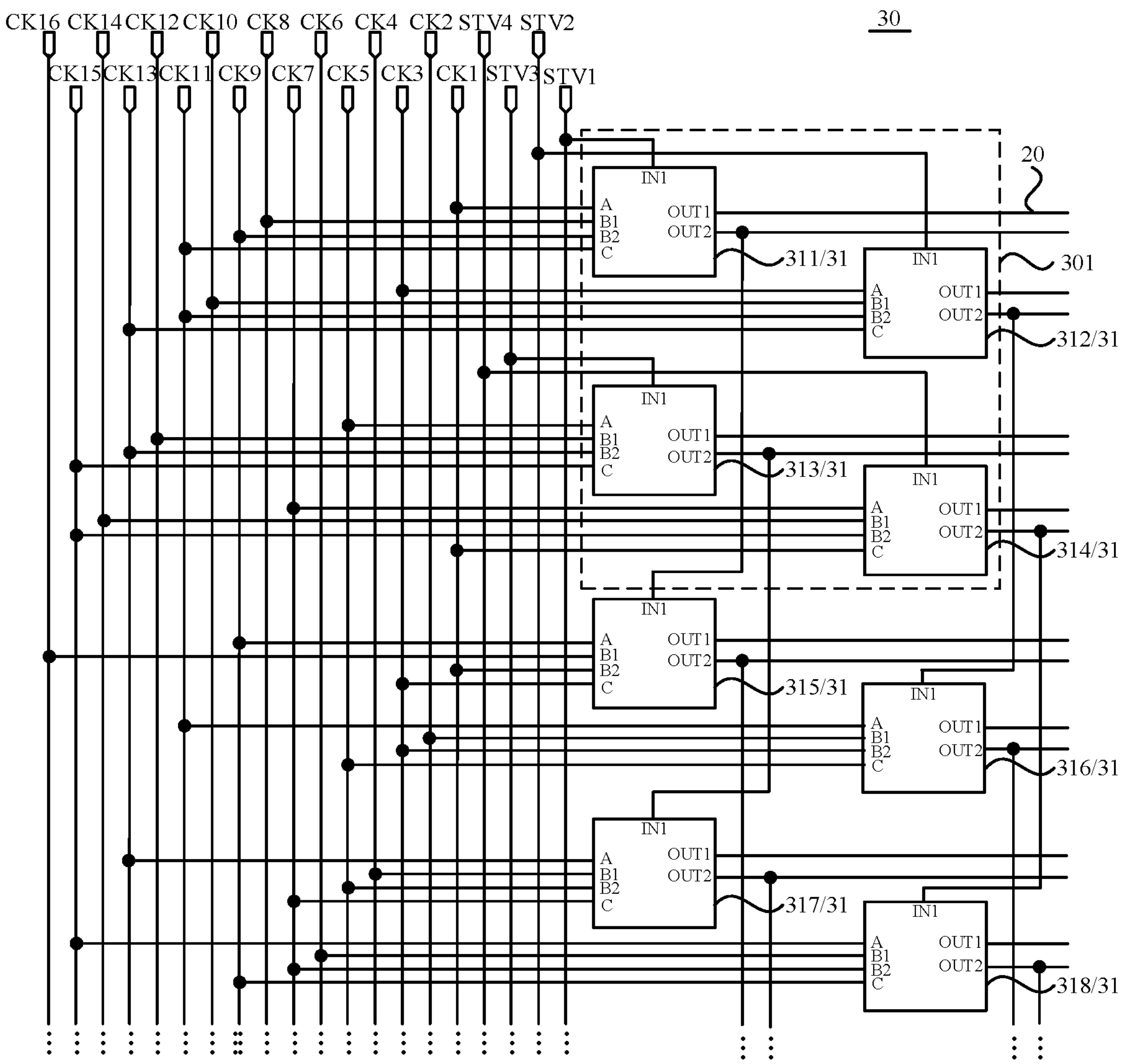
FIG. 22 is a diagram illustrating the structure of yet another driver circuit according to an embodiment of the present application.
Figure 23:
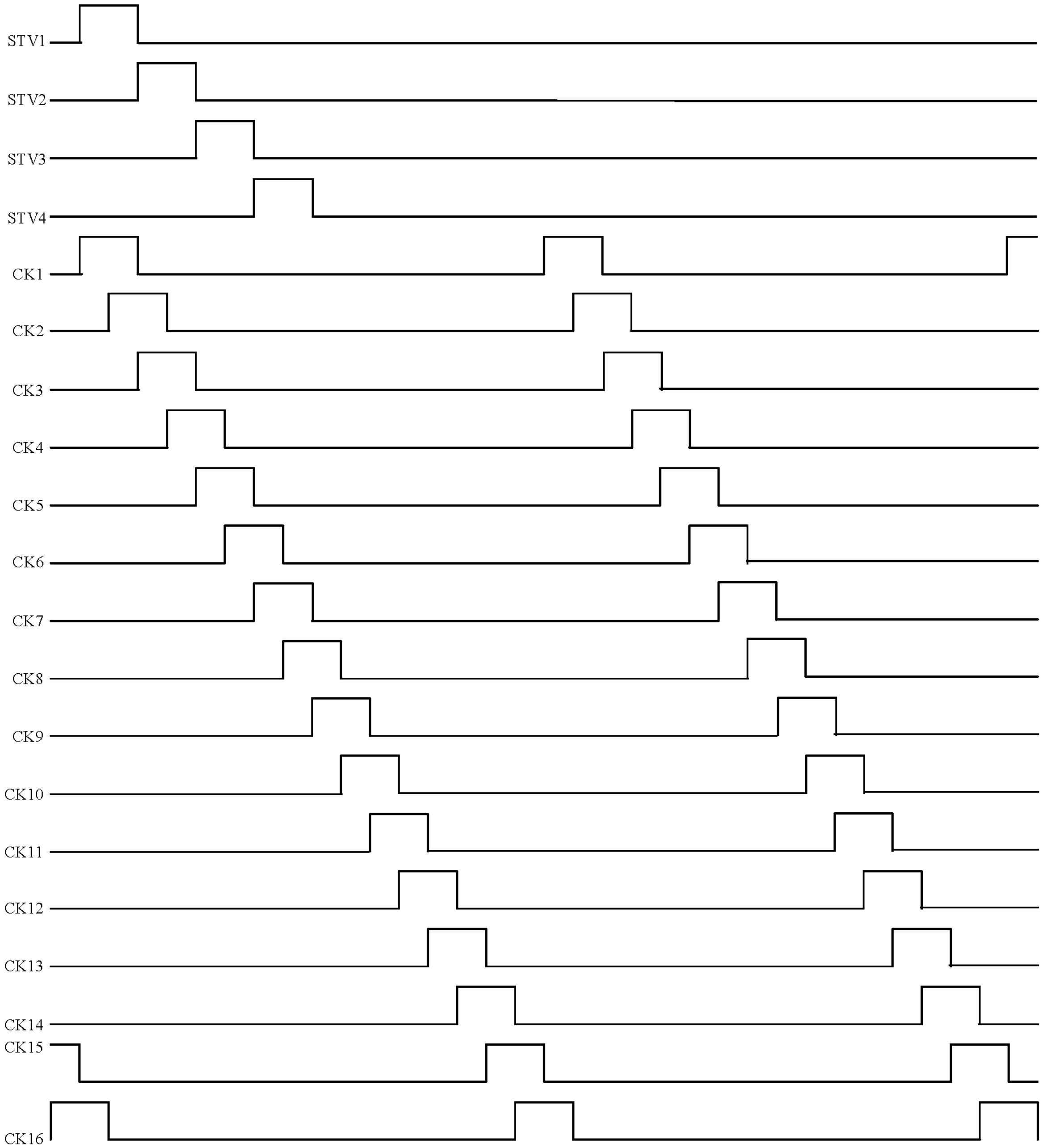
FIG. 23 is a drive timing diagram of yet another driver circuit according to an embodiment of the present application.

Exemplarily, FIG. 22 is a diagram illustrating the structure of yet another driver circuit according to an embodiment of the present application, and FIG. 23 is a drive timing diagram of yet another driver circuit according to an embodiment of the present application. In conjunction with FIGS. 22 and 23, the each shift register unit 31 includes the two drive output terminals that are the first drive output terminal OUT1 and the second drive output terminal OUT2. In this case, the second drive output terminal OUT2 also serves as the shift output terminal. At this time period, a second drive output terminal OUT2 of the first shift register unit 311 may be electrically connected to the first input terminal IN1 of the fifth shift register unit 315, a second drive output terminal OUT2 of the second shift register unit 312 may be electrically connected to the first input terminal IN1 of the sixth shift register unit 316, a second drive output terminal OUT2 of the third shift register unit 313 may be electrically connected to the first input terminal IN1 of the seventh shift register unit 317, and a second drive output terminal OUT2 of the fourth shift register unit 314 may be electrically connected to the first input terminal IN1 of the eighth shift register unit 318. In this way, in the i-th shift register unit and the (i+n)-th shift register unit that are cascaded, after m drive output terminals of the i-th shift register unit output valid pulses of gate drive signals, the (i+n)-th shift register unit is controlled to output valid pulses of gate drive signals so that gate drive signals output by drive output terminals (OUT1 and OUT2) of the shift register units 31 can be shifted successively.

Meanwhile, when the each shift register unit 31 includes the clock signal terminal A, the two output control terminals B1 and B2 and the first reset terminal C, four control signals need to be supplied to the each shift register unit 31. For example, in the first shift register unit 311, the clock signal terminal A receives the clock signal CK1, the output control terminal B1 receives an output control signal CK8, the output control terminal B2 receives an output control signal CK9, and the first reset terminal C receives the first reset signal CK11. In this case, valid pulses of the clock signal CK1, the output control signal CK8, the output control signal CK9 and the first reset signal CK11 in the first shift register unit 311 are shifted successively, the time period of the valid pulse of the clock signal CK1 does not overlap the time periods of the valid pulses of the output control signal CK8 and the output control signal CK9, and the time period of the valid pulse of the first reset signal CK11 does not overlap the time periods of the valid pulses of the output control signal CK8 and the output control signal CK9. The shift situations of valid pulses of control signals received by other shift register units 31 are similar to the shift situation of the valid pulses of the control signals received by the first shift register unit 311, and details are not repeated herein.

It is to be understood that when the each shift register unit includes the clock signal terminal, the two output control terminals and the first reset terminal, the clock signals, the output control signals and the first reset signals that are received by the shift register units may also be multiplexed between each other to reduce the number of control signals supplied to the driver circuit. For example, referring to FIGS. 22 and 23, sixteen control signals CK1, CK2, CK3, CK4, CK5, CK6, CK7, CK8, CK9, CK10, CK11, CK12, CK13, CK14, CK15 and CK16 are supplied to the driver circuit, and within one clock cycle, valid pulses of the control signals CK1 to CK16 are shifted successively so that on the premise that the gate drive signals G output by the two drive output terminals of the same one shift register unit are ensured to be shifted successively, the gate drive signals G output by the shift register units can be shifted successively, and the rows of pixels in the display panel are scanned row by row so that the data signals and other signals can be written into the rows of pixels respectively to control the rows of pixels to accurately perform light emission for display.

Figure 24:
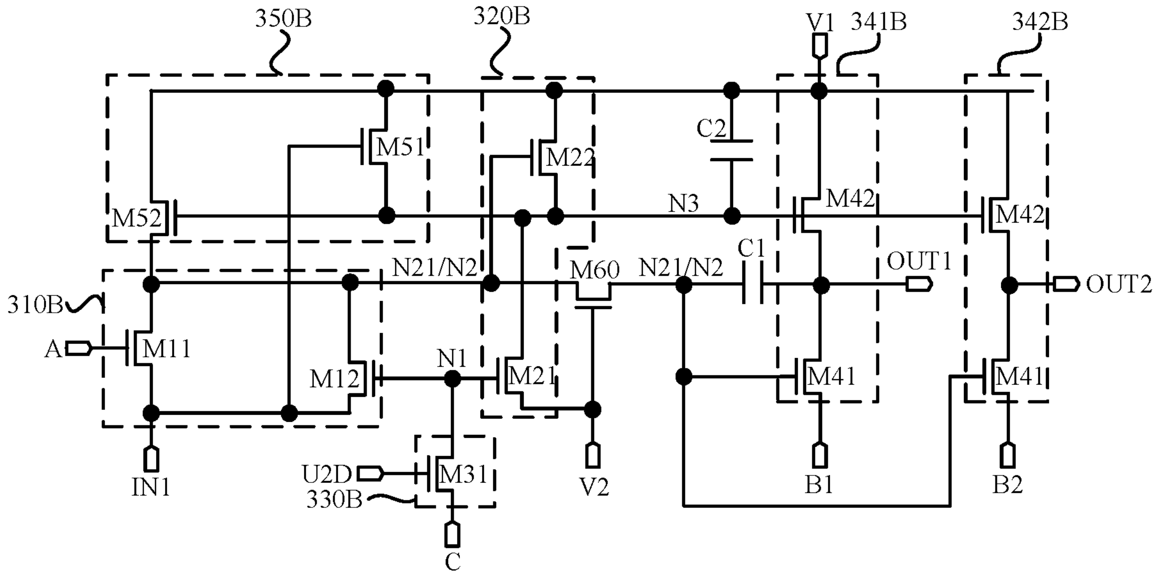
FIG. 24 is a diagram illustrating the circuit structure of yet another shift register unit according to an embodiment of the present application.

Accordingly, as shown in FIG. 24, when including the two drive output terminals OUT1 and OUT2, the each shift register unit 31 may include two output modules 341B and 342B so that the output module 341B can control the gate drive signal output by the drive output terminal OUT1 under the control of the output control signal of the output control terminal B1, the signal of the first node N1 and the signal of the second node N2, and so that the output module 342B can control the gate drive signal output by the drive output terminal OUT2 under the control of the output control signal of the output control terminal B2, the signal of the first node N1 and the signal of the second node N2. In this way, the two drive output terminals OUT1 and OUT2 of the same one shift register unit can be ensured to output different gate drive signals respectively.

It is to be noted that the technical solutions of the embodiments of the present application are merely illustrated using the preceding example in which the each shift register unit including the two drive output terminals is described using the structures of two shift register units, and in the embodiments of the present application, the number of drive output terminals in the each shift register unit may be disposed according to actual requirements. In this case, the number of drive output terminals in the each shift register unit may be equal to n, greater than n, or less than n, and this is not specifically limited in the embodiments of the present application.

Optionally, the valid pulse of a gate drive signal output by the m-th drive output terminal in the i-th shift register unit and the valid pulse of a gate drive signal output by the first drive output terminal in the (i+1)-th shift register unit have an overlapping time period denote as k*Th. In this case, compared with the valid pulse of the gate drive signal output by the m-th drive output terminal in the i-th shift register unit, the valid pulse of the gate drive signal output by the first drive output terminal in the (i+1)-th shift register unit has a shift amount denoted as Th so that the time period for writing a signal into pixels electrically connected to the first drive output terminal in the (i+1)-th shift register unit can be ensured to tend to remain consistent with the driving time period Th of a row of pixels, and so that the time period for writing signals into the rows of pixels can be sufficiently long, thereby ensuring the accuracy of the data signals and other signals that are written into the rows of pixels, further improving the accuracy of the display light emission of the rows of pixels and facilitating the improvement of the display effect of the display panel.

Optionally, when m≤n, the time periods of the valid pulses of the gate drive signals output by the m drive output terminals in the same one shift register unit overlap. In this case, the time periods of the valid pulses of the gate drive signals output by the m drive output terminals in the same one shift register unit may be greater than or equal to m*Th so that on the premise that the accuracy of the gate drive signals output by the shift register units is ensured, the valid pulses of the gate drive signals output by the shift register units can have a sufficiently long time period. Consequently, when the gate drive signals output by the shift register units are used for controlling the switch transistors in the rows of pixels to turn on or off, the switch transistors in the rows of pixels can have a sufficiently long conduction time period so that the respective signals can be written into the rows of pixels accurately.

Optionally, the time periods of valid pulses of output control signals received by the same one shift register unit overlap.

The output control signals received by the output control terminals of the shift register units control the time periods of the valid pulses of the gate drive signals output by the drive output terminals of the shift register units respectively. In this way, the time periods of the valid pulses of the output control signals received by the same one shift register unit overlap so that the time periods of the valid pulses of the gate drive signals output by the m drive output terminals in the same one shift register unit can overlap, thereby ensuring the sufficient lengths of the time periods of the valid pulses of the gate drive signals output by the m drive output terminals, and so that the gates of the switch transistors M0 in the rows of pixels 10 can have a sufficiently long charging time period, ensuring that all the switch transistors M0 in the rows of pixels 10 can be in a normal on state. Consequently, through the turned-on switch transistors M0, the data signals can be accurately written into the rows of pixels 10 to which the switch transistors M0 belong so that when the rows of pixels 10 perform light emission for display according to the written data signals, the accuracy of the display light emission of the rows of pixels 10 can be improved, facilitating the improvement of the overall display effect of the display panel 100.

Optionally, when m>n, the time periods of valid pulses of gate drive signals output from the first drive output terminal to the n-th drive output terminal in the same one shift register unit overlap; and in the same one shift register unit, the time period of the valid pulse of the gate drive signal output by the first drive output terminal does not overlap the time period of the valid pulse of a gate drive signal output by the (n+1)-th drive output terminal. In this way, the time periods of the valid pulses of the gate drive signals output by the drive output terminals may be less than or equal to n*Th so that on the premise that the sufficient lengths of the gate drive signals output by the shift register units are ensured, the valid pulses of the gate drive signals output by the drive output terminals can be shifted successively, and so that the gate drive signals output by the drive output terminals can successively control the switch transistors in the rows of pixels to turn on respectively. Consequently, the data signals transmitted by the multiple data lines can be written into the rows of pixels respectively, and the rows of pixels can be ensured to accurately perform light emission for display according to the written data signals so that the improvement of the overall display effect of the display panel can be facilitated.

Optionally, when an output control terminal corresponding to the j-th drive output terminal is the j-th output control terminal in the same one shift register unit, the time periods of valid pulses of output control signals received from the first output control terminal to the n-th output control terminal in the same one shift register unit overlap; and in the same one shift register unit, the time period of the valid pulse of the output control signal received by the first output control terminal does not overlap the time period of the valid pulse of an output control signal received by the (n+1)-th output control terminal.

The output control signals received by the output control terminals of the shift register units control the time periods of the valid pulses of the gate drive signals output by the drive output terminals of the shift register units respectively, and the time periods of the valid pulses of the gate drive signals output by the drive output terminals generally overlap the time periods of valid pulses of output control signals of corresponding output control terminals, so the time periods of the valid pulses of the output control signals received from the first output control terminal to the n-th output control terminal in the same one shift register unit overlap so that the time periods of the valid pulses of the gate drive signals output from the first drive output terminal to the n-th drive output terminal in the same one shift register unit can overlap, and the time periods of valid pulses of output control signals received by the first output control terminal and the (n+1)-th output control terminal in the same one shift register unit do not overlap so that the time periods of valid pulses of gate drive signals output by the first drive output terminal and the (n+1)-th drive output terminal cannot overlap. Consequently, on the premise that the sufficient lengths of the time periods of the valid pulses of the gate drive signals output by the drive output terminals are ensured, the valid pulses of the gate drive signals output by the drive output terminals can be shifted successively, and the data signals transmitted by the multiple data lines can be written into the rows of pixels respectively so that the rows of pixels can be ensured to accurately perform light emission for display according to the written data signals, thereby facilitating the improvement of the overall display effect of the display panel. It is to be noted that the preceding is illustrated using an example in which the gate drive signals output from the first drive output terminal to the m-th drive output terminal in the same one shift register unit are shifted successively and the gate drive signals output by the drive output terminals of the shift register units are also shifted successively, that is, the start time period of the valid pulse of the gate drive signal output by the j-th drive output terminal is located before the start time period of the valid pulse of a gate drive signal output by the (j+1)-th drive output terminal, and the start time period of the valid pulse of a gate drive signal output by the m-th drive output terminal in the i-th shift register unit is located before the start time period of the valid pulse of a gate drive signal output by the first drive output terminal in the (i+1) shift register unit, and in this case, the gate drive signals output by the drive output terminals of the shift register units can control the switch transistors from the first row of pixels to the last row of pixels to successively turn on, that is, the gate drive signals output by the drive output terminals of the shift register units can forward scan the rows of pixels in the display panel. In other embodiments of the present application, the gate drive signals output by the shift register units can also backward scan the rows of pixels. In this case, the each shift register unit further includes a first scan control terminal and a second scan control terminal. A first scan control signal received by the first scan control terminal may be at a valid level when the forward scan is performed on the rows of pixels, and a second scan control signal received by the second scan control terminal may be at a valid level when the backward scan is performed on the rows of pixels. For ease of description, the technical solutions of the embodiments of the present application are illustrated below using an example in which the each shift register unit includes one drive output terminal.

Figure 25:
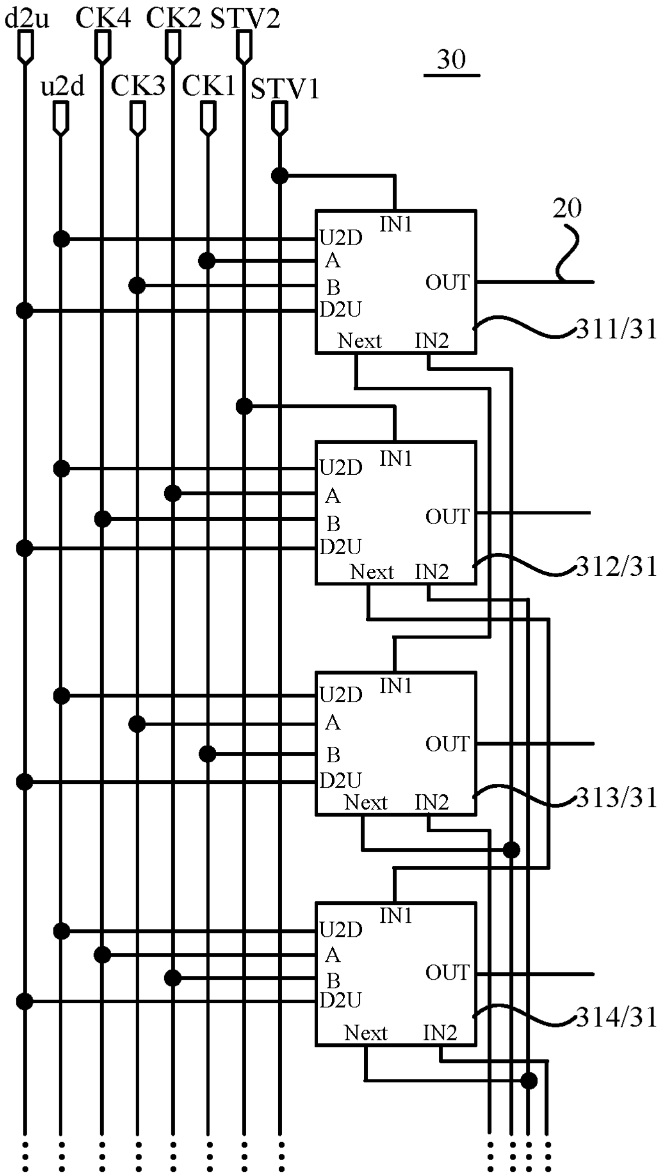
FIG. 25 is a diagram illustrating the structure of yet another driver circuit according to an embodiment of the present application.

Optionally, FIG. 25 is a diagram illustrating the structure of yet another driver circuit according to an embodiment of the present application. As shown in FIG. 25, the each shift register unit 31 may further include a first scan control terminal U2D, a second scan control terminal D2U and a second input terminal IN2. The first scan control terminal U2D receives a first scan control signal u2*d*, the second scan control terminal D2U receives a second scan control signal d2*u*, and the first scan control signal u2*d* of the first scan control terminal U2D and the second scan control signal d2*u* of the second scan control terminal D2U have opposite polarities. A second input terminal IN2 of the i-th shift register unit is electrically connected to a shift output terminal Next of the (i+n)-th shift register unit. For example, a second input terminal IN2 of the first shift register unit 311 is electrically connected to a shift output terminal Next of the third shift register unit 313. In this way, when the first scan control signal u2*d* of the first scan control terminal U2D is at a valid level, the time period of the valid pulse of the gate drive signal output by the first shift register unit 311 is located before the time period of the valid pulse of the gate drive signal output by the third shift register unit 313, and the forward scan can be performed on the rows of pixels at this time period; and when the second scan control signal d2*u* of the second scan control terminal D2U is at a valid level, the time period of the valid pulse of the gate drive signal output by the third shift register unit 313 is located before the time period of the valid pulse of the gate drive signal output by the first shift register unit 311, and the backward scan can be performed on the rows of pixels at this time period so that the display panel can have diversifying display modes.

Figure 26:
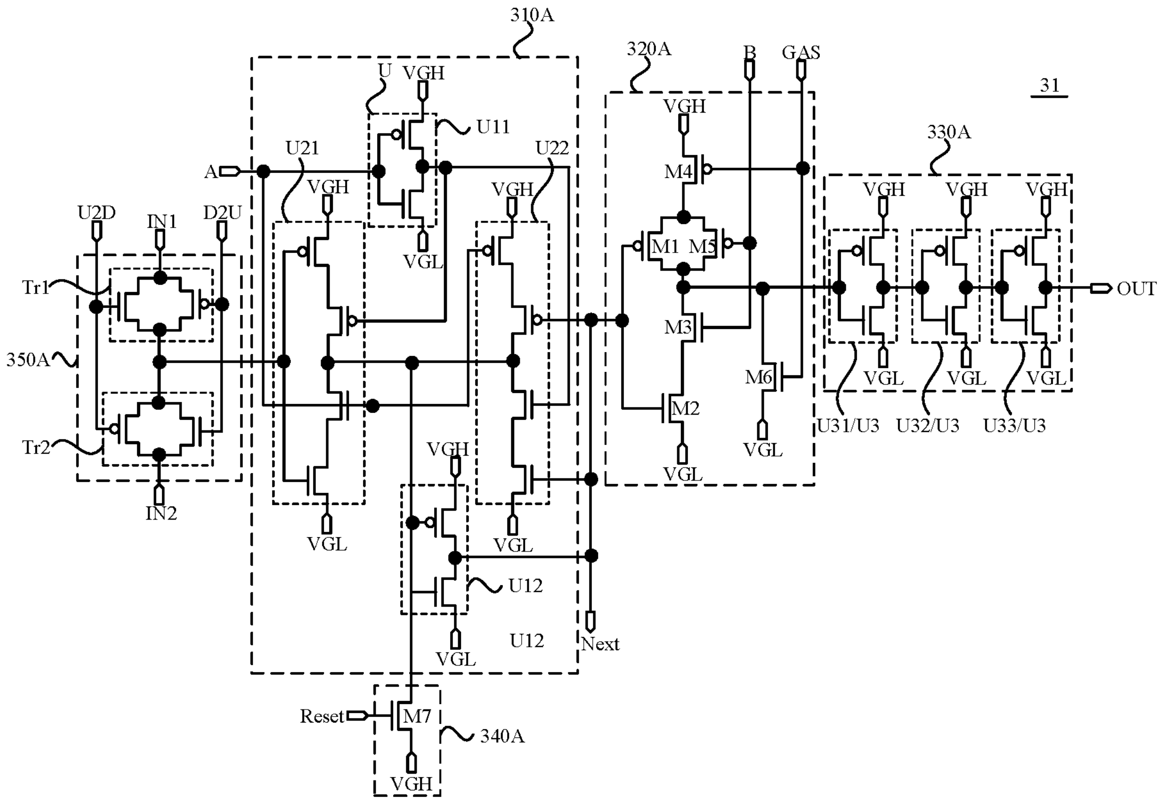
FIG. 26 is a diagram illustrating the circuit structure of yet another shift register unit according to an embodiment of the present application.

Optionally, FIG. 26 is a diagram illustrating the circuit structure of yet another shift register unit according to an embodiment of the present application. As shown in FIG. 26, when the each shift register unit 31 further includes the first scan control terminal U2D, the second scan control terminal D2U and the second input terminal IN2, and the first scan control signal u2*d* of the first scan control terminal U2D and the second scan control signal d2*u* of the second scan control terminal D2U have opposite polarities, the each shift register unit 31 may further include an input module 350A. The input module 350A is electrically connected between the first input terminal IN1 and the latch module 310A and is further electrically connected to the first scan control terminal U2D, the second scan control terminal D2U and the second input terminal IN2 separately. The input module 350A is configured to control the first input signal of the first input terminal to supply to the latch module 310A when the first scan control signal u2*d* is at the valid level and control a second input signal of the second input terminal to supply to the latch module 310A when the second scan control signal d2*u* is at the valid level. In this way, when the forward scan is performed on the rows of pixels, the valid level of the first scan control signal u2*d* can control the first input signal Vin1 of the first input terminal IN1 to supply to the latch module 310A so that the signal received by the latch module 310A can remain consistent with the first input signal Vin1. Conversely, when the backward scan is performed on the rows of pixels, the valid level of the second scan control signal d2*u* can control the second input signal Vin2 of the second input terminal IN2 to supply to the latch module 310A so that the signal received by the latch module 310A can remain consistent with the second input signal Vin2.

In this way, the input module 350A is disposed in the each shift register unit 31 so that the signal supplied to the latch module 310A can be selected, avoiding the mutual influence between signals output by the cascaded shift register units 31, ensuring the accurate operation of the shift register units 31 and improving the accuracy of the gate drive signals output by the shift register units.

In an exemplary embodiment, with continued reference to FIG. 26, the input module 350A may include two transmission gates Tr1 and Tr2. An input terminal of the transmission gate Tr1 is electrically connected to the first input terminal IN1, an input terminal of the transmission gate Tr2 is electrically connected to the second input terminal IN2, and an output terminal of the transmission gate Tr1 and an output terminal of the transmission gate Tr2 are electrically connected to the latch module 310A. A forward control terminal and a backward control terminal of the transmission gate Tr1 are electrically connected to the first scan control terminal U2D and the second scan control terminal D2U respectively. A forward control terminal and a backward control terminal of the transmission gate Tr2 are electrically connected to the second scan control terminal D2U and the first scan control terminal U2D respectively. In this way, when the forward scan is performed on the rows of pixels, the first scan control signal u2*d* and the second scan control signal d2*u* may control the transmission gate Tr1 to turn on and control the transmission gate Tr2 to turn off so that the signal supplied to the latch module 310A can remain consistent with the first input signal Vin1, and when the backward scan is performed on the rows of pixels, the first scan control signal u2*d* and the second scan control signal d2*u* may control the transmission gate Tr2 to turn on and control the transmission gate Tr1 to turn off so that the signal supplied to the latch module 310A can remain consistent with the second input signal Vin2.

Each transmission gate (Tr1 and Tr2) may be composed of two different types of transistors. A gate of an n-type transistor of the transmission gate Tr1 may be electrically connected to the first scan control terminal U2D, and a gate of a p-type transistor of the transmission gate Tr1 may be electrically connected to the second scan control terminal D2U. A gate of an n-type transistor of the transmission gate Tr2 may be electrically connected to the second scan control terminal D2U, and a gate of a p-type transistor of the transmission gate Tr2 may be electrically connected to the first scan control terminal U2D.

Figure 27:
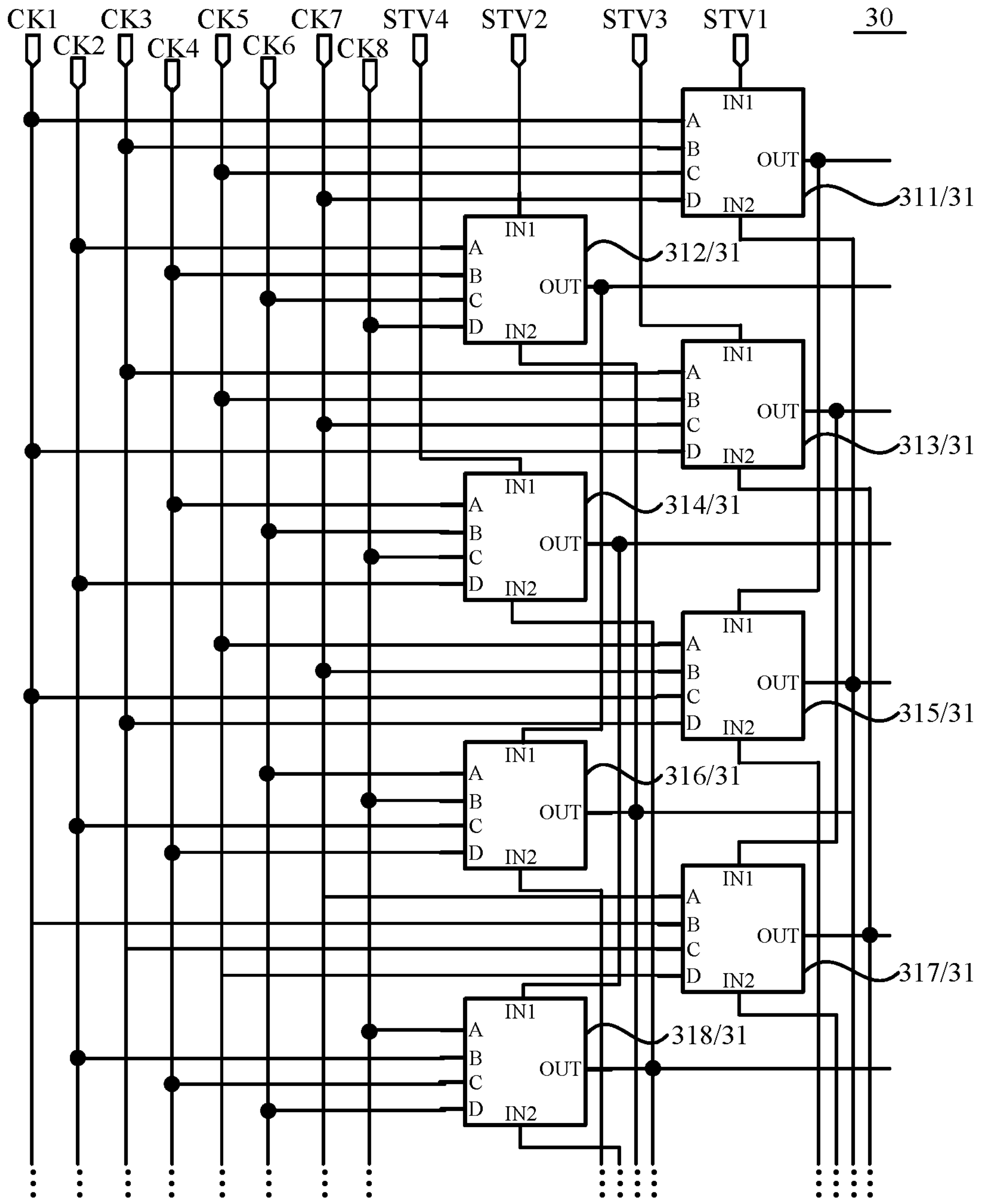
FIG. 27 is a diagram illustrating the structure of yet another driver circuit according to an embodiment of the present application.

In another optional embodiment, FIG. 27 is a diagram illustrating the structure of yet another driver circuit according to an embodiment of the present application. As shown in FIG. 27, when the drive output terminal OUT also serves as the shift output terminal in the same one shift register unit 31, a drive output terminal OUT of the i-th shift register unit is electrically connected to a first input terminal IN1 of the (i+n)-th shift register unit, and a drive output terminal OUT of the (i+n)-th shift register unit is electrically connected to a second input terminal IN2 of the i-th shift register unit. In this way, when the forward scan is performed on the rows of pixels, the time period of the valid pulse of the gate drive signal output by the i-th shift register unit is located before the time period of the valid pulse of the gate drive signal output by the (i+n)-th shift register unit, and when the backward scan is performed on the rows of pixels, the time period of the valid pulses of the gate drive signal output by the (i+n)-th shift register unit is located before the time period of the valid pulse of the gate drive signal output by the i-th shift register unit.

It is to be understood that when the each shift register unit includes the m drive output terminals, on the premise that the gate drive signals output by the drive output terminals of the shift register units are shifted successively, any one drive output terminal in the (i+n)-th shift register unit may be electrically connected to the second input terminal of the i-th shift register unit. This is not specifically limited in the embodiments of the present application. In an optional embodiment, the second input terminal IN2 of the i-th shift register unit may be electrically connected to the m-th drive output terminal OUT of the (i+n)-th shift register unit.

Figure 28:
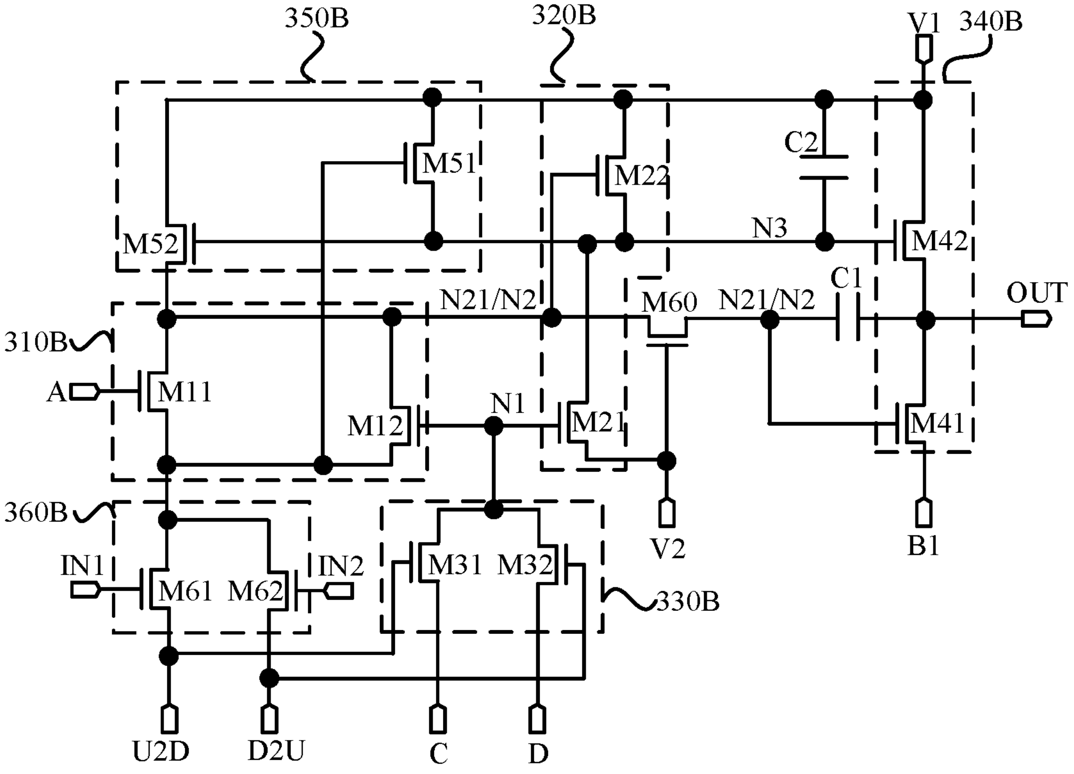
FIG. 28 is a diagram illustrating the circuit structure of yet another shift register unit according to an embodiment of the present application.

Optionally, FIG. 28 is a diagram illustrating the circuit structure of yet another shift register unit according to an embodiment of the present application. As shown in FIG. 28, the each shift register unit further includes the first scan control terminal U2D, the second scan control terminal D2U, the second input terminal IN2, a second reset terminal D and an input module 360B, and the first scan control signal u2*d* of the first scan control terminal U2D and the second scan control signal d2*u* of the second scan control terminal D2U have opposite polarities. The input module 360B is electrically connected between the first input terminal IN1 and the first control module 310B and is further electrically connected to the first scan control terminal, the second scan control terminal and the second input terminal. The input module 360B is configured to control the first scan control signal u2*d* to supply to the first control module 310B when the first input signal Vin1 of the first input terminal IN1 is at the valid level and control the second scan control signal d2*u* to supply to the first control module 310B when the second input signal Vin2 of the second input terminal IN2 is at the valid level.

In an embodiment, when the forward scan is performed on the rows of pixels, the valid level of the first scan control signal u2*d* can be controlled to supply to the first control module 310B when the first input signal Vin1 of the first input terminal IN1 is at the valid level, and the invalid level of the second scan control signal d2*u* can be controlled to supply to the first control module 310B when the second input signal Vin2 of the second input terminal IN2 is at the valid level so that the first control module 310B can transmit the valid level of the first scan control signal u2*d* or the invalid level of the second scan control signal d2*u* to the second node N2 under the control of the clock signal CKA of the clock signal terminal A. Conversely, when the backward scan is performed on the rows of pixels, the valid level of the second scan control signal d2*u* can be controlled to supply to the first control module 310B when the second input signal Vin2 of the second input terminal IN2 is at the valid level, and the invalid level of the first scan control signal u2*d* can be controlled to supply to the first control module 310B when the first input signal Vin1 of the first input terminal IN1 is at the valid level so that the first control module 310B can transmit the invalid level of the first scan control signal u2*d* or the valid level of the second scan control signal d2*u* to the second node N2 under the control of the clock signal CKA of the clock signal terminal A. In this way, the first scan control terminal U2D, the second scan control terminal D2U, the second input terminal IN2 and the input module 360B are disposed in the each shift register unit 31 so that the input module 360B can select the signal supplied to the latch module 310A, avoiding the mutual influence between the signals output by the cascaded shift register units 31.

In an exemplary embodiment, the input module 360B may include a first input transistor M61 and a second input transistor M62. Agate of the first input transistor M61 may be electrically connected to the first input terminal IN1, a first electrode of the first input transistor M61 may be electrically connected to the first scan control terminal U2D, and a second electrode of the first input transistor M61 may be electrically connected to the first control module 310B. A gate of the second input transistor M62 may be electrically connected to the second input terminal IN2, a first electrode of the second input transistor M62 may be electrically connected to the second scan control terminal D2U, and a second electrode of the second input transistor M62 may be electrically connected to the first control module 310B. In this case, the first input signal Vin1 of the first input terminal IN1 may control the first input transistor M61 to turn on or off so that when the first input signal Vin1 of the first input terminal IN1 controls the first input transistor M61 to turn on, the first scan control signal u2*d* of the first scan control terminal U2D can be supplied to the first control module 310B; and the second input signal Vin2 of the second input terminal IN2 may control the second input transistor M62 to turn on or off so that when the second input signal Vin2 of the second input terminal IN2 controls the second input transistor M62 to turn on, the second scan control signal d2*u* of the second scan control terminal D2U can be supplied to the first control module 310B. The first input transistor M61 and the second input transistor M62 may be n-type transistors or p-type transistors. This may be disposed according to actual requirements and is not specifically limited in the embodiments of the present application.

With continued reference to FIG. 28, the reset module 330B is further electrically connected to the second reset terminal D, the first scan control terminal U2D and the second scan control terminal D2U and is configured to control the first reset signal CKC of the first reset terminal C to supply to the first node N1 when the first scan control signal u2*d* is at the valid level and control a second reset signal CKD of the second reset terminal D to supply to the first node N1 when the second scan control signal d2*u* is at the valid level. When the forward scan is performed on the rows of pixels, the potential of the first node N1 can remain consistent with the first reset signal CKC, and when the backward scan is performed on the rows of pixels, the potential of the first node N1 can remain consistent with the second reset signal CKD. In this way, the reset module 330B is further electrically connected to the second reset terminal D, the first scan control terminal U2D and the second scan control terminal D2U so that the reset module 330B can select the time period for resetting the first node N1 under the control of the first reset terminal C, the second reset terminal D, the first scan control terminal U2D and the second scan control terminal D2U, and so that the first node N1 can be reset in the forward scan process and the backward scan process, ensuring the accuracy of the potential of the first node N1 and thereby facilitating the improvement of the accuracy of the gate drive signals output by the shift register units 31.

In an exemplary embodiment, with continued reference to FIG. 28, the reset module 330B may include the first reset transistor M31 and a second reset transistor M32. A gate of the first reset transistor M31 may be electrically connected to the first scan control terminal U2D, the first electrode of the first reset transistor M31 may be electrically connected to the first reset terminal C, and the second electrode of the first reset transistor M31 may be electrically connected to the first node N1. A gate of the second reset transistor M32 may be electrically connected to the second scan control terminal D2U, a first electrode of the second reset transistor M32 may be electrically connected to the second reset terminal D, and a second electrode of the second reset transistor M32 may be electrically connected to the first node N1. In this case, the first scan control signal u2*d* of the first scan control terminal U2D may control the first reset transistor M31 to turn on or off so that when the first scan control signal u2*d* of the first scan control terminal U2D controls the first reset transistor M31 to turn on, the first reset signal CKC of the first reset terminal C can be transmitted to the first node N1; and the second scan control signal d2*u* of the second scan control terminal D2U may control the second reset transistor M32 to turn on or off so that when the second scan control signal d2*u* of the second scan control terminal D2U controls the second reset transistor M32 to turn on, the second reset signal CKD of the second reset terminal D can be transmitted to the first node N1. The first reset transistor M31 and the second reset transistor M32 may be n-type transistors or p-type transistors. This may be disposed according to actual requirements and is not specifically limited in the embodiments of the present application.

Based on the same inventive concept, an embodiment of the present application further provides a display device. The display device includes the display panel provided in the embodiments of the present application. Therefore, the display device has the technical features of the display panel and the driving method provided in the embodiments of the present application and can achieve the beneficial effects of the display panel provided in the embodiment of the present application. Similarities may be referred to the preceding description of the display panel provided in the embodiments of the present application and are not repeated herein.

Figure 29:
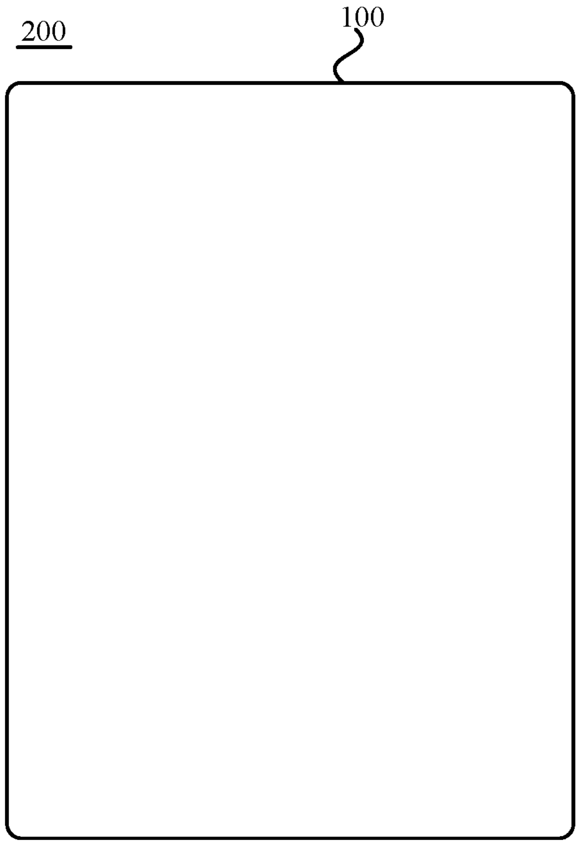
FIG. 29 is a diagram illustrating the structure of a display device according to an embodiment of the present application.

Exemplarily, FIG. 29 is a diagram illustrating the structure of a display device according to an embodiment of the present application. As shown in FIG. 29, the display device 200 includes the display panel 100 provided in the embodiments of the present application. The display device 200 provided in the embodiments of the present application may be any electronic product having a display function, including, but not limited to, the following categories: a phone, a television, a laptop, a desktop display, a tablet computer, a digital camera, a smart bracelet, smart glasses, a vehicle-mounted display, medical equipment, industrial control equipment, or a touch interactive terminal. No special limitations are made thereto in the embodiments of the present application.

It is to be understood that various forms of operation processes of the pixel circuit shown in the preceding may be adopted with steps reordered, added, or deleted. For example, the steps in the operation process of each pixel circuit described in the present application may be performed in parallel, sequentially, or in different sequences, as long as the desired results of the technical solutions of the present application can be achieved, and no limitation is imposed herein.

The preceding embodiments do not limit the scope of the present application. It is to be understood by those skilled in the art that various modifications, combinations, sub-combinations and substitutions may be performed according to design requirements and other factors. Any modification, equivalent substitution and improvement or the like made within the spirit and principle of the present application falls within the scope of the present application.

What is claimed is:

1. A display panel, comprising a driver circuit, a plurality of scan lines, and a plurality of pixels arranged in an array, wherein each pixel of the plurality of pixels comprises at least one switch transistor, and gates of switch transistors in at least part of a same row of pixels of the plurality of pixels are electrically connected to a same one scan line of the plurality of scan lines;

the driver circuit comprises a plurality of shift register units, and in the plurality of shift register units, an i-th shift register unit is cascaded with an (i+n)-th shift register unit, n is a positive integer greater than or equal to 2, and i is a positive integer; and the plurality of shift register units are electrically connected to the plurality of scan lines respectively and supply gate drive signals to the plurality of scan lines respectively, and valid pulses of the gate drive signals received by the plurality of scan lines are shifted successively, wherein a shift output terminal of the i-th shift register unit is electrically connected to a first input terminal of the (i+n)-th shift register unit; and wherein each of the valid pulses of the gate drive signals has a width denoted as T0; $T0>(Th+k*Th)$, $0<k\leq(n-1)$, and $Th=1/(F*L)$, wherein F denotes a refresh rate of the display panel, and L denotes a number of rows of the plurality of pixels; and in the plurality of shift register units, valid pulses of gate drive signals output by any two adjacent shift register units have a shift amount greater than or equal to Th.

2. The display panel according to claim 1, wherein a time period of a valid pulse of a gate drive signal output by the i-th shift register unit does not overlap a time period of a valid pulse of a gate drive signal output by the (i+n)-th shift register unit.

3. The display panel according to claim 1, wherein each shift register unit of the plurality of shift register units at least comprises a first input terminal, a clock signal terminal, a shift output terminal, at least one drive output terminal and at least one output control terminal corresponding to the at least one drive output terminal; and the each shift register unit is configured to control a shift signal output by the shift output terminal and a gate drive signal output by each drive output terminal of the at least one drive output terminal in response to a clock signal received by the clock signal terminal, a first input signal received by the first input terminal and an output control signal received by each output control terminal of the at least one output control terminal, wherein drive output terminals of the shift register units are electrically connected to the plurality of scan lines respectively.

4. The display panel according to claim 3, wherein in a same one shift register unit of the plurality of shift register units, a valid pulse of a clock signal and a valid pulse of an output control signal are shifted successively, and a time period of the valid pulse of the clock signal does not overlap a time period of the valid pulse of the output control signal.

5. The display panel according to claim 3, wherein each of a width of a valid pulse of the clock signal and a width of a valid pulse of the output control signal is equal to a width of a valid pulse of the gate drive signal.

6. The display panel according to claim 3, wherein a time period of a valid pulse of a clock signal received by the i-th shift register unit does not overlap a time period of a valid pulse of a clock signal received by the (i+n)-th shift register unit; and a time period of a valid pulse of an output control signal received by the i-th shift register unit does not overlap a time period of a valid pulse of an output control signal received by the (i+n)-th shift register unit.

7. The display panel according to claim 3, wherein the plurality of shift register units constitutes a plurality of shift register unit groups, and each shift register unit group of the plurality of shift register unit groups comprises n shift register units that are unconnected and adjacent;

time periods of valid pulses of clock signals received by n shift register units in a same one shift register unit group are shifted successively; and time periods of valid pulses of output control signals received by the n shift register units in the same one shift register unit group are shifted successively.

8. The display panel according to claim 7, wherein in a case where the each shift register unit comprises one drive output terminal, valid pulses of gate drive signals output by any two adjacent shift register units have an overlapping time period denoted as the k*Th.

9. The display panel according to claim 8, wherein time periods of valid pulses of gate drive signals output by the n shift register units in the same one shift register unit group overlap;

wherein the time periods of the valid pulses of the output control signals received by the n shift register units in the same one shift register unit group overlap.

10. The display panel according to claim 8, wherein a clock signal supplied to the i-th shift register unit also serves as a clock signal supplied to an (i+2*n)-th shift register unit; and an output control signal supplied to the i-th shift register unit also serves as an output control signal supplied to the (i+2*n)-th shift register unit.

11. The display panel according to claim 7, wherein in a case where the each shift register unit comprises m drive output terminals, valid pulses of gate drive signals output by m drive output terminals in a same one shift register unit of the plurality of shift register units are shifted successively, and m is a positive integer greater than or equal to 2;

in the same one shift register unit, a j-th drive output terminal outputs a j-th valid pulse of a gate drive signal, and j is a positive integer less than or equal to m; and the valid pulse of the gate drive signal output by the j-th drive output terminal and a valid pulse of a gate drive signal output by a (j+1)-th drive output terminal in the same one shift register unit have an overlapping time period denoted as the k*Th.

12. The display panel according to claim 11, wherein a valid pulse of a gate drive signal output by an m-th drive output terminal in the i-th shift register unit and a valid pulse of a gate drive signal output by a first drive output terminal in an (i+1)-th shift register unit have an overlapping time period denoted as the k*Th.

13. The display panel according to claim 11, wherein when m≤n, time periods of the valid pulses of the gate drive signals output by the m drive output terminals in the same one shift register unit overlap;

wherein time periods of valid pulses of output control signals received in the same one shift register unit overlap.

14. The display panel according to claim 11, wherein when m>n, time periods of valid pulses of gate drive signals output from a first drive output terminal to an n-th drive output terminal in the same one shift register unit overlap; and a time period of a valid pulse of a gate drive signal output by the first drive output terminal does not overlap a time period of a valid pulse of a gate drive signal output by an (n+1)-th drive output terminal in the same one shift register unit;

wherein in the same one shift register unit, an output control terminal corresponding to the j-th drive output terminal is a j-th output control terminal;

time periods of valid pulses of output control signals received from a first output control terminal to an n-th output control terminal in the same one shift register unit overlap; and a time period of a valid pulse of an output control signal received by the first output control terminal does not overlap a time period of a valid pulse of an output control signal received by an (n+1)-th output control terminal in the same one shift register unit.

15. The display panel according to claim 3, wherein the each shift register unit further comprises a latch module, at least one level conversion module corresponding to the at least one drive output terminal and at least one output module corresponding to the at least one level conversion module; and in a same one shift register unit of the plurality of shift register units:

the latch module is electrically connected to a clock signal terminal, a first input terminal and a shift output terminal; and the latch module is configured to latch a first input signal of the first input terminal and control a shift signal output by the shift output terminal in response to a clock signal of the clock signal terminal;

each level conversion module of the at least one level conversion module is electrically connected to a respective output control terminal of the at least one output control terminal, the shift output terminal and a respective output module of the at least one output module;

and the each level conversion module is configured to control a voltage of a gate drive signal supplied to the respective output module in response to an output control signal of the respective output control terminal and the shift signal; and each output module of the at least one output module is further electrically connected to a respective drive output terminal of the at least one drive output terminal; and the each output module is configured to control a polarity of a gate drive signal output by the respective drive output terminal.

16. The display panel according to claim 15, wherein the each shift register unit further comprises a first scan control terminal, a second scan control terminal, a second input terminal and an input module; and a first scan control signal of the first scan control terminal and a second scan control signal of the second scan control terminal have opposite polarities;

the input module is electrically connected between the first input terminal and the latch module and is further electrically connected to the first scan control terminal, the second scan control terminal and the second input terminal separately; and the input module is configured to control the first input signal of the first input terminal to supply to the latch module when the first scan control signal is at a valid level and control a second input signal of the second input terminal to supply to the latch module when the second scan control signal is at a valid level; and a second input terminal of the i-th shift register unit is electrically connected to a shift output terminal of the (i+n)-th shift register unit.

17. The display panel according to claim 3, wherein in a same one shift register unit of the plurality of shift register units, when the each shift register unit comprises m drive output terminals, a j-th drive output terminal outputs a j-th valid pulse of a gate drive signal, m is a positive integer, and j is a positive integer less than or equal to m; and in the same one shift register unit, an m-th drive output terminal also serves as a shift output terminal.

18. The display panel according to claim 17, wherein the each shift register unit further comprises a first reset terminal, a first voltage terminal, a second voltage terminal, a first control module, a second control module, a reset module and at least one output module corresponding to the at least one drive output terminal in a one-to-one correspondence;

the reset module is electrically connected to the first reset terminal, the first control module and the second control module and is electrically connected to the first control module and the second control module at a first node; and the reset module is configured to control a signal of the first node in response to a first reset signal of the first reset terminal;

the first control module is electrically connected to the first input terminal, the clock signal terminal and each output module of the at least one output module and is electrically connected to the each output module at a second node; and the first control module is configured to control a signal of the second node in response to the first input terminal of the first input terminal, the clock signal of the clock signal terminal and the signal of the first node;

the second control module is electrically connected to the first voltage terminal, the second voltage terminal, the first node, the second node and the each output module and is electrically connected to the each output module at a third node; and the second control module is configured to control a first voltage signal of the first voltage terminal to supply to the third node when the signal of the first node is at a valid level and control a second voltage signal of the second voltage terminal to supply to the third node when the signal of the second node is at a valid level; and each output module of the at least one output module is further electrically connected to a respective output control terminal of the at least one output control terminal, the first voltage terminal and a respective drive output terminal of the at least one drive output terminal; and the each output module is configured to control a gate drive signal output by the respective drive output terminal in response to an output control signal of the respective output control terminal, the first voltage signal of the first voltage terminal, the signal of the second node and a signal of the third node, wherein in the same one shift register unit, valid pulses of a clock signal, an output control signal and a first reset signal are shifted successively, and time periods of the valid pulses of the clock signal, the output control signal and the first reset signal do not overlap.

19. The display panel according to claim 18, wherein the each shift register unit further comprises a first scan control terminal, a second scan control terminal, a second input terminal, a second reset terminal and an input module; and a first scan control signal of the first scan control terminal and a second scan control signal of the second scan control terminal have opposite polarities;

the input module is electrically connected between the first input terminal and the first control module and is further electrically connected to the first scan control terminal, the second scan control terminal and the second input terminal; and the input module is configured to control the first scan control signal to supply to the first control module when the first input signal of the first input terminal is at a valid level and control the second scan control signal to supply to the first control module when a second input signal of the second input terminal is at a valid level;

the reset module is further electrically connected to the second reset terminal, the first scan control terminal and the second scan control terminal; and the reset module is configured to control the first reset signal of the first reset terminal to supply to the first node when the first scan control signal is at a valid level and control a second reset signal of the second reset terminal to supply to the first node when the second scan control signal is at a valid level; and a second input terminal of the i-th shift register unit is electrically connected to an m-th drive output terminal of the (i+n)-th shift register unit.

20. A display device, comprising a display panel, wherein the display panel comprises a driver circuit, a plurality of scan lines, and a plurality of pixels arranged in an array, wherein each pixel of the plurality of pixels comprises at least one switch transistor, and gates of switch transistors in at least part of a same row of pixels of the plurality of pixels are electrically connected to a same one scan line of the plurality of scan lines;

the driver circuit comprises a plurality of shift register units, and in the plurality of shift register units, an i-th shift register unit is cascaded with an (i+n)-th shift register unit, n is a positive integer greater than or equal to 2, and i is a positive integer; and the plurality of shift register units are electrically connected to the plurality of scan lines respectively and supply gate drive signals to the plurality of scan lines respectively, and valid pulses of the gate drive signals received by the plurality of scan lines are shifted successively, wherein a shift output terminal of the i-th shift register unit is electrically connected to a first input terminal of the (i+n)-th shift register unit; and wherein each of the valid pulses of the gate drive signals has a width denoted as $T0$; $T0>(Th+k*Th)$, $0<k\leq(n-1)$, and $Th=1/(F*L)$, wherein F denotes a refresh rate of the display panel, and L denotes a number of rows of the plurality of pixels; and in the plurality of shift register units, valid pulses of gate drive signals output by any two adjacent shift register units have a shift amount greater than or equal to Th.

* * * * *